US006977432B2

(12) United States Patent
Crane, Jr. et al.

(10) Patent No.: US 6,977,432 B2
(45) Date of Patent: Dec. 20, 2005

(54) PREFABRICATED SEMICONDUCTOR CHIP CARRIER

(75) Inventors: Stanford W. Crane, Jr., Boca Raton, FL (US); Maria M. Portuondo, Boca Raton, FL (US)

(73) Assignee: Quantum Leap Packaging, Inc., Wilmington, MA (US)

( * ) Notice: Subject to any disclaimer, the term of this patent is extended or adjusted under 35 U.S.C. 154(b) by 0 days.

(21) Appl. No.: 10/755,414

(22) Filed: Jan. 13, 2004

(65) Prior Publication Data

US 2004/0140542 A1 Jul. 22, 2004

Related U.S. Application Data

(63) Continuation of application No. 09/964,542, filed on Sep. 28, 2001, which is a continuation of application No. 08/208,586, filed on Mar. 11, 1994, now Pat. No. 6,339,191.

(51) Int. Cl.$^7$ ............................................ H01L 23/48
(52) U.S. Cl. .................................................. 257/696
(58) Field of Search ........................... 438/26; 257/696

(56) References Cited

U.S. PATENT DOCUMENTS

| | | | |
|---|---|---|---|
| 3,337,838 A | 8/1967 | Damiano et al. | |
| 3,366,915 A | 1/1968 | Miller | |
| 3,444,506 A | 5/1969 | Wedekind | |
| 3,545,606 A | 12/1970 | Bennett | |
| 3,676,748 A | 7/1972 | Kobayashi et al. | |
| 3,676,993 A | 7/1972 | Bergey | |
| 4,167,647 A | 9/1979 | Salera | |
| 4,331,831 A | 5/1982 | Ingram et al. | |
| 4,423,468 A | 12/1983 | Gatto et al. | |
| 4,433,886 A * | 2/1984 | Cassarly et al. | 439/65 |
| 4,437,718 A | 3/1984 | Selinko | |
| 4,487,463 A | 12/1984 | Tillotson | |
| 4,572,604 A | 2/1986 | Ammon et al. | |

(Continued)

FOREIGN PATENT DOCUMENTS

DE 3337796 4/1985

(Continued)

OTHER PUBLICATIONS

"Packaging", Intel Corporation, 1993, pp. 2-36, 2-96, 2-97, 2-100, 3-2, 3-24, and 3-25.

(Continued)

*Primary Examiner*—W. David Coleman
(74) *Attorney, Agent, or Firm*—Weingarten, Schurgin, Gagnebin & Lebovici LLP

(57) ABSTRACT

A semiconductor die carrier includes a plurality of electrically insulative side walls; a plurality of electrically conductive leads extending from at least one of the side walls, each of the leads being individually manufactured without use of a lead frame; a semiconductor die positioned such that the electrically conductive leads are disposed at one or more locations around the periphery of the die; and structure for providing electrical connection between the semiconductor die and corresponding ones of the electrically conductive leads. A method of manufacturing a semiconductor die carrier includes the steps of individually manufacturing a plurality of electrically conductive leads without use of a lead frame; extending a plurality of the electrically conductive leads from at least one of a plurality of electrically insulative side walls; positioning a semiconductor die such that the electrically conductive leads are disposed at one or more locations around the periphery of the die; and electrically connecting the semiconductor die to corresponding ones of the electrically conductive leads.

12 Claims, 65 Drawing Sheets

U.S. PATENT DOCUMENTS

| | | |
|---|---|---|
| 4,616,406 A | 10/1986 | Brown |
| 4,655,526 A | 4/1987 | Shaffer |
| 4,660,069 A | 4/1987 | Kochanski et al. |
| 4,675,472 A | 6/1987 | Krumme et al. |
| 4,698,663 A | 10/1987 | Sugimoto et al. |
| 4,705,917 A | 11/1987 | Gates, Jr. et al. |
| 4,734,042 A | 3/1988 | Martens et al. |
| 4,766,479 A | 8/1988 | Krum et al. |
| 4,897,055 A | 1/1990 | Jurista et al. |
| 4,931,908 A | 6/1990 | Boucard et al. |
| 4,943,846 A | 7/1990 | Shirling |
| 4,958,200 A | 9/1990 | Sekiguchi |
| 4,975,066 A | 12/1990 | Sucheski et al. |
| 4,989,318 A | 2/1991 | Utunomiya et al. |
| 4,991,291 A | 2/1991 | Koepke et al. |
| 4,997,376 A | 3/1991 | Buck et al. |
| 5,008,734 A | 4/1991 | Dutta et al. |
| 5,022,144 A | 6/1991 | Hingorany |
| 5,034,800 A | 7/1991 | Marchisi |
| 5,037,311 A | 8/1991 | Frankeny et al. |
| 5,049,974 A | 9/1991 | Nelson et al. |
| 5,071,363 A | 12/1991 | Reylek et al. |
| 5,081,563 A | 1/1992 | Feng et al. |
| 5,091,772 A | 2/1992 | Kohara et al. |
| 5,107,328 A | 4/1992 | Kinsman |
| 5,123,164 A | 6/1992 | Shaheen et al. |
| 5,137,456 A | 8/1992 | Desai et al. |
| 5,138,438 A | 8/1992 | Masayuki et al. |
| 5,182,853 A | 2/1993 | Kobayashi et al. |
| 5,220,491 A | 6/1993 | Sugano et al. |
| 5,235,208 A | 8/1993 | Katoh |
| 5,259,111 A | 11/1993 | Watanabe |
| 5,281,151 A | 1/1994 | Arima et al. |
| 5,283,717 A | 2/1994 | Hundt |
| 5,285,104 A | 2/1994 | Kondo et al. |
| 5,309,024 A | 5/1994 | Hirano |
| 5,326,936 A | 7/1994 | Taniuchi et al. |
| 5,331,514 A | 7/1994 | Kuroda |
| 5,334,279 A | 8/1994 | Gregoire |
| 5,342,999 A | 8/1994 | Frei et al. |
| 5,344,343 A | 9/1994 | Seidler |
| 5,347,429 A | 9/1994 | Kohno et al. |
| 5,351,393 A | 10/1994 | Gregoire |
| 5,371,404 A | 12/1994 | Juskey et al. |
| 5,376,825 A | 12/1994 | Tukamoto et al. |
| 5,390,412 A | 2/1995 | Gregoire |
| 5,403,784 A | 4/1995 | Hashemi et al. |
| 5,422,514 A | 6/1995 | Griswold et al. |
| 5,428,505 A | 6/1995 | Sakemi et al. |
| 5,438,224 A | 8/1995 | Papageorge et al. |
| 5,543,586 A | 8/1996 | Crane, Jr. et al. |
| 5,659,953 A | 8/1997 | Crane, Jr. et al. |
| 5,696,027 A | 12/1997 | Crane, Jr. et al. |

FOREIGN PATENT DOCUMENTS

| | | |
|---|---|---|
| DE | 3430849 | 3/1986 |
| DE | 3737819 | 5/1988 |
| DE | 4021872 | 1/1992 |
| DE | 4022829 | 1/1992 |
| EP | 0104051 | 3/1984 |
| EP | 0145694 | 6/1985 |
| EP | 0155044 | 9/1985 |
| EP | 0438165 | 7/1991 |
| EP | 0467698 | 1/1992 |
| EP | 0600750 | 6/1994 |
| FR | 2664097 | 1/1992 |
| GB | 1245710 | 9/1971 |
| GB | 2091036 | 7/1981 |
| GB | 2174538 | 11/1986 |
| GB | 2196178 | 4/1988 |
| JP | 58-66344 | 4/1983 |
| JP | 60-16453 | 1/1985 |
| JP | 60-28256 | 2/1985 |
| JP | 60-254641 | 12/1985 |
| JP | 62-21249 | 1/1987 |
| JP | 62-81739 | 4/1987 |
| JP | 62-248243 | 10/1987 |
| JP | 1-23560 | 1/1989 |
| JP | 64-74795 | 3/1989 |
| JP | 1-205456 | 8/1989 |
| JP | 2-156558 | 12/1990 |
| JP | 2-301182 | 12/1990 |
| JP | 3-151686 | 6/1991 |
| JP | 4-72750 | 3/1992 |
| JP | 4-147660 | 5/1992 |
| JP | 4-237154 | 8/1992 |
| JP | 5-226803 | 9/1993 |
| JP | 61-5549 | 1/1996 |

OTHER PUBLICATIONS

Robert Barnhouse, "Bifurcated Through-Hole Technology—An Innovative Solution to Circuit Density," Connection Technology, pp. 33-35 (Feb., 1992).

AMP Product Information Bulletin, "AMP-ASC Interconnection Systems," pp. 1-4 (1991).

AMP Product Guide, "Micro-Strip Interconnection System," pp. 3413-3414 (Jun., 1991).

Du Pont Connector Systems Product Catalog A, "Rib-Cage II Through-Mount Shrouded Headers" and "Micropax Board-to-Board Interconnect System," pp. 2-6, 3-0, 3-1 (Feb., 1992).

George D. Gregoire, "3-Dimensional Circuitry Solves Fine Pitch SMT Device Assemby Problem:" Connection Technology.

Dimensional Circuits Corporation, "Dimensional Circuits Corp. Awarded Two U.S. Patents," D.C.C. News, Apr. 5, 1994.

George D. Gregoire, "Very Fine Line Recessed Circuitry—A New PCB Fabrication Process".

"AMP-ASC Interconnection Systems," AMP Product Information Bulletin, pp. 1-4; (1991).

"Micro-Strip Interconnection System," AMP Product Guide, pp. 3413-3414 (Jun., 1991).

"Rib-Cage II Through-Mount Shrouded Headers" and "Micropax Board-to-Board Interconnect System," Du Pont Connector Systems Product Catalog A, pp. 2-6, 3-0, 3-1, (Feb., 1992).

R. R. Tummala et al., "Microelectronics Packaging Handbook," Van Nostrand Reinhold, 1989, pp. 38-43, 398-403, 779-791, 853-859, and 900-905.

"Packaging," Intel Corporation, 1993, p. 2-36, 2-96, 2-97, 2-100, 3-2, 3-24, and 3-25.

J.W. Balde et al., "New Chip Carrier Package Concepts," Computer, Productivity and Automation, IEEE Computer Society, vol. 10, pp. 58-68, (Dec., 1977).

Technical Disclosure Bulletin, vol. 32, No. 10A, (Mar., 1990).

* cited by examiner

| THROUGH HOLE PACKAGE | | SURFACE MOUNTED PACKAGE | |
|---|---|---|---|
| 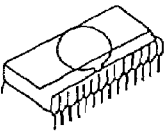 | DIP (DUAL IN-LINE PACKAGE) | 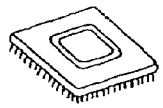 | SO OR SOP (SMALL OUT-LINE PACKAGE) |
|  | SH-DIP (SHRINK DIP) | 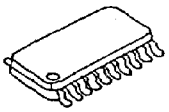 | QFP (QUAD FLAT PACKAGE) |
| 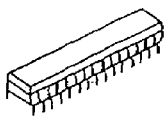 | SK-DIP DL-DIP (SKINNY DIP, SLIM DIP) | 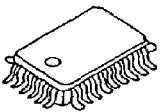 | LCC (LEADLESS CHIP CARRIER) |
| 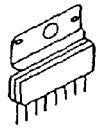 | SIP (SINGLE IN-LINE PACKAGE) |  | PLCC, SOJ (PLASTIC LEADED CHIP CARRIER WITH BUTT LEADS) |
|  | ZIP (ZIG-ZAG IN-LINE PACKAGE) | | |
| 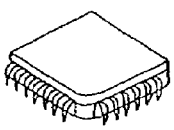 | PGA (PIN GRID ARRAY) | | |
FIG. 2

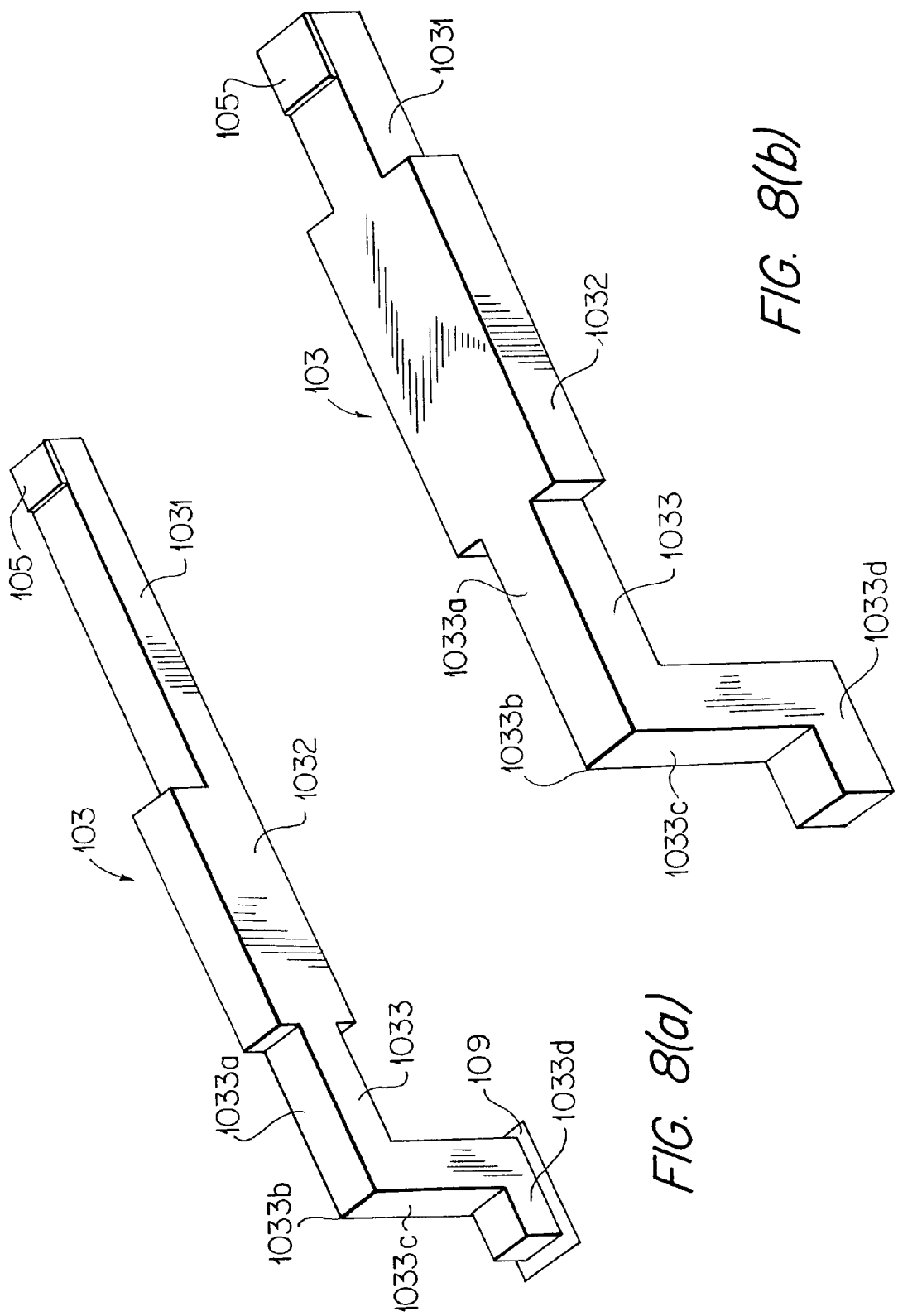

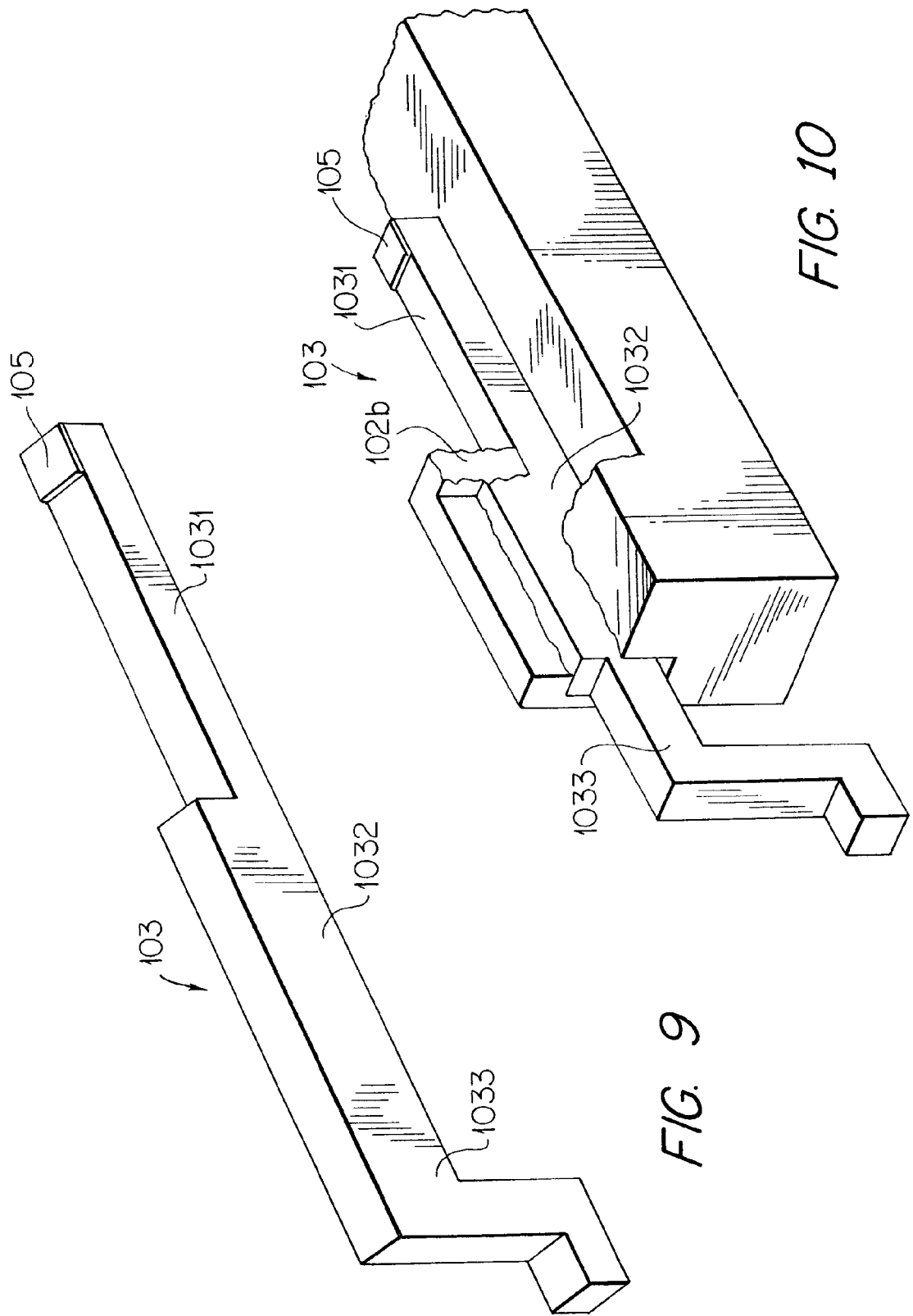

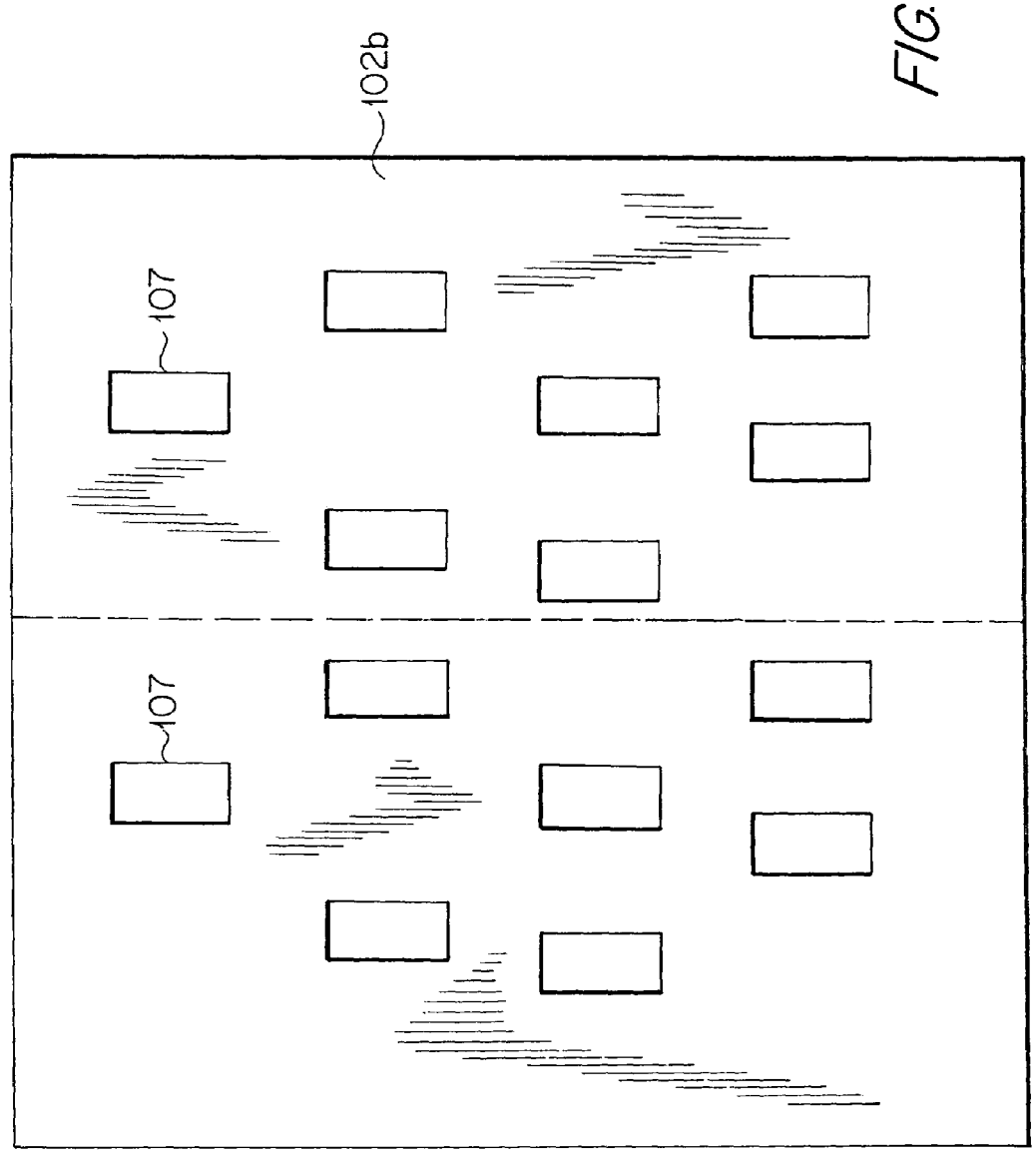

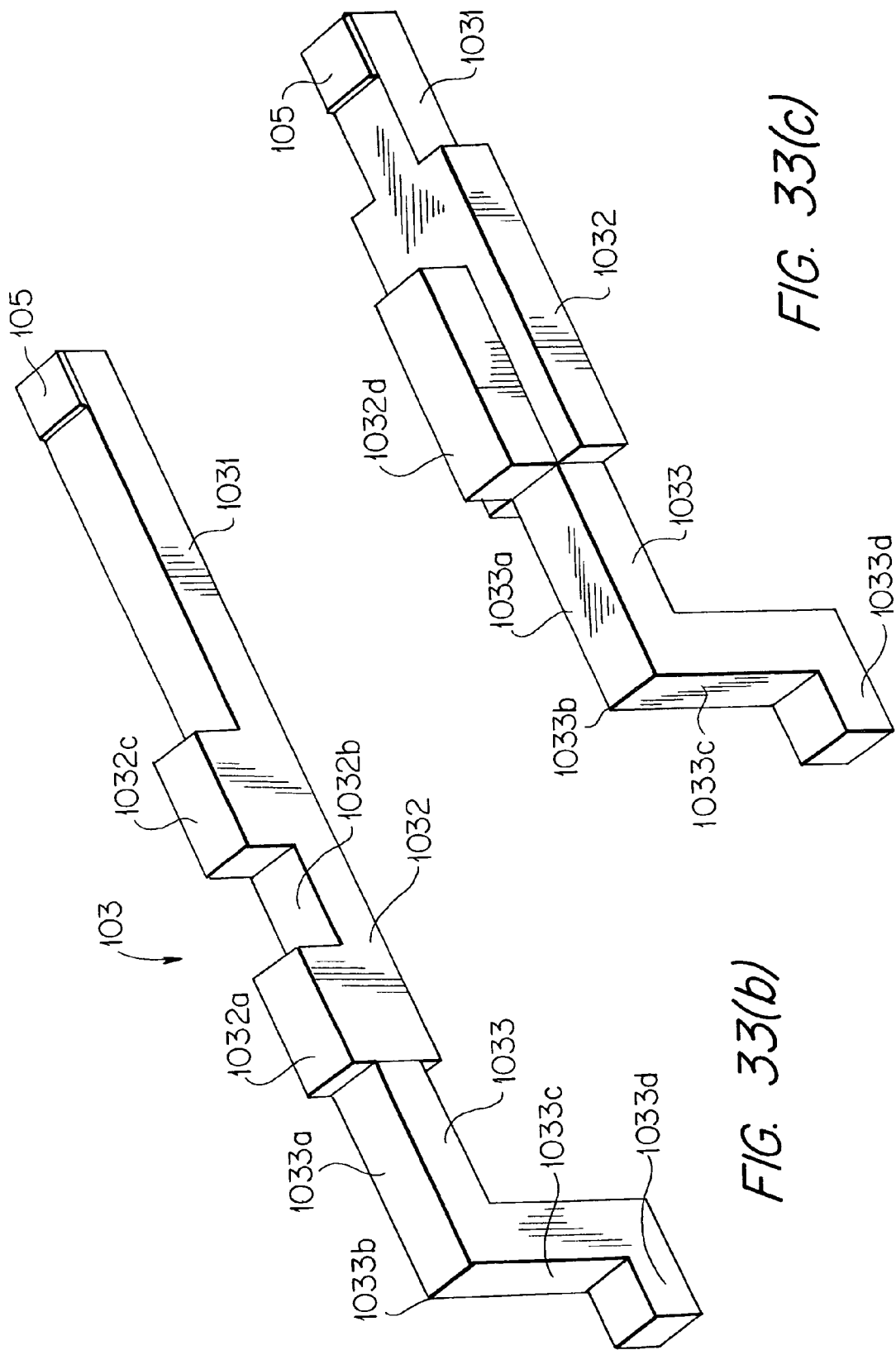

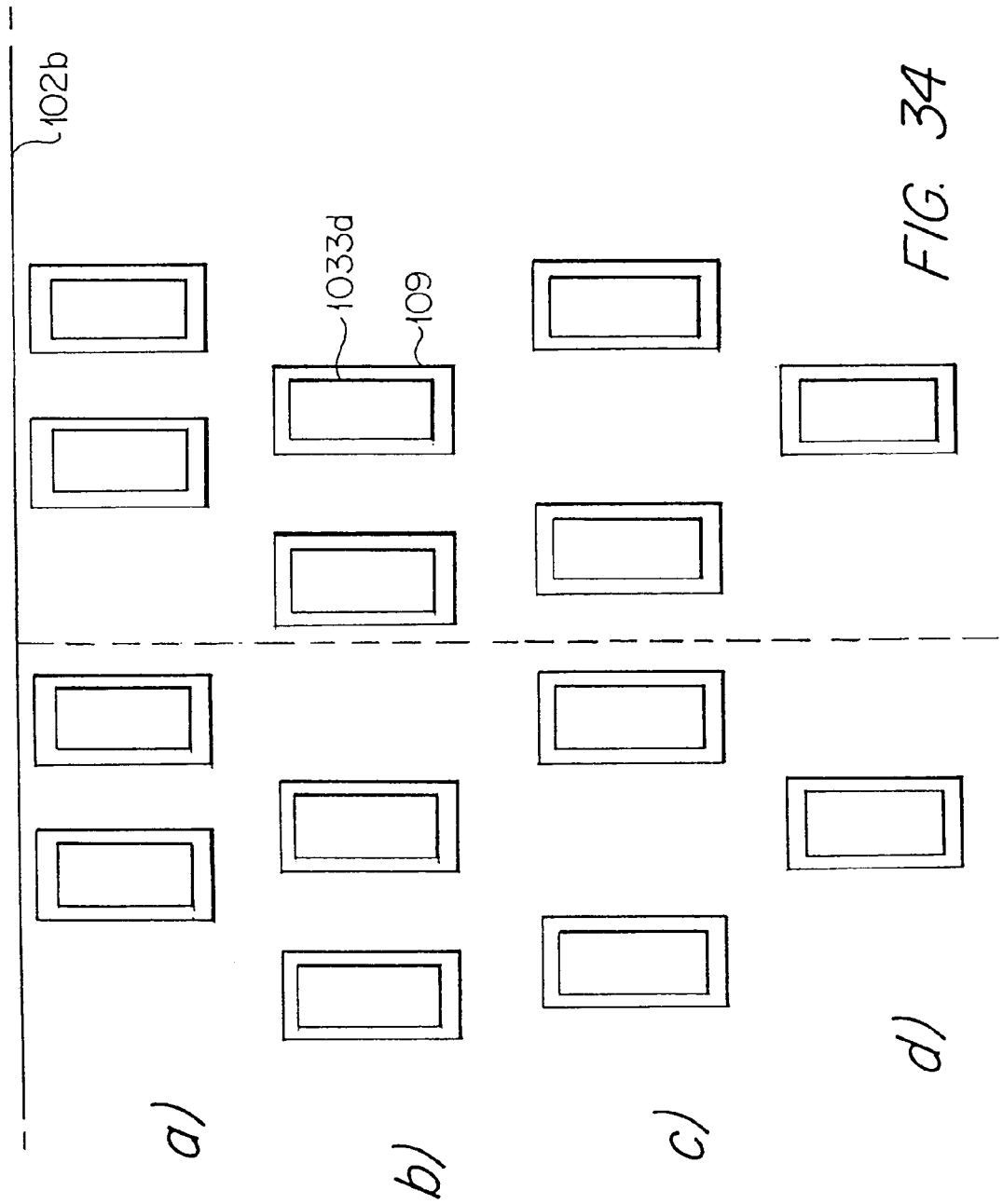

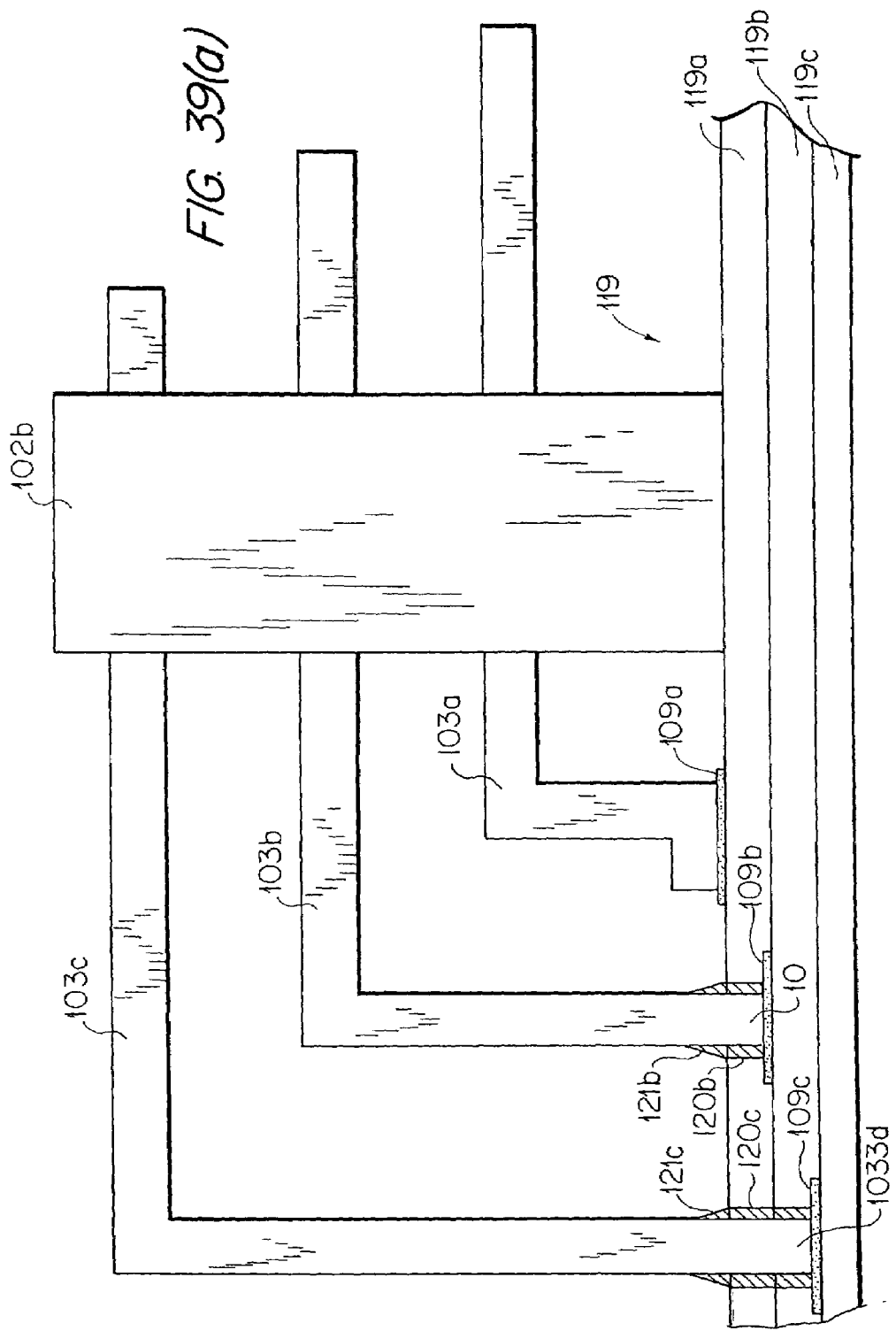

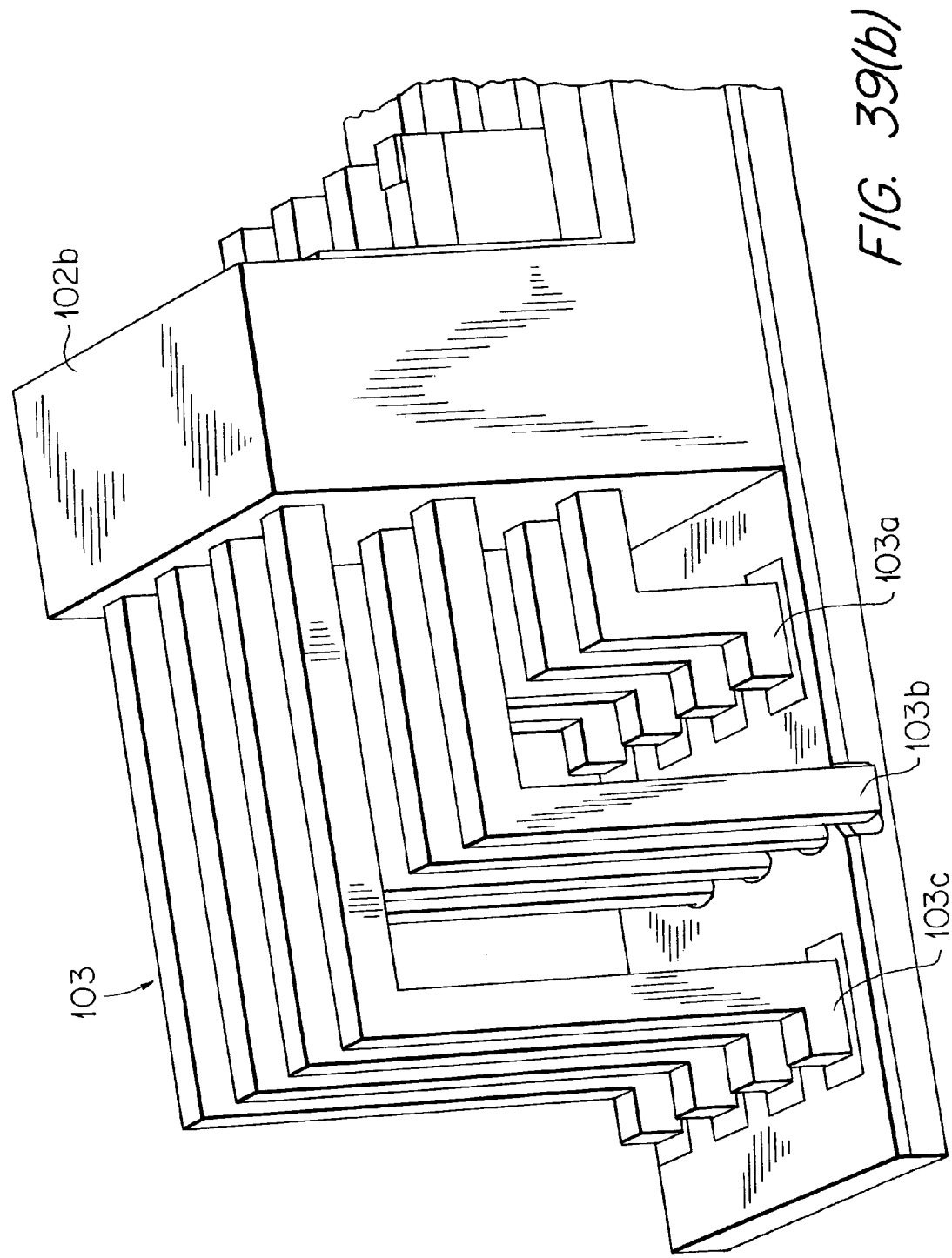

PREFABRICATED SEMICONDUCTOR CHIP CARRIER

This application is a continuation of application Ser. No. 09/964,542, filed Sept. 28, 2001, which is a continuation of application Ser. No. 08/208,586, filed Mar. 11, 1994, now U.S. Pat. No. 6,339,191, the disclosures of which are hereby incorporated by reference herein in their entirety.

BACKGROUND OF THE INVENTION

1. Field of the Invention

The present invention relates to a prefabricated, peripherally-leaded, semiconductor chip or die carrier having a reduced size, and methods for making and using the semiconductor die carrier. In a preferred embodiment, the semiconductor die carrier has horizontally and vertically spaced rows of multiple leads, with each lead being assembled into the semiconductor die carrier as an individually manufactured lead rather than a sub-element of a lead frame.

2. Description of the Related Art

There have been rapid advances in semiconductor technology, memory capacity, and software development in recent years. Advances in semiconductor packaging, interconnect technologies, and printed circuit board (PCB) assemblies have been more modest. The size of the semiconductor package and the number of leads it can accommodate are now major limiting factors determining computer speed and functionality. There is a trade-off between fabricating semiconductor packages with an increased number of leads and the resulting increase in component size. More leads mean a faster and more efficient transfer of information; however, more leads take up more space, thus increasing costs, and slowing down the electrical signal as it travels to interface with other devices.

With respect to semiconductor packages, many different shapes and sizes are currently available. Conventional semiconductor package technologies include the laminated ceramic technology, the pressed ceramic technology, and the molded plastic technology.

In accordance with the laminated ceramic technology, a semiconductor die is attached to a ceramic package having leads from a lead frame extending therefrom. Bonding pads on the die are connected to the leads using bonding wires. A cap is then glued to the ceramic package, thereby sealing the die and inner portions of the leads within the package.

In pressed ceramic technology, a semiconductor die is attached to a lower portion of a ceramic package having leads from a lead frame extending therefrom. After the wire bonding procedure, a top portion of the ceramic package is glued to the lower portion of the ceramic package to seal the die and inner portions of the leads within the package.

In molded plastic technology, a semiconductor die is configured for housing within a plastic package from which a set of leads will extend. In the initial stages of fabrication, the die is attached at a position surrounded by the leads from a lead frame. Wire bonding then takes place, and thereafter an injection molding process is carried out to form a plastic package within which the die and inner portions of the leads are sealed. The leads are then bent to form the finished package. The steps required to form a conventional molded plastic package may be understood more fully from the flowchart depicted in FIG. 1.

As can be understood from FIG. 2, conventional package leads are typically configured for mounting (on a PCB, for example) using plated-through-hole (PTH) technology or surface-mount technology (SMT).

In PTH technology, a conductive PTH is formed in a PCB. Each lead of a package is inserted through a corresponding PTH and then soldered to form a solder joint fastening the lead in conductive contact with the PTH.

In SMT mounting, each lead of a package, rather than being soldered to extend through a PTH in a PCB, is soldered onto a conductive portion of a top surface of the PCB. If the package is a leadless die carrier, a conductive section of the package is soldered onto a conductive portion of a top surface of the PCB known as a bonding pad. A solder joint then maintains each lead of the leaded die carrier, or each conductive section of the leadless die carrier, in a fastened relationship with respect to the PCB. In accordance with SMT mounting, each lead of a leaded die carrier can have a "Gullwing" configuration; "J-Lead" configuration; or a "Butt Lead" configuration.

Various conventional PTH and SMT packages are shown in FIG. 2. The PTH packages include a DIP (Dual In-line Package); an SH-DIP (Shrink DIP); an SK-DIP (Skinny DIP) or SL-DIP (Slim DIP); an SIP (Single In-line Package); a ZIP (Zig-zag In-line Package); and a PGA (Pin Grid Array). The SMT packages include an SO or SOP (Small Out-line Package); a QFP (Quad Flat Package); a LCC (Leadless Chip Carrier); and a PLCC SOJ (Plastic Leaded Chip Carrier with Butt Leads).

QFPs such as the ones shown in FIG. 2 are typically manufactured using the molded plastic technology described above. Most QFPs are manufactured using a single-layer lead frame providing a single row of bent leads extending from each of the four sides of the QFP.

Multi-row lead configurations are also known. For example, it is known to provide two rows of leads, formed by using two different lead frames vertically spaced and insulated from each other, extending from sides of a QFP. It is also known to provide rows of multiple leads formed using vertically spaced lead frames with adjacent rows of leads primarily separated from each other by a gaseous dielectric such as air. With respect to the wire bonding procedure associated with conventional semiconductor die packages, it is known in PGA packages to position bonding pads on different stepped levels.

The aforementioned semiconductor die packages suffer from many deficiencies. QFP technology, for example, is severely limited for a variety of reasons. For example, the molded plastic technology typically used to manufacture QFPs incorporates various processes following the wire bonding procedure which can have detrimental effects on the bonding integrity. These processes include s aling, which involves high-pressure injection-molding and cooling/heating steps, and the bending of the leads to achieve desired lead configurations, whereby bonding wire movement, breakage, and/or shorting can all result. Moreover, the encapsulation process is limited to the use of molding compounds with low thermal conductivity which can result in performances at less than an optimum level.

The use of lead frames during the manufacturing of QFP semiconductor packages and the like also results in numerous disadvantages. First of all, the types of dies from which conventional lead frames are stamped can be very expensive because of the number of intricate features involved and the amount of the material that must be handled. Moreover, the manufacturing tolerances required in stamping the larger sizes of necessary elements cause the stamping of lead frames to be a low-yield process. Also, packages which incorporate lead frames are typically tested after die placement at a point so late in the manufacturing process that if the package turns out to be defective, any value that may have been added is rendered useless. Additionally, lead frames typically limit the die placement process to procedures such as single-row peripheral pad bonding or tape automated bonding (TAB), thereby resulting in limitations in die placement options and flexibility. Furthermore, once a conventional QFP is completed, it is very difficult, if not impossible, to carry out repairs on one or more of the components of the package. In general, for conventional packaging technology, as the number of required leads increases, based on increases in the speed and functionality of the relevant die, so does the size of the lead frame, increasing its manufacturing and tooling costs and decreasing its efficiency due to the increased distances the signal must travel.

QFP-type packages also tend to take up large amounts of PCB area, due in part to the use of lead frames during their manufacture. For example, QFPs manufactured using a single-level lead frame and, therefore, including only a single row of leads extending from the sides of the QFP, typically require approximately 900 square millimeters of PCB area for a 208-pin QFP, and approximately 1,832 square millimeters of area for a 304-pin QFP.

Multi-row lead frame packages, to some extent, take up less PCB area in terms of the number of leads that can be provided. However, various limitations can render conventional multi-row leaded packages unsuitable for existing and contemplated packaging needs. Conventional structure, for example, is typically limited to two rows of leads per side, and all of the leads of both rows must be offset so that surface mounting can be performed in accordance with conventional mounting technology. Such characteristics can unnecessarily increase the amount of PCB area that will be required for mounting. Moreover, lead frames are typically used during the manufacture of the aforementioned conventional structure and, therefore, such structure is subject to a compounding of the inherent performance limitations and additional complexity, noted above.

PGA packages having a stepped configuration are also subject to limitations. For example, PGAs, unlike QFPS, are not generally suitable for SMT applications. Instead, PGAs are typically mounted using PTH technology or are plugged into a socket. Also, PGAs take up significant amounts of PCB space and space and volume of the PCB and, consequently, can be an impediment to the manufacture of high-density circuit configurations. Moreover, PGAs are typically expensive due to the cost of the ceramic package material and the brazed pin assembly that are used.

From the foregoing, it can be understood that conventional semiconductor packages take up large amounts of board space; are expensive and often experience difficulties during manufacture; perform insufficiently due to procedures carried out after chip attachment and wire bonding that tend to inhibit bond integrity; and, after manufacture, are difficult, if not impossible, to repair. As a result of such limitations, current semiconductor packaging technology is not sufficient to meet the needs of existing and/or future semiconductor and computer technology. Semiconductor packaging technology has already failed to keep pace with silicon die technology, and as computer and microprocessor speeds continue to climb, with space efficiency being increasingly important, semiconductor die packages having even smaller area requirements will be required. The semiconductor die packages discussed above fall short of current and contemplated semiconductor and computer requirements.

SUMMARY OF THE INVENTION

Accordingly, it is a goal of the present invention to provide a prefabricated semiconductor die carrier occupying reduced amounts of board area, providing an increased number of contacts, and capable of meeting the needs of existing and contemplated semiconductor and computer technology.

Another goal of the present invention is to provide a semiconductor die carrier manufactured without the use of lead frames and having leads extending from side portions thereof suitable for mounting using PTH technology, SMT methodology, or pluggable mounting.

Yet another goal of the present invention is to provide a semiconductor die carrier wherein a semiconductor die is bonded from multiple rows of pads on the die to vertically spaced rows of multiple leads while maintaining a very low profile package.

Still another goal of the present invention is to provide a semiconductor die carrier that is fabricated and tested prior to placement of a semiconductor die within the carrier, thereby increasing final packaging yields and reducing total unit cost.

A further goal of the present invention is to provide a semiconductor die carrier wherein the leads are configured to facilitate the routing of PCB traces for connection to the leads.

It is also a goal of the present invention to provide methods for making and using semiconductor die carriers having characteristics such as those discussed above.

These and other goals may be achieved by using a semiconductor die carrier comprising a plurality of electrically insulative side walls; a plurality of electrically conductive leads extending from at least one of the side walls, each of the leads being individually manufactured without use of a lead frame; a semiconductor die positioned such that the electrically conductive leads are disposed at one or more locations around the periphery of the die; and means for providing electrical connection between the semiconductor die and corresponding ones of the electrically conductive leads.

Also, a method of manufacturing a semiconductor die carrier may be used, the method comprising the steps of individually manufacturing a plurality of conductive leads without use of a lead frame; extending a plurality of the electrically conductive leads from at least one of a plurality of electrically insulative side walls; positioning a semiconductor die such that the electrically conductive leads are disposed at one or more locations around the periphery of the die; and electrically connecting the semiconductor die to corresponding ones of the electrically conductive leads.

It is to be understood that both the foregoing general description and the following detailed description are exemplary and explanatory, and are not restrictive of the invention as claimed. The accompanying drawings, which are incorporated in and constitute a part of the specification, illustrate embodiments of the present invention and, together with the general description, serve to explain the principles of the present invention.

BRIEF DESCRIPTION OF THE DRAWINGS

FIG. 2 is a view showing conventional PTH and SMT semiconductor packages.

FIG. 8(a) is a perspective view of an SMT lead with an L-shaped foot portion configured in accordance with the present invention and positioned on a bonding pad of a multi-layer conductor such as a PCB.

FIG. 8(b) is a perspective view of an SMT lead in accordance with the present invention having an L-shaped foot portion and a horizontal stability portion.

FIG. 9 is a perspective view of another SMT lead with an L-shaped foot portion configured in accordance with the present invention.

FIG. 10 is a partial perspective view of a conductive lead inserted into a side wall including insulative structure for preventing over-insertion of the lead.

FIG. 30 is a partial side view of the embodiment of the semiconductor die carrier illustrated in FIG. 29(a) prior to lead insertion with a dotted line segmenting repeating sets of passage arrangements.

FIG. 33(b) is a perspective view of a lead having a stabilizing section with a notched portion configured for use with a multiple-wall configuration in accordance with the present invention.

FIG. 33(c) is a perspective view of a lead having a stabilizing section with a raised portion configured for use with a multiple-wall configuration in accordance with the present invention.

FIG. 34 is a partial top view of the embodiment of the semiconductor die carrier illustrated in FIG. 29(a) showing footprint details with a dotted lin s gmenting repeating sets of contact arrangements.

FIG. 39(a) is a partial side view of a configuration in accordance with the present invention having non-coplanar leads to facilitate mounting on a multi-layer conductor such as a multi-layer PCB.

FIG. 39(b) is a partial perspective view of a semiconductor die carrier in accordance with the present invention having coplanar and non-coplanar leads to facilitate mounting on a multi-layer conductor such as a multi-layer PCB.

FIG. 65 is a perspective view of a rounded lead configured in accordance with the present invention.

DESCRIPTION OF THE PREFERRED EMBODIMENT

Figure 1:
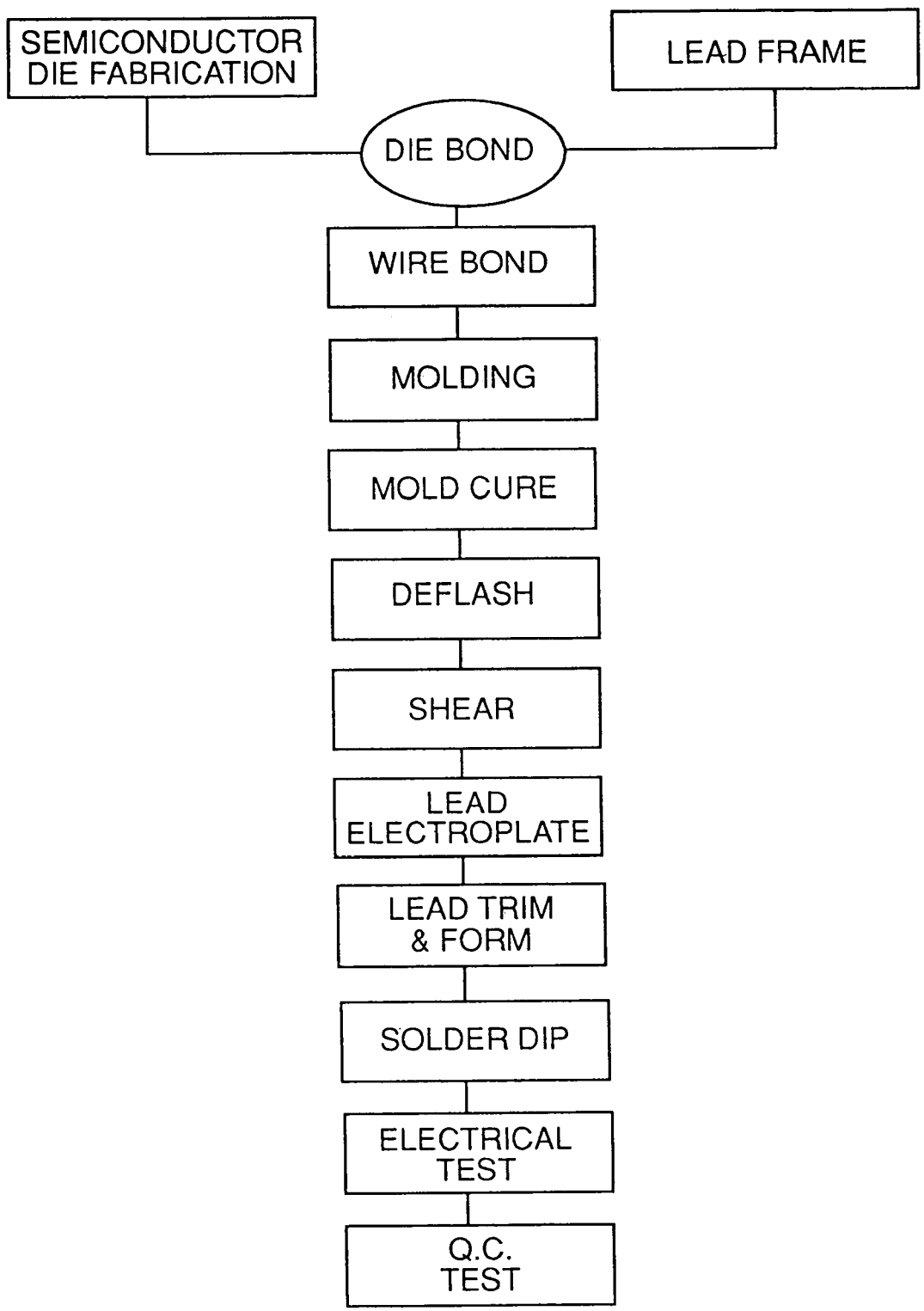
FIG. 1 is a flowchart illustrating steps in a conventional method for manufacturing a semiconductor package.

A prefabricated semiconductor die carrier in accordance with the present invention has multiple rows of electrically conductive leads arranged at vertically spaced multiple levels around the periphery of the carrier. Such leads may also be arranged on the top or bottom of the carrier. Each of the leads is manufactured and assembled into the semiconductor die carrier prior to the die attach step as an individually manufactured lead, rather than as a sub-element of a lead frame, to facilitate the multiple-row, multiple-level structure.

The leads of the semiconductor die carrier may be offset from other levels at the point where the leads extend through side walls of the carrier and/or staggered at the point where the leads connect to a PCB or other interface surface. At least the latter configuration allows traces on the PCB to be routed between the staggered leads.

The leads of the semiconductor die carrier extend into the die carrier through the side walls of the die carrier, forming a series of vertically spaced rows of multiple leads around the semiconductor die. The portions of the leads extending through the side walls have wire bond terminals formed thereon. A wire bond insulator may be used to separate the rows of leads. The semiconductor die can be mounted within the carrier with the peripheral pads of the die facing up and away from the PCB, in a cavity-up configuration, or with the peripheral pads of the die facing down toward the PCB, in a flip-chip or cavity-down configuration.

Encapsulation for the semiconductor die carrier of the present invention is performed by filling the die cavity with an epoxy, a liquid crystal polymer such as VECTRA (a trademark of Hoechst Celanese) or other high-temperature material. The semiconductor die carrier may be capped with a plastic component or thermally conductive cap that serves as a heat sink.

The semiconductor die carrier of the present invention provides a package having a reduced size as compared to known semiconductor packages, yet increases the number of interconnects available for the designer and user. The die carrier may be pluggable or compatible with either the PTH or SMT methodology. The semiconductor die carrier is prefabricated and tested prior to introduction of the semiconductor die to the carrier, thereby increasing finished product yields and reducing total unit cost. The configuration of the die carrier allows the semiconductor die to be bonded from multiple rows of pads on the die to multiple levels of vertically spaced rows of leads while maintaining a very low profile for the die carrier.

The semiconductor die carrier of the present invention provides better coplanarity of the feet of the leads when mounting using the SMT methodology, for example, thereby avoiding non-contact between the leads and the surface of the PCB. Such coplanarity is not always possible using conventional packaging technology due to the bending of the leads that is required when using a lead frame.

Details relating to the present invention will now be discussed with reference to the accompanying drawings. For the sake of convenience, the same reference numerals will be used to designate the same or similar components of the present invention in the accompanying drawings.

Figure 3:
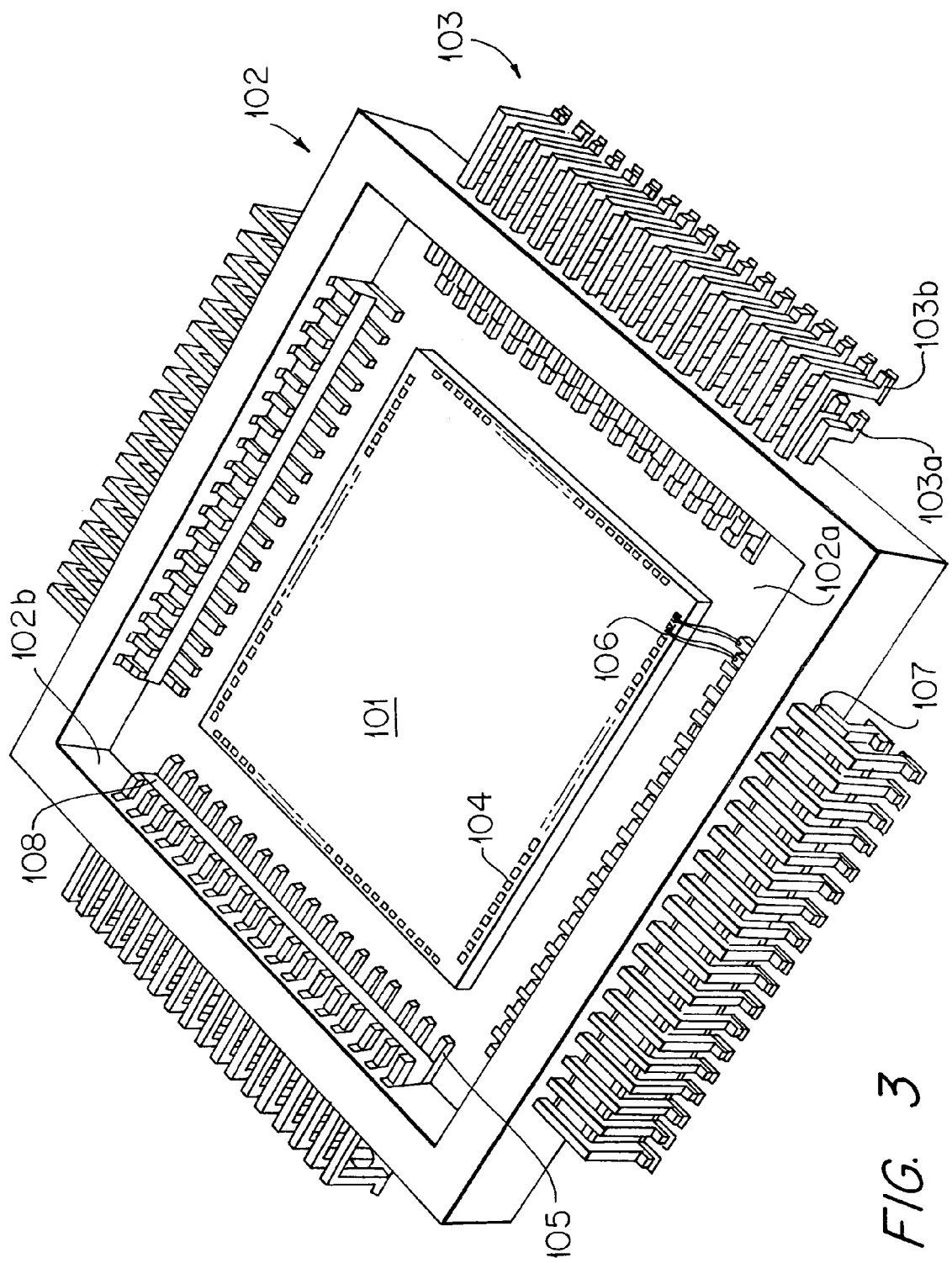
FIG. 3 is a perspective view of a two-tier embodiment of a prefabricated semiconductor die carrier in accordance with the present invention.
Figure 4:
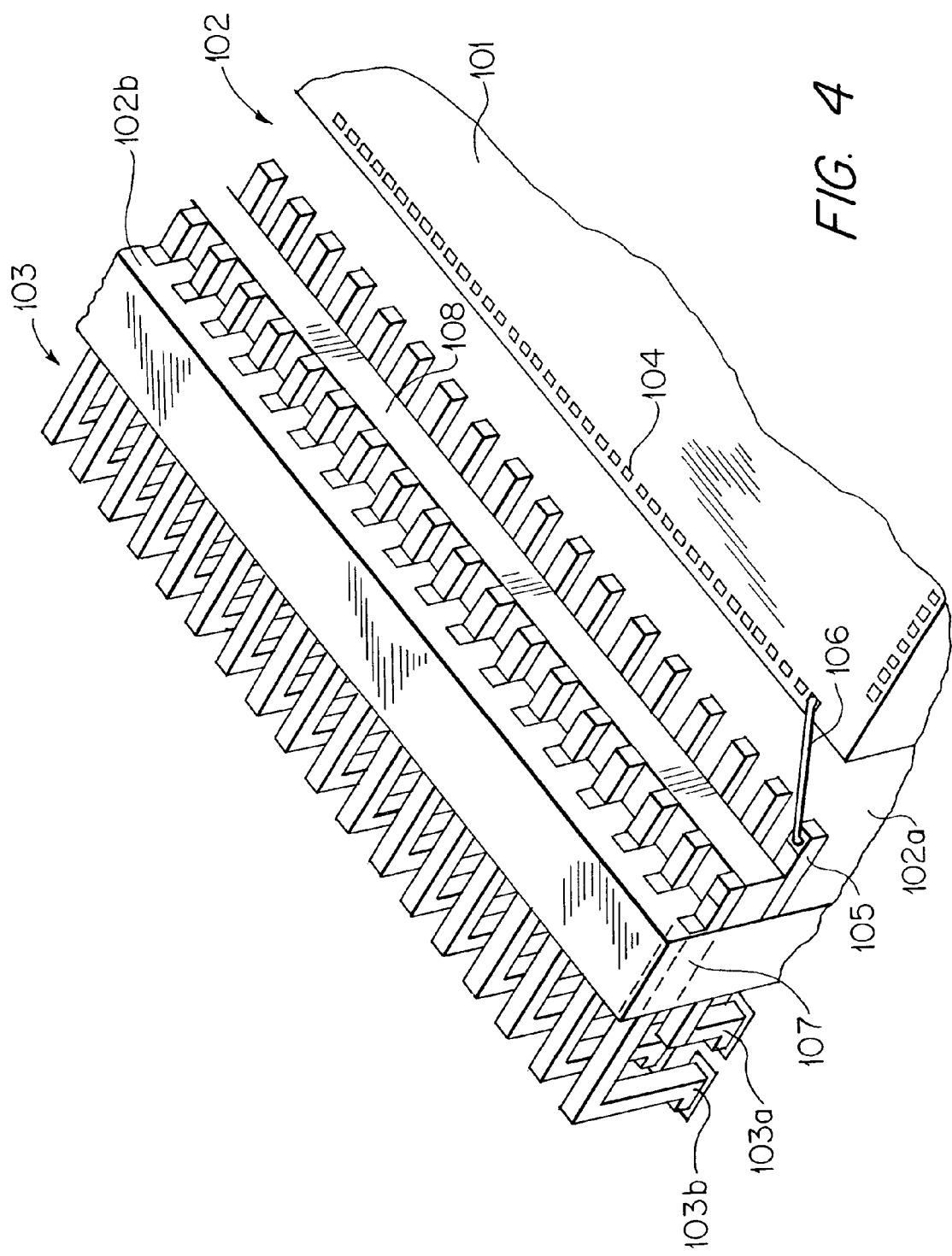
FIG. 4 is a partial perspective view of the embodiment of the semiconductor die carrier illustrated in FIG. 3.

A perspective view of an embodiment of a prefabricated semiconductor die carrier in accordance with the present invention is shown in FIG. 3. A partial view of the embodiment of FIG. 3 is shown in FIG. 4. In accordance with the embodiment of FIG. 3, the semiconductor die carrier includes a semiconductor die 101; an insulating substrate 102, having a floor 102a and a plurality of side walls 102b; a plurality of leads 103, including lower leads 103a and upper leads 103b; a plurality of bonding pads 104 formed on the semiconductor die; a plurality of bonding terminals 105 formed on the leads 103, respectively; and a plurality of bonding wires 106 each connecting at least one of the bonding pads 104 of the die to a corresponding one of the bonding terminals 105 formed on the leads.

Figure 5:
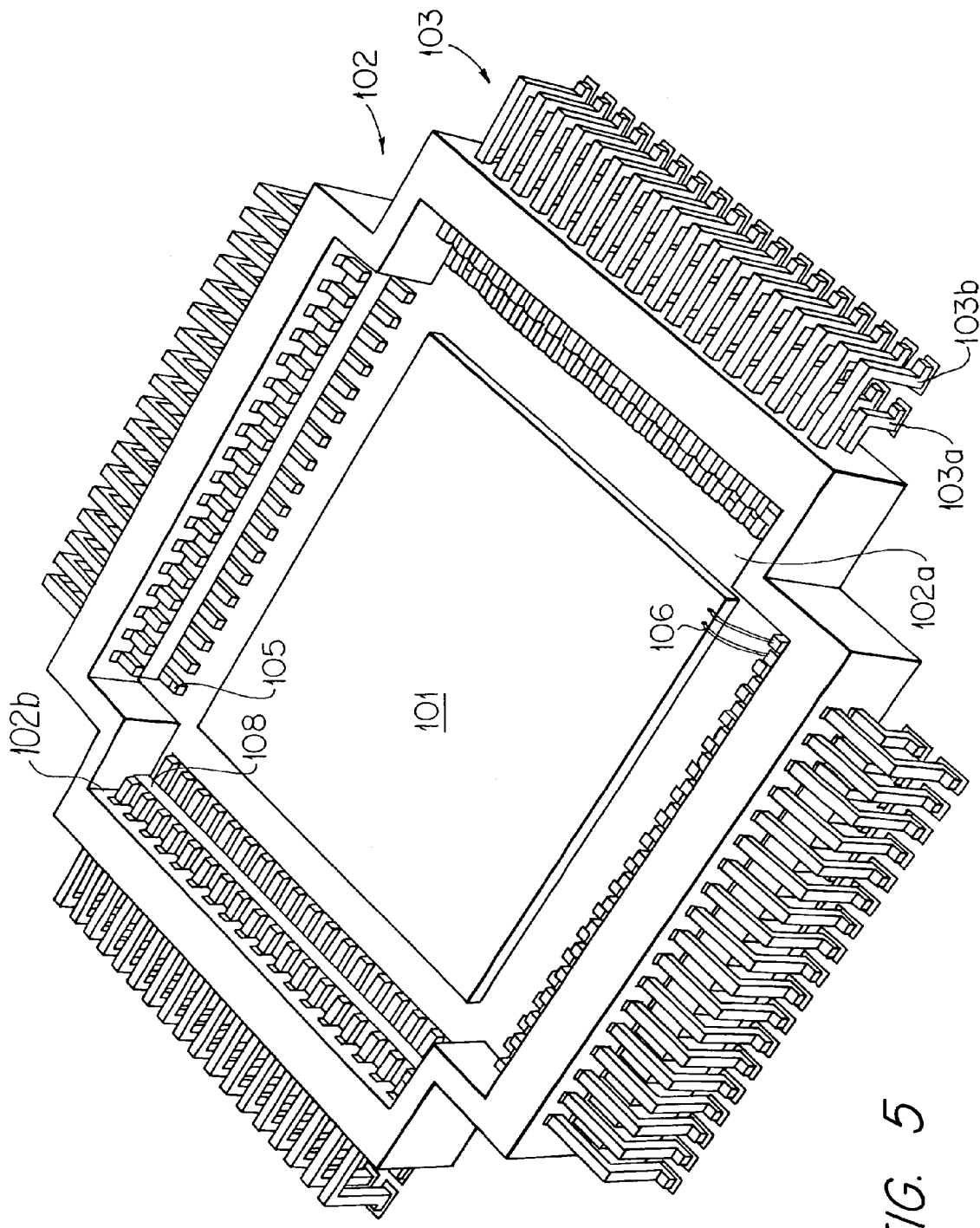
FIG. 5 is a perspective view of a twelve-sided semiconductor die carrier in accordance with the present invention.
Figure 6:
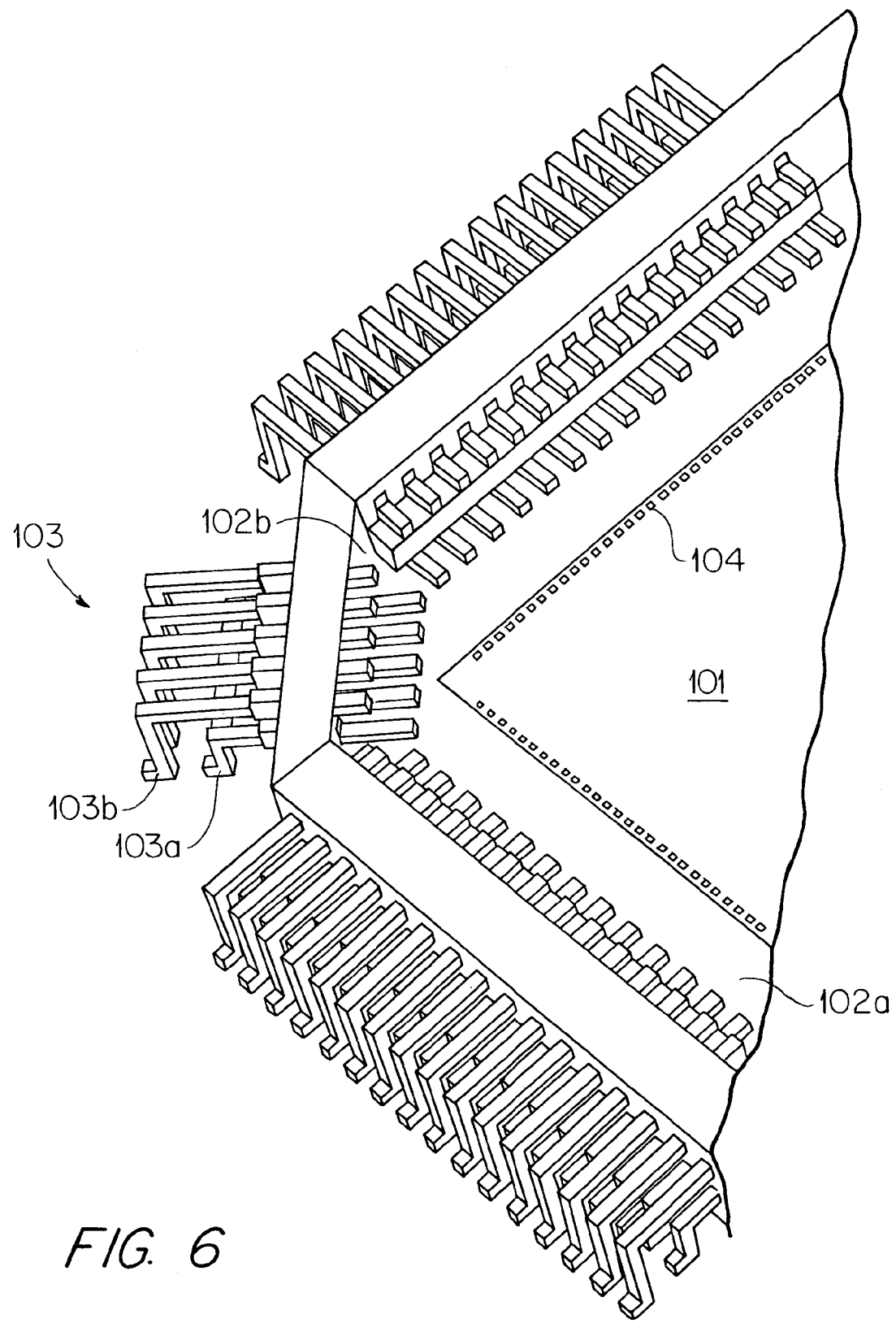
FIG. 6 is a partial perspective view of an eight-sided semiconductor die carrier in accordance with the present invention.

While the semiconductor die and semiconductor die carrier of the embodiment of FIG. 3 are depicted as being square, both the semiconductor die and the die carrier could assume another shape, such as a rectangle having sides of different lengths. Also, the number of sides the semiconductor die carrier can be varied, such that die carriers having twelve sides, for example, as depicted in FIG. 5, or eight sides, for example, as depicted in FIG. 6, are within the scope of the present invention. The die carriers of FIGS. 5 and 6 are designed to take up less space than four-sided die carriers and, as shown in FIG. 6, additional leads can be provided on the additional sides to achieve even greater efficiency. In accordance with the configuration of FIG. 6, for example, forty extra leads may be provided by positioning ten additional leads within each of the additional side walls. Moreover, while the semiconductor die carrier has been shown having two rows of leads 103, only a single row of leads could be used, or more than two rows of leads would be used, as discussed in greater detail below.

The semiconductor die 101 of the semiconductor die carrier can be a semiconductor die having a single row of bonding pads 104 arranged along each of its edges, as shown in FIG. 3, or a semiconductor die having, for example, two or more rows of bonding pads arranged along each of its edges. In the latter situation, the bonding pads 104 could be arranged in straight rows and columns, or the bonding pads 104 could be arranged in some other configuration, for example, arranged such that the bonding pads from adjacent rows are staggered.

The insulating substrate 102 of the semiconductor die carrier is made of a liquid crystal polymer or material having properties the same or similar to a liquid crystal polymer. Preferably, the liquid crystal polymer for the insulating substrate 102 is VECTRA (trademark), which has a coefficient of thermal expansion that is approximately the same as or similar to the coefficient of thermal expansion for silicon.

The insulating substrate 102 may be formed in a molding process carried out prior to inserting the leads 103 into the side walls 102b of substrate, and prior to mounting the die 101 onto the floor 102a of the substrate. During the molding process, a series of lead holes or passages 107 ar molded within the side walls 102b of the substrate, each of the passages for receiving a corresponding one of the leads 103, and a series of ledges 108 are formed inside the side walls of the substrate around the periphery where the die is to be placed. The ledges 108 serve to support the leads 103 (during the wire bonding procedure, for example). As an alternative to forming the lead passages 107 and ledges 108 during the molding process, the lead passages and/or ledges could be added after molding by, for example, removing material of the substrate to form the lead passages and/or by applying insulative material (using an adhesive or epoxy, for example) to form the ledges.

Figure 7A:
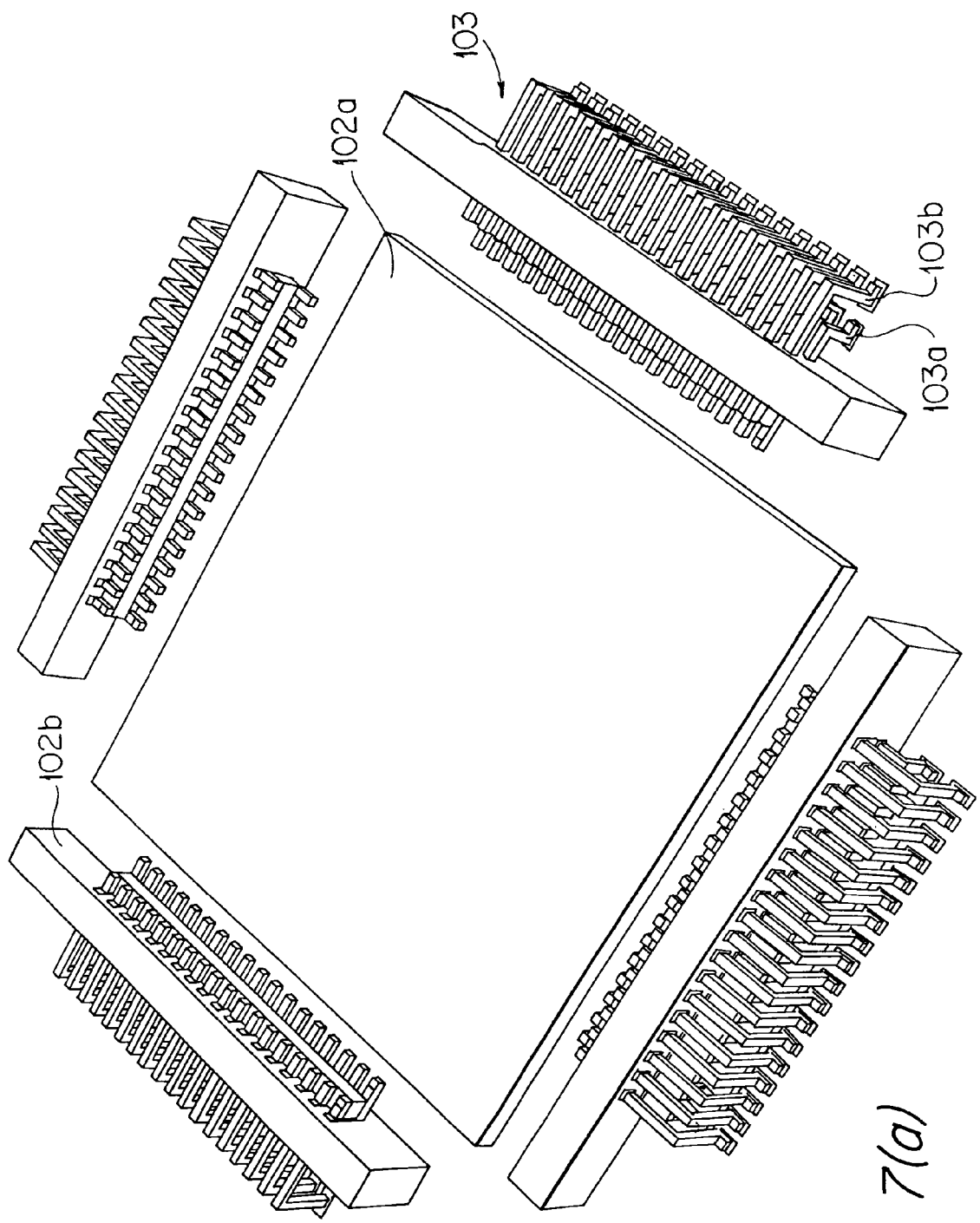
FIG. 7(a) is a perspective view of a two-row embodiment of a prefabricated semiconductor die carrier in accordance with the present invention prior to the fastening of the side walls to one another and the floor.
Figure 7B:
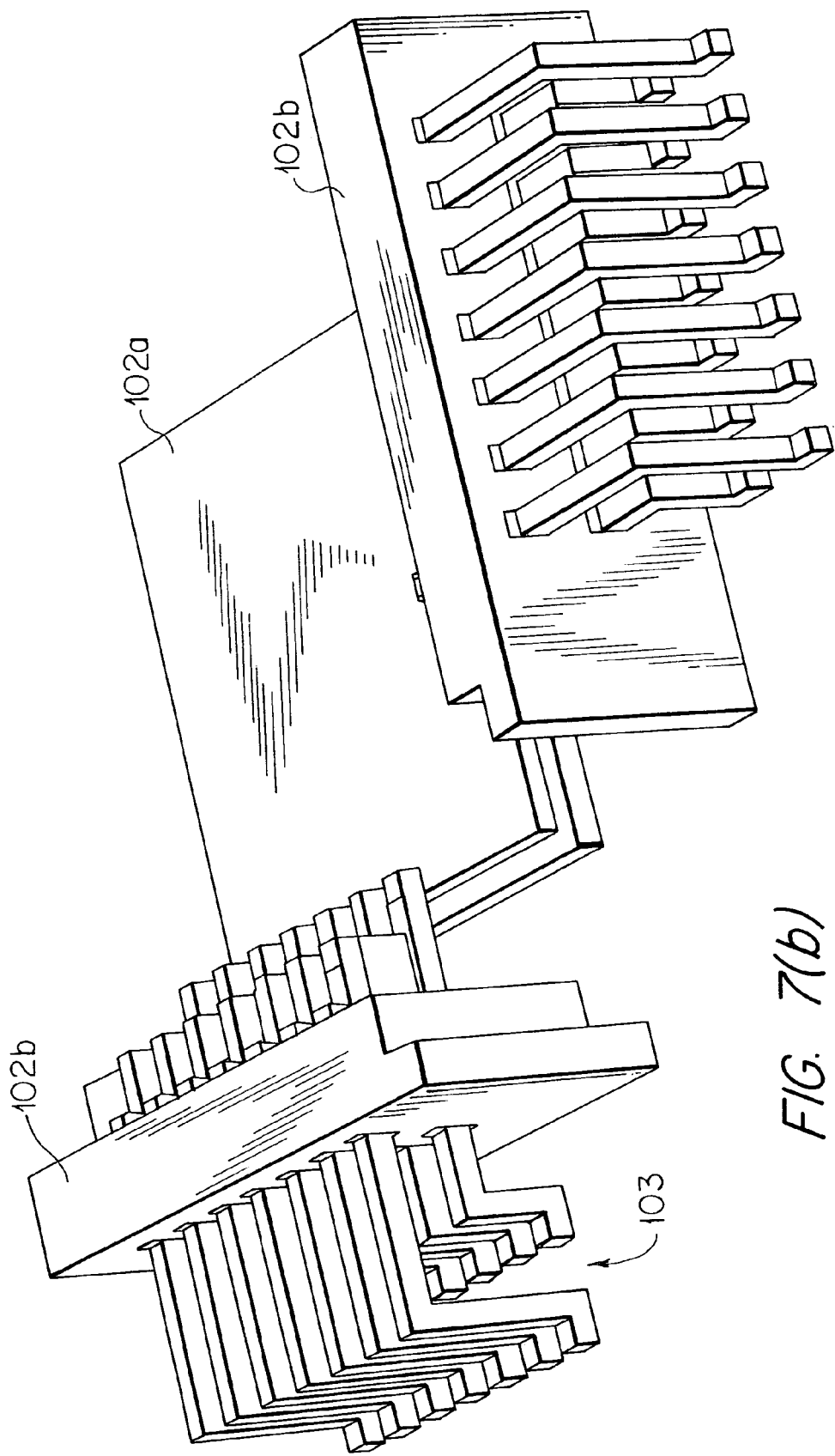
FIG. 7(b) is a perspective view of a two-row embodiment of a prefabricated semiconductor die carrier in accordance with the present invention prior to the fastening of the side walls to one another and the floor.

Moreover, rather than being formed integrally in a single molding process, the floor 102a and side walls 102b could be molded separately, and then fastened together using an adhesive or epoxy material. In this case, the leads 103 could be inserted into the side walls 102b either before or after the fastening of the side walls to one another or to the floor 102a. FIG. 7(a) is a view showing an example of the leads 103 inserted into the side walls 102b prior to the fastening of the side walls to one another and to the floor 102a. FIG. 7(b) illustrates that steps or notches may be molded on the bottom and/or corners of the side walls 102b and on the sides of the floor 102a to increase the glue area and surface area where the floor 102a and side walls 102b meet, thereby facilitating the formation of a stronger bond.

The leads 103 are inserted into the side walls 102b of the substrate 102 after formation of the lead passages 107 and ledges 108. The leads 103 may be inserted individually one-by-one, or "gang-inserted" in groups. For example, in accordance with gang-inserting, all of the leads 103 for each side of the semiconductor die carrier could be inserted simultaneously, or all of the lower leads 102a could be inserted simultaneously followed by a simultaneous insertion of the upper leads 103b above such lower leads.

The direction of lead insertion may be, for each side wall 102b, from the outer surface of the side wall toward the inner surface of the side wall. Each of the leads 103 is inserted into a corresponding one of the lead passages 107. The dimensions of the leads 103 and lead passages 107 are such that each lead 103 fits tightly within its corresponding lead passage 107. However, if desired, each lead 103 can be further fastened within its corresponding lead passage 107 and/or onto a corresponding ledge 108 using an epoxy or other adhesive material.

As an alternative to molding the side walls 102b and then inserting the leads 103 into the side walls, the leads may be formed within the side walls using an insert molding process. In accordance with insert molding, the leads 103 are supported by a bandolier or other fixture, and then the insulative substrate 102 or, alternatively, only the side walls 102b of the insulative substrate, are molded around the leads. After completion of the molding process, the resulting structure is extracted from the mold. If the resulting structure is a side wall with leads formed therein, that side wall is fastened together with other side walls and a floor to form the insulative substrate containing the leads. If the resulting molded structure is an insulative substrate already including a floor and a plurality of side walls, then no further fastening of the side walls to one another or to the floor is required.

In the embodiment of FIG. 3, the lower leads 103a and upper leads 103b are similarly shaped, although the vertically-extending sections of the lower leads are shorter than the vertically-extending sections of the upper leads. The horizontally-extending sections of the lower leads 103a could be longer, shorter, or the same length as the horizontally-extending sections of the upper leads 103b.

In the embodiment of FIG. 3, the lower leads 103a and upper leads 103b are aligned in a straight line with respect to one another rather than staggered. In other words, for each upper lead 103b, a corresponding lower lead 103a is positioned directly beneath that upper lead. While not shown in FIG. 3, the lower leads 103a and upper leads 103b could be staggered with respect to one another. In a staggered configuration, none of the lower leads 103a would be beneath any of the upper leads 103b. Instead, progressing along a given one of the side walls 102b, every other lead would be a lower lead 103a or an upper lead 103b.

A perspective view of an example of one of the leads 103 is shown in FIG. 8(a). As seen from FIG. 8(a), each of the leads 103 includes a bonding extension section 1031 having a bonding terminal 105 formed on an end portion thereof; a stabilizing section 1032; and an external lead section 1033. Each lead 103 may be formed of beryllium copper, phosphor bronze, brass, a copper alloy, tin, gold, palladium, or any other suitable metal or conductive material, and the bonding terminal 105 may be a gold-plated pad or pad formed of another suitable conductive material.

The bonding extension section 1031 is a relatively long and narrow portion of the lead 103 which protrudes toward the interior of the semiconductor die carrier from the inner surface of a corresponding one of the side walls 102b. The lower surface of the bonding extension section 1031 is supported by the floor 102a of the substrate if the lead is a lower lead 103a, or is supported by a corresponding one of the ledges 108 if the lead is an upper lead 103b. Alternatively, the substrate 102 can be formed without ledges, in which case the upper leads would be suspended in air above the floor 102a rather than being supported by a ledge. The bonding terminal 105 may be, for example, a bonding pad to which a bonding wire 106 for attachment to a corresponding bonding pad 104 on the die 101 can be connected.

The stabilizing section 1032 of each lead 103 is the portion of the lead that is anchored within a side wall 102b of the substrate 102. The stabilizing section has a larger cross-sectional area than that of the bonding extension section 1031 and may also have a larger cross-sectional area than that of the external lead section 1033. The thick stabilizing section retains the lead and prevents forces exerted on the external lead section from transferring to the bonds associated with bonding wire 106. As in FIG. 8(a), for example, the stabilizing section 1032 may be taller than the bonding extension section 1031 and the external lead section 1033. Likewise, the stabilizing section 1032 could be wider than the bonding extension section 1031 and the external lead section 1033, as in FIG. 8(b), or both wider and taller than the bonding extension section 1031 and the external lead section 1033. The configuration of FIG. 8(b), for example, allows the semiconductor die carrier to be manufactured lower in height since the wider part is arranged horizontally. In addition to the aforementioned configurations, the stabilizing section 1032 could be the same size in cross-section as the bonding extension section 1031 and the external lead section 1033. FIG. 9 shows that the stabilizing section 1031 could be the same size in cross-section as the external lead section 1033 while, at the same time, having a height that is different than that of the bonding extension section 1031.

As seen most clearly in FIG. 4, each 103 lead can be positioned so that the inwardly-facing surface of that part of the stabilizing section 1032 which is higher than the bonding extension section 1031 is level or flush with the inner surface of its corresponding side wall 102b. Alternatively, as can be understood from FIG. 10, the lead passage 107 for each lead 103 can be narrowed at the end of the passage located nearest the interior of the carrier (for example, only narrow enough to allow passage of the bonding extension section 1031 through the side wall 102b of the substrate) so as to prevent the lead from being inserted too far into the side wall of the substrate. In this situation, after full insertion of each lead 103, a section of insulative substrate material would exist for each lead between the inner surface of the corresponding side wall 102b and the inwardly-facing surface of that part of the stabilizing section 1032 higher than the bonding extension section 1031.

Figure 11:
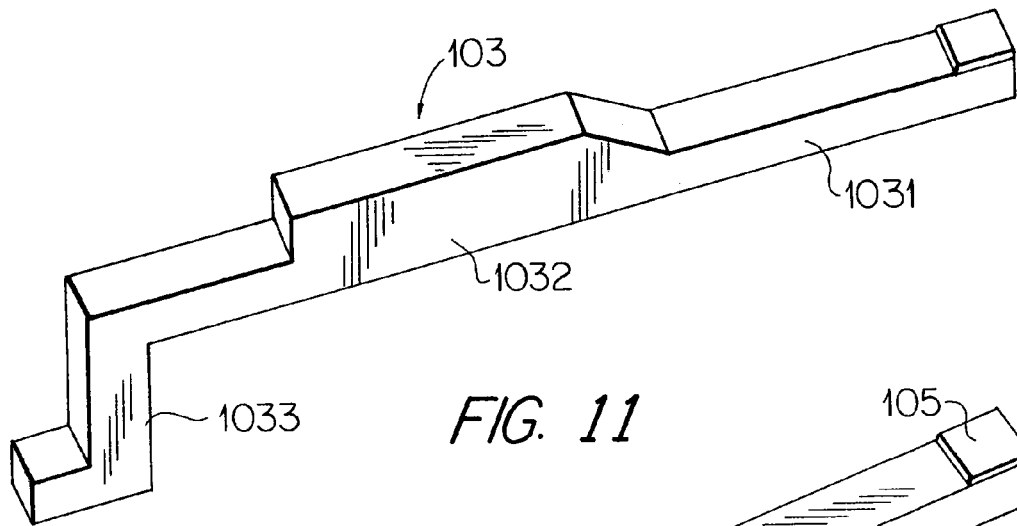
FIG. 11 is a perspective view of another SMT lead with an L-shaped foot portion configured in accordance with the present invention.

As seen from FIG. 11, the upper surface of each lead 103 may be sloped at the juncture between the bonding extension section 1031 and the stabilizing section 1032, to allow for ease of insertion into its corresponding lead passage 107. The sloped surface may also serve to prevent over-insertion of the lead 103 if the corresponding lead passage 107 is modified to be narrowed or tapered at the end of the passage located nearest the interior of the carrier. The narrowing or tapering at the end of the lead passage 107 could occur at a slope corresponding to that of the sloped surface of the lead 103 to allow for a tight fit of the lead within its corresponding passage.

For the lead 103 shown in FIG. 8(a), the lower surface of the stabilizing section 1032 and the lower surface of the bonding extension section 1031 are level, but the upper surfaces of these sections are not level. Also, in the lead 103 of FIG. 8(a), the upper and lower surfaces of the stabilizing and external lead sections are not level. However, each lead could be configured so that the bonding extension section 1031 extends from a middle section of the stabilizing section 1032 (like the external lead section 1033 shown in FIG. 8(a)) or from an upper section of the stabilizing section 1032

(such that the upper surfaces of the bonding extension section 1031 and stabilizing section 1032 would be level, for example). Also, each lead 103 could be configured so that the external lead section 1033 extends from a lower section of the stabilizing section 1032 (like the bonding extension section 1031 shown in FIG. 8(*a*), which has a lower surface that is level with respect to the lower surface of the stabilizing section 1032) or from an upper section of the stabilizing section 1032 (such that the upper surfaces of the external lead section 1033 and stabilizing section 1032 would be level, for example).

The external lead section 1033 includes a horizontally-extending section 1033*a*, a corner section 1033*b*, a vertically-extending section 1033*c*, and a foot section 1033*d*. The configuration and length of the horizontally-extending and vertically-extending sections for each individual lead 103 are selected based on design requirements and, in particular, based on whether that lead will be used as a lower lead 103*a* or an upper lead 103*b*. The horizontally-extending sections 1033*a* of the upper leads 103*b* may be longer than the horizontally-extending sections of the lower leads 103*a*, and the vertically-extending sections 1033*c* of the upper leads may be longer than the vertically-extending sections of the lower leads.

Figure 12:
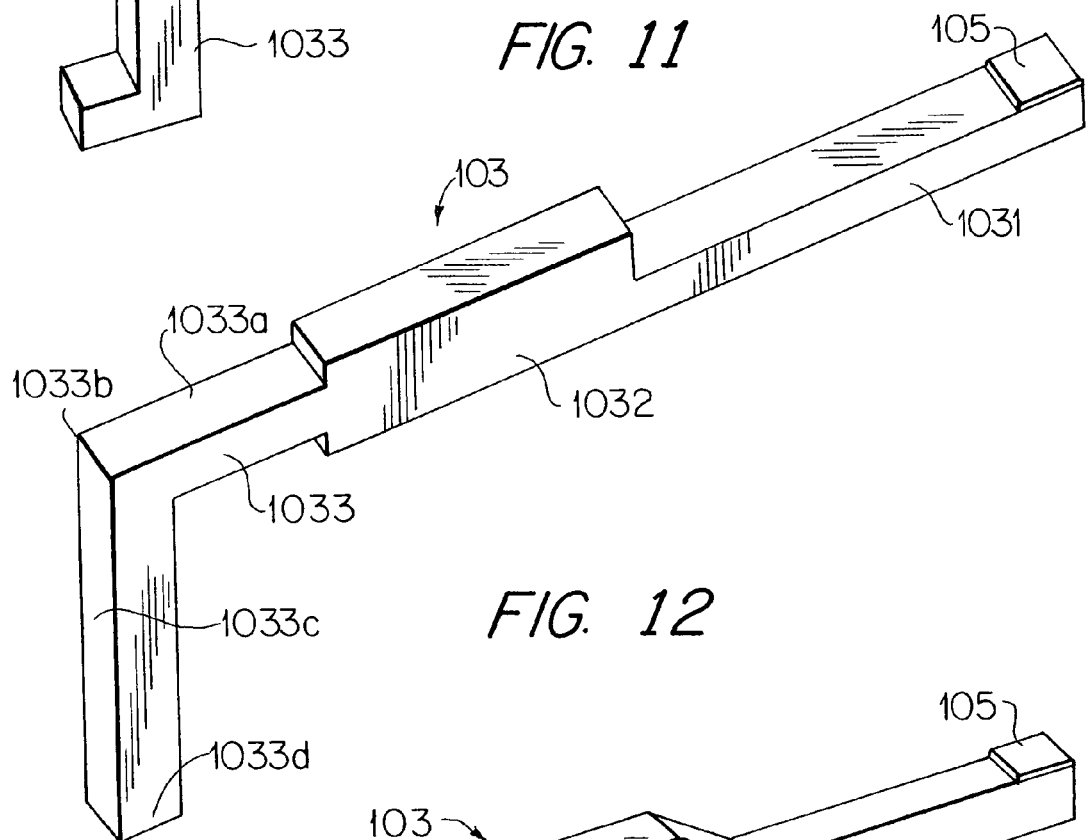
FIG. 12 is a perspective view of an SMT lead with a straight or Butt Lead foot portion configured in accordance with the present invention.

As seen from FIG. 8(*a*), for each lead 103, the horizontally-extending section 1033*a* of the external lead section 1033 extends out of the stabilizer section 1032 in a direction away from the outer surface of the corresponding side wall 102*b*. The external lead section 1033 bends downward at a corner section 1033*b* between the horizontally-extending section 1033*a* and the vertically-extending section 1033*c*. The vertically-extending section 1033*c* terminates in a foot section 1033*d*. The PCB contact surface for the foot section 1033*d* may have a larger cross-section than that of the vertically-extending section 1033*c*, as shown in FIG. 8(*a*), or, alternatively, may have a Butt Lead configuration, as shown in FIG. 12, such that the cross-section of the contact surface for the foot section is the same as that of the vertically-extending section.

Figure 13:
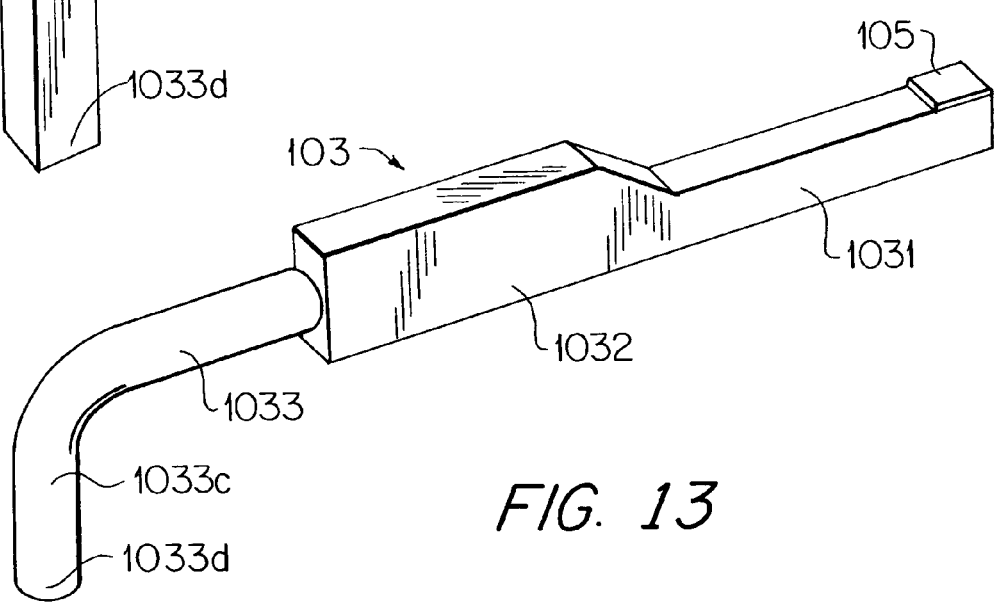
FIG. 13 is a perspective view of a PTH lead configured in accordance with the present invention.

The foot sections 1033*d* shown in FIGS. 8(*a*) and 12 are configured for mounting to a PCB or other interface surface in accordance with SMT methodology. Alternatively, foot section 1033*d* could be configured for mounting in a PCB or the like in accordance with PTH technology, as shown in FIG. 13, for example.

Figure 14:
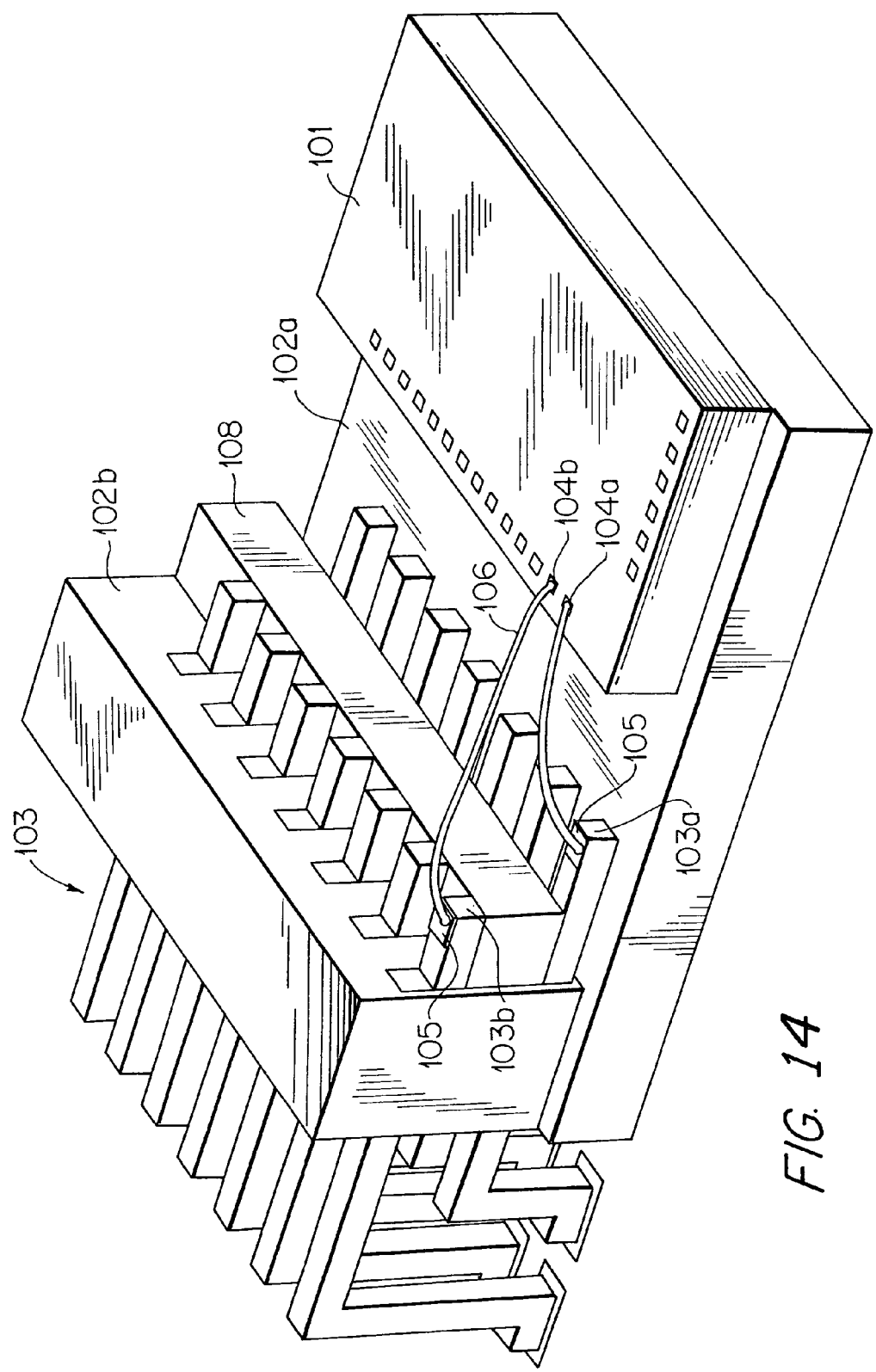
FIG. 14 is a partial perspective view of the embodiment of the semiconductor die carrier illustrated in FIG. 3.

With reference to FIG. 14, after all of the leads 103 are formed in the side walls 102*b* of the carrier and electrically and mechanically tested (for retention, continuity, coplanarity, and the like), the semiconductor die 101 is adhered to the floor 102*a* of the substrate 102 using an adhesive, epoxy, or the like. Thereafter, the bonding pads 104 on the die 101 are bonded or connected to bonding terminals 105 on the bonding extension sections 1031 of the leads 103, respectively, to provide a conductive path from the semiconductor die 101 to the external lead sections 1033 of such leads. FIG. 14, which is another partial view of the semiconductor die carrier shown in FIG. 3, depicts an example of the connection of a first die bonding pad 104*a* to the bonding terminal 105 on a lower lead 103*a*, and the connection of a second die bonding pad 104*b* to the bonding terminal 105 on an upper lead 103*b*. Each of these connections occurs via a bonding wire 106. Such bonding wire connections may be performed for all of the bonding pads 104 formed on the die 101.

After the wire bonding procedure, encapsulation may be carried out by filling the cavity defined by the floor 102*a* and the side walls 102*b* of the substrate 102 with epoxy, a liquid crystal polymer such as VECTRA (trademark), or other high-temperature material. The semiconductor die carrier might then be capped with a plastic component or thermally-conductive cap that may serve as a heat sink, and thereafter sealed. When this type of cap is used, the encapsulation step is optional. The heat sink and high-temperature material which may be used for encapsulation facilitate the heat dissipation capabilities of the semiconductor die carrier.

Dimensions of the semiconductor die carrier having two vertically spaced rows of multiple leads can be understood, for example, with reference to the accompanying figures.

As can be seen from FIG. 3, for example, a two-row semiconductor die carrier in accordance with the present invention may have, for example, a height of 2.0 mm, a width of 17.9 mm, and a lead row length of 8.7 mm. In this configuration, the semiconductor die carrier of the present invention can be manufactured to be approximately 64% smaller than conventional 128-pin QFPs, and at the same time provides 16 extra leads.

From FIG. 8(*a*), it can be understood that a lead 103 in accordance with the present invention may have a bonding extension section 1031 that is 1.5 mm in length; a stabilizing section 1032 that is 1.0 mm in length, and an external lead section 1033 having a vertically-extending section 1033*c* that varies in length depending whether the lead is an upper lead or a lower lead. In general, the lengths of the horizontally-extending sections and vertically-extending sections 1033*a* and 1033*c* of each lead, respectively, depend upon whether or not that lead is to be used as a lower lead 103*a* or an upper lead 103*b*. However, if desired, the lengths of the horizontally-extending sections 1033*a* of the upper and lower leads, respectively, could be the same, with only the lengths of the vertically-extending sections 1033*c* being different. As shown in FIG. 8(*a*), the foot section 1033*d* of a lead 103 configured for mounting in accordance with SMT can have a cross-section of 0.2×0.4 mm, for example, for mounting on a PCB bonding pad 109 having an exemplary cross-section of 0.4×0.6 mm. FIG. 14 illustrates that each ledge may have a height of 0.7 mm, for example.

Figure 15:
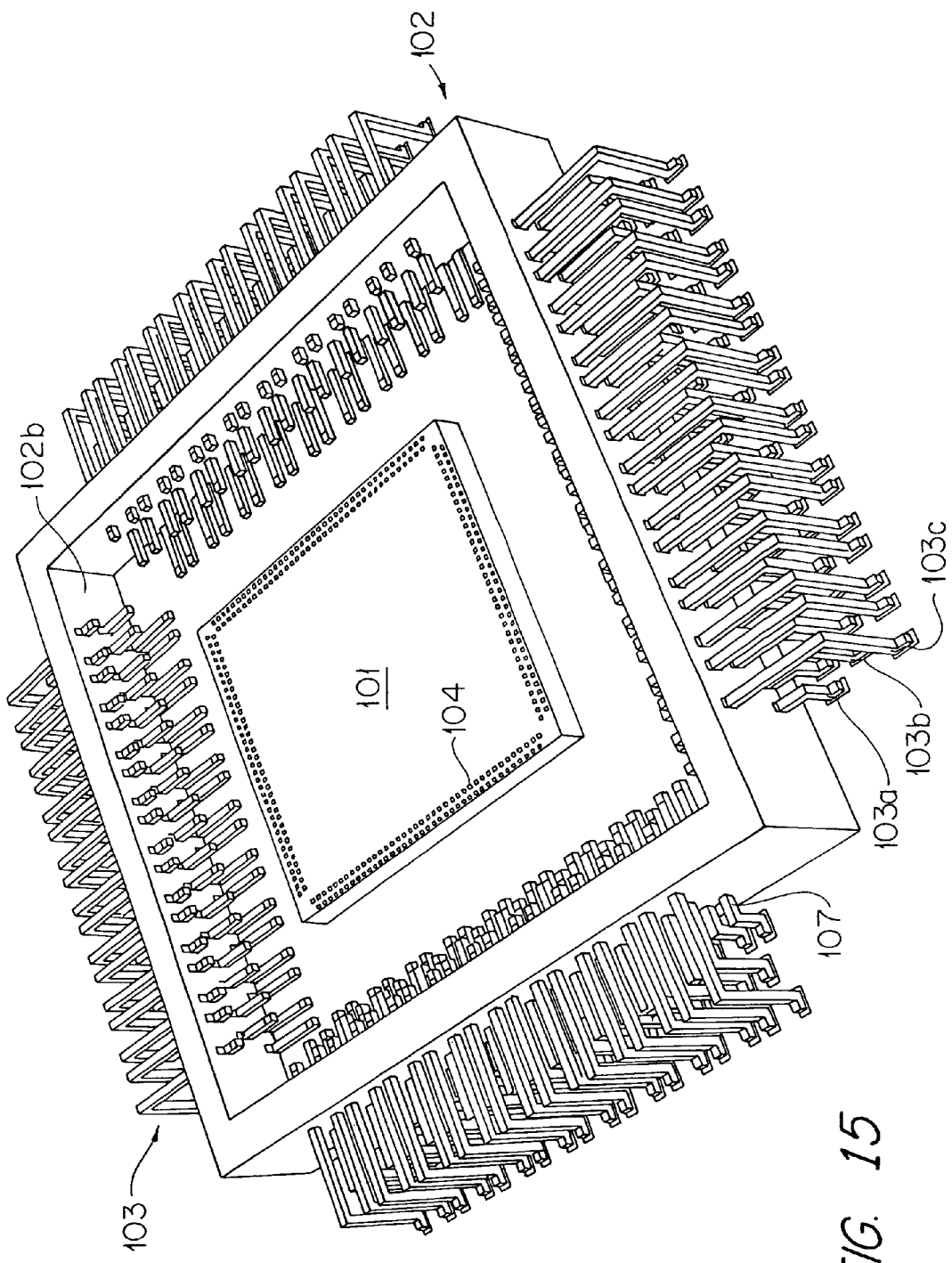
FIG. 15 is a perspective view of a three-tier embodiment of a prefabricated semiconductor die carrier in accordance with the present invention.

A perspective view of another embodiment of a prefabricated semiconductor die carrier in accordance with the present invention is shown in FIG. 15. The embodiment of FIG. 15 essentially corresponds to the embodiment shown in FIG. 3, except that three vertically spaced rows of multiple leads 103*a*, 103*b*, and 103*c* are used instead of two of such rows. Such a configuration enhances the interconnect capabilities of the semiconductor die carrier. While not shown in FIG. 15, ledges 108 might be applicable to the three-row semiconductor die carrier in accordance with the present invention.

The semiconductor die carrier of FIG. 15 may be manufactured in the same manner that the carrier shown in FIG. 3 is manufactured. More particularly, for the embodiment of FIG. 15, the leads 103 are formed within the side walls 102*b* via insertion or an insert molding procedure; the semiconductor die 101 is adhered to the floor 102*a*; the bonding pads 104 of the die are connected to the bonding terminals 105 of the leads 103, respectively; and the cavity of the carrier could be filled with high-temperature material such as VECTRA (trademark) and/or a cap could be sealed on top of th carrier. Exemplary dimensions for the embodiment of FIG. 15 are a height of 2.7 mm; a width of 21.5 mm; and a lead row length of 11.8 mm. In this configuration, the semiconductor die carrier of FIG. 15 can be configured to provide 208 leads using approximately half of the area (for example, board area) of that required by conventional QFP technology.

Figure 16:
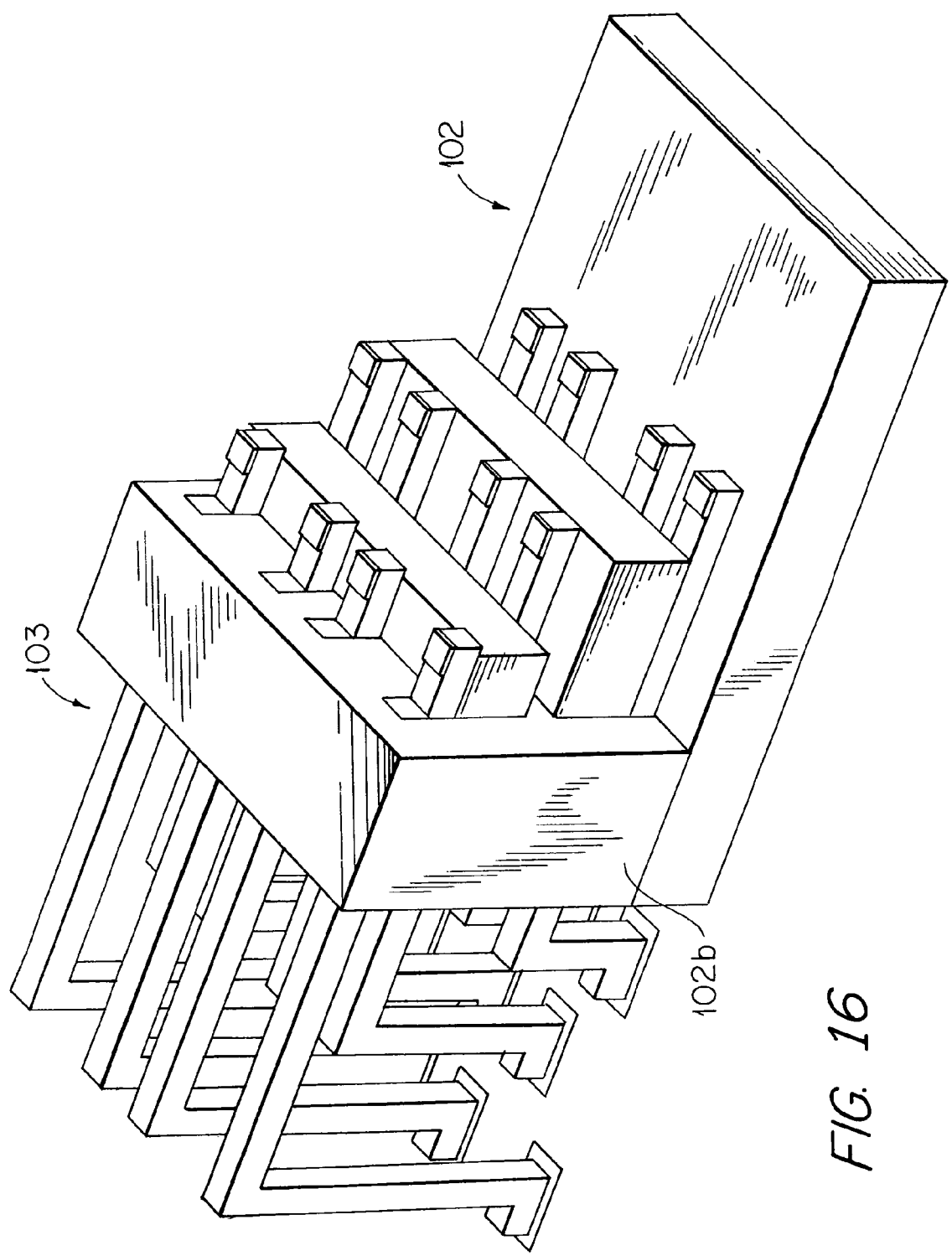
FIG. 16 is a partial perspective view of the embodiment of the semiconductor die carrier illustrated in FIG. 15.
Figure 17:
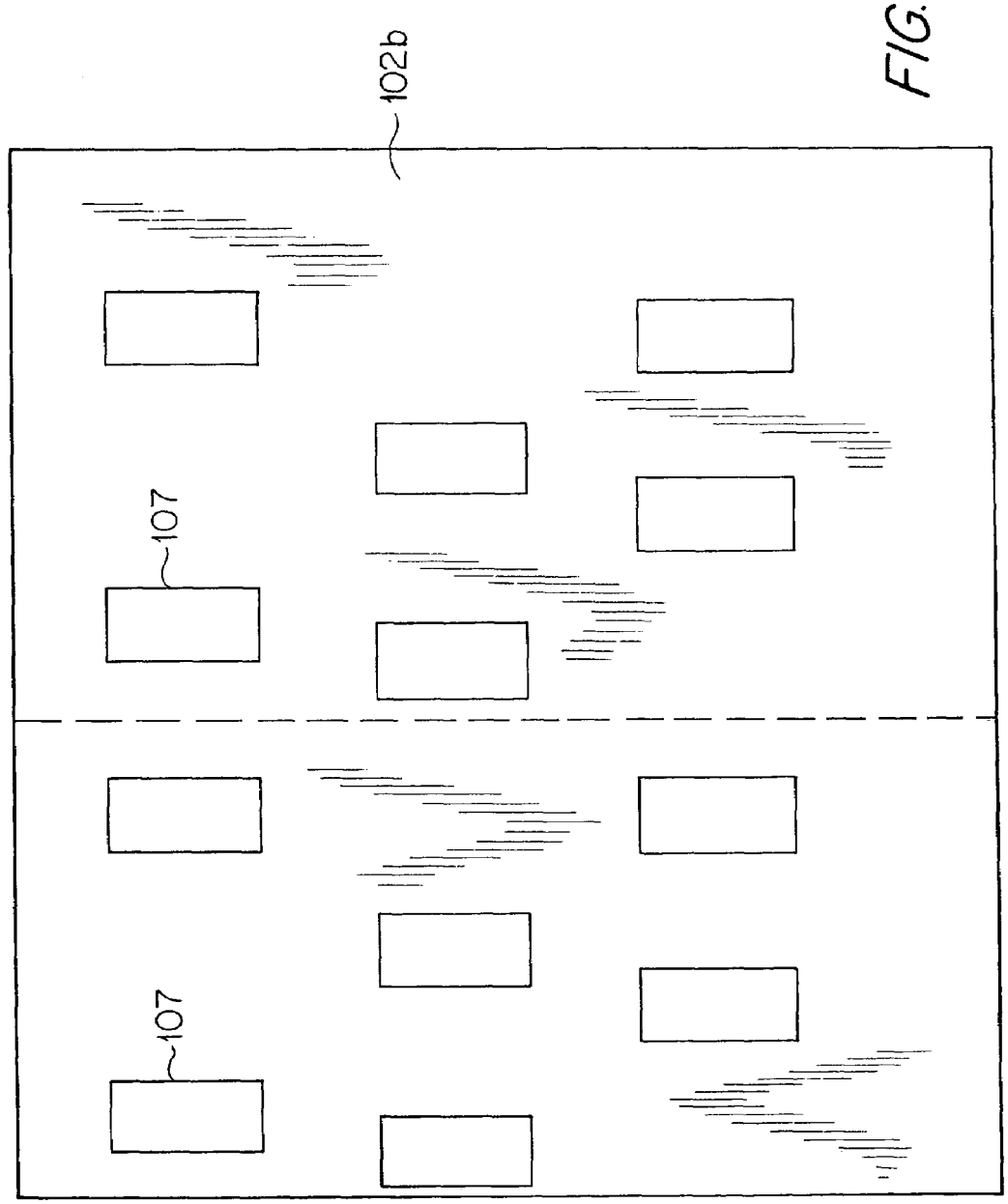
FIG. 17 is a partial side view of the embodiment of the semiconductor die carrier illustrated in FIG. 15 prior to lead insertion with a dotted line segmenting repeating sets of passage arrangements.
Figure 18:
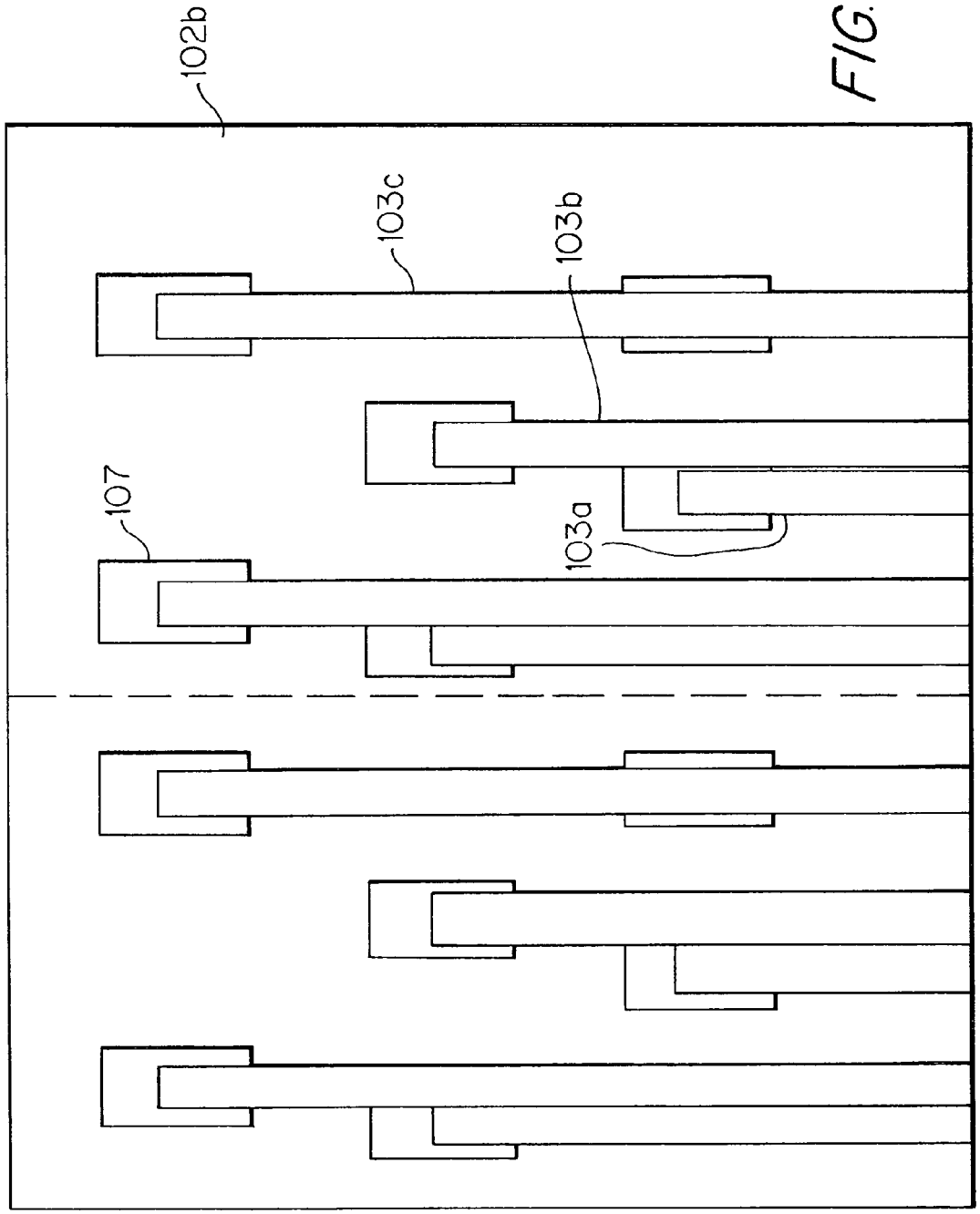
FIG. 18 is a partial side view of the embodiment of the semiconductor die carrier illustrated in FIG. 15 after lead insertion with a dotted line segmenting repeating sets of contact arrangements.

FIG. 16 is a partial perspective view of the embodiment shown in FIG. 15, illustrating details of the manner in which the leads 103 are arranged within the side walls 102b of the substrate 102. FIG. 17 is a partial side view of the semiconductor die carrier of FIG. 15 prior to insertion of the leads 103 into the lead passages 107, and FIG. 18 is a partial side view of the semiconductor die carrier of FIG. 15 after insertion of the leads 103. The patterns separated by dotted lines in FIGS. 17 and 18 may repeat along the length of each side wall 102b.

Figure 19:
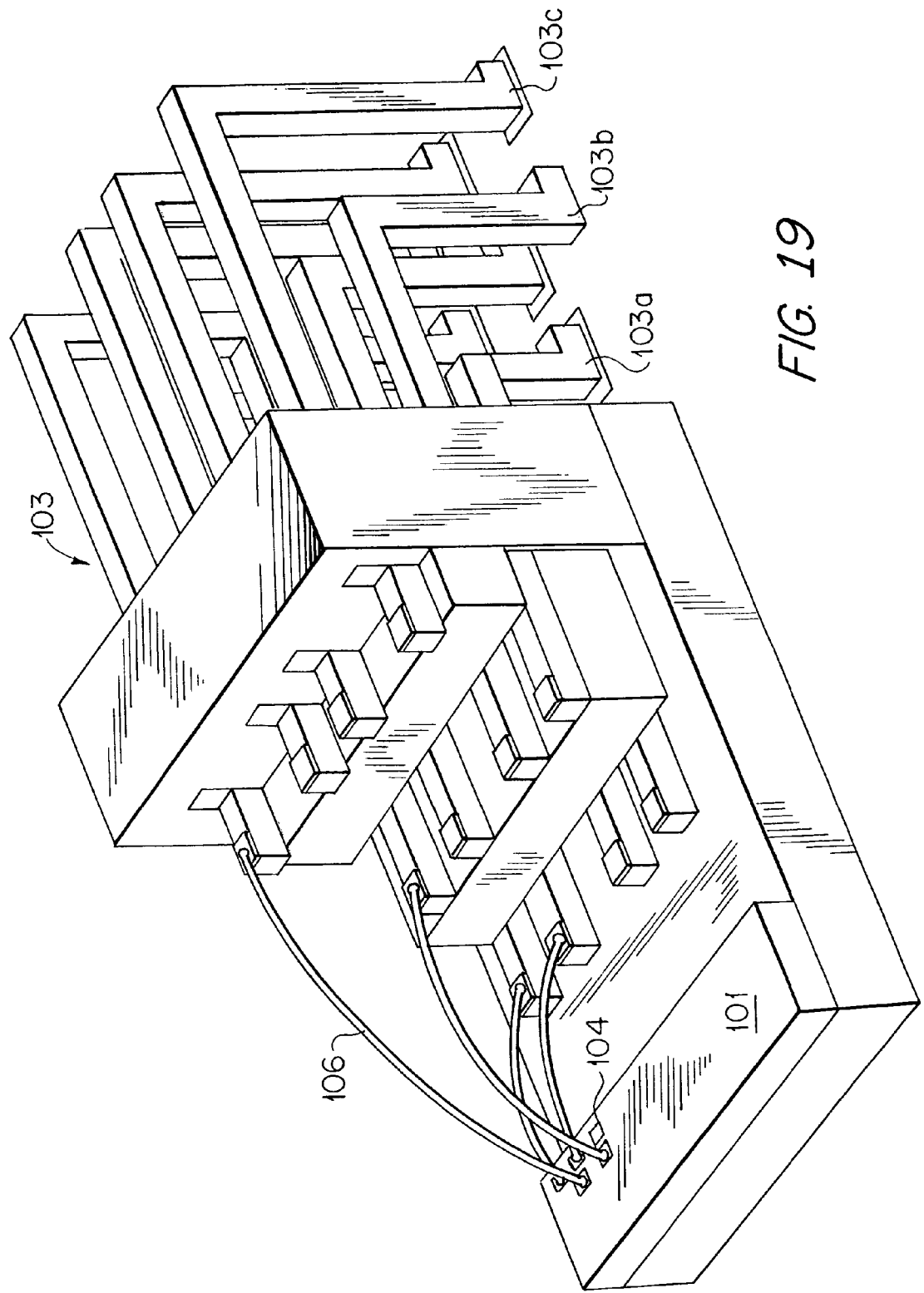
FIG. 19 is a partial perspective view of the embodiment of the semiconductor die carrier illustrated in FIG. 15 showing wire bonding details.

The arrangement of the leads 103 within the side walls 102b allows the bonding extension sections 1031 of the leads to be positioned to facilitate the connecting of the bonding terminals 105 of the leads to the bonding pads 104 on the semiconductor die. As seen from FIG. 19, which is a partial perspective view of the embodiment of FIG. 15 showing wire bonding details, a three-row embodiment of the present invention can be used for packaging in connection with a semiconductor die having two or more rows of bonding pads 104 arranged along each of its edges. Alternatively, the semiconductor die could have a single row of bonding pads 104 aligned along each of its edges. It should be noted that while ledges 108 are not shown in FIG. 15, such ledges are applicable to this embodiment.

Figure 20:
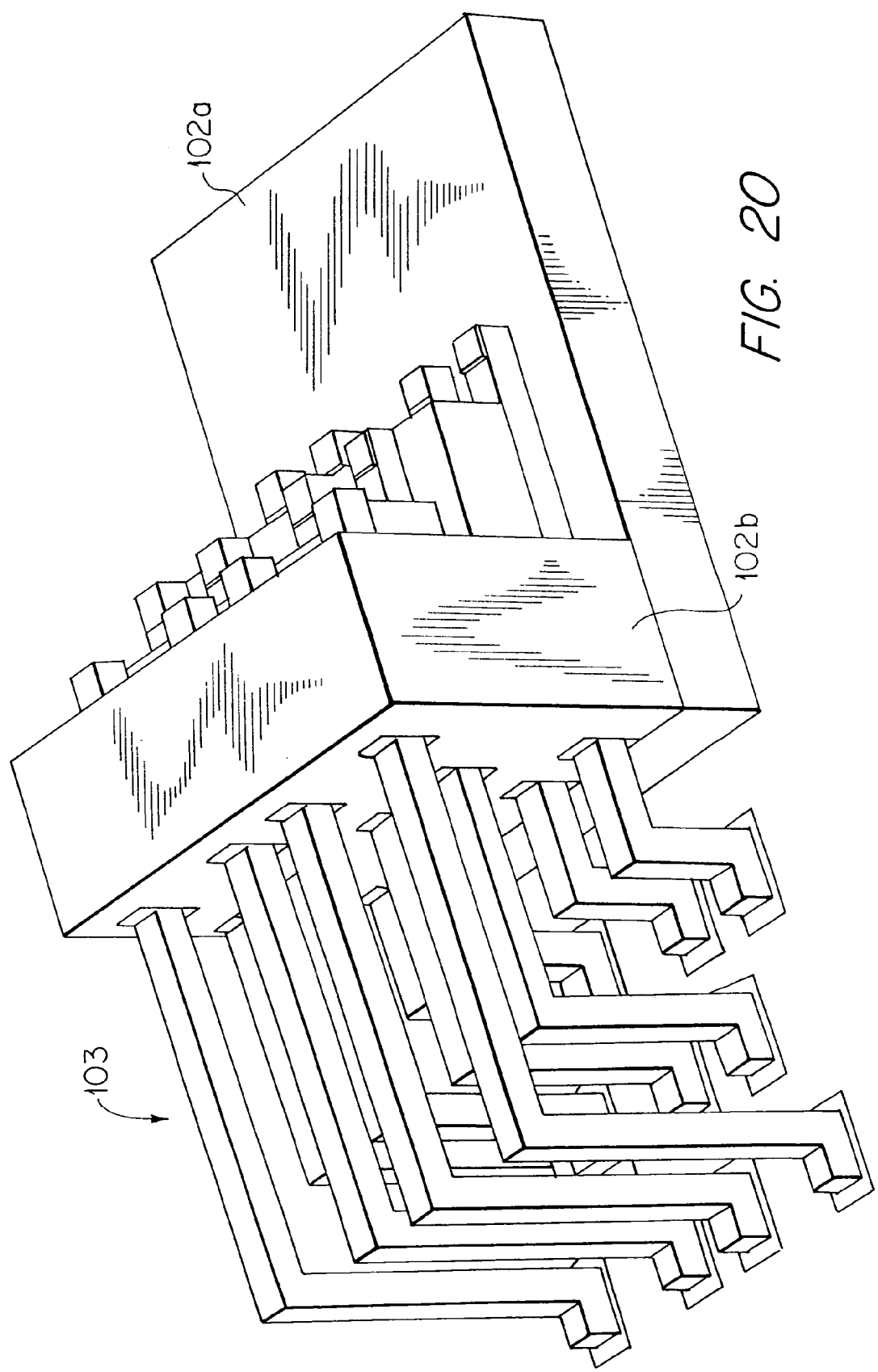
FIG. 20 is a partial perspective view of the embodiment of the semiconductor die carrier illustrated in FIG. 15 showing lead interface details.
Figure 21:
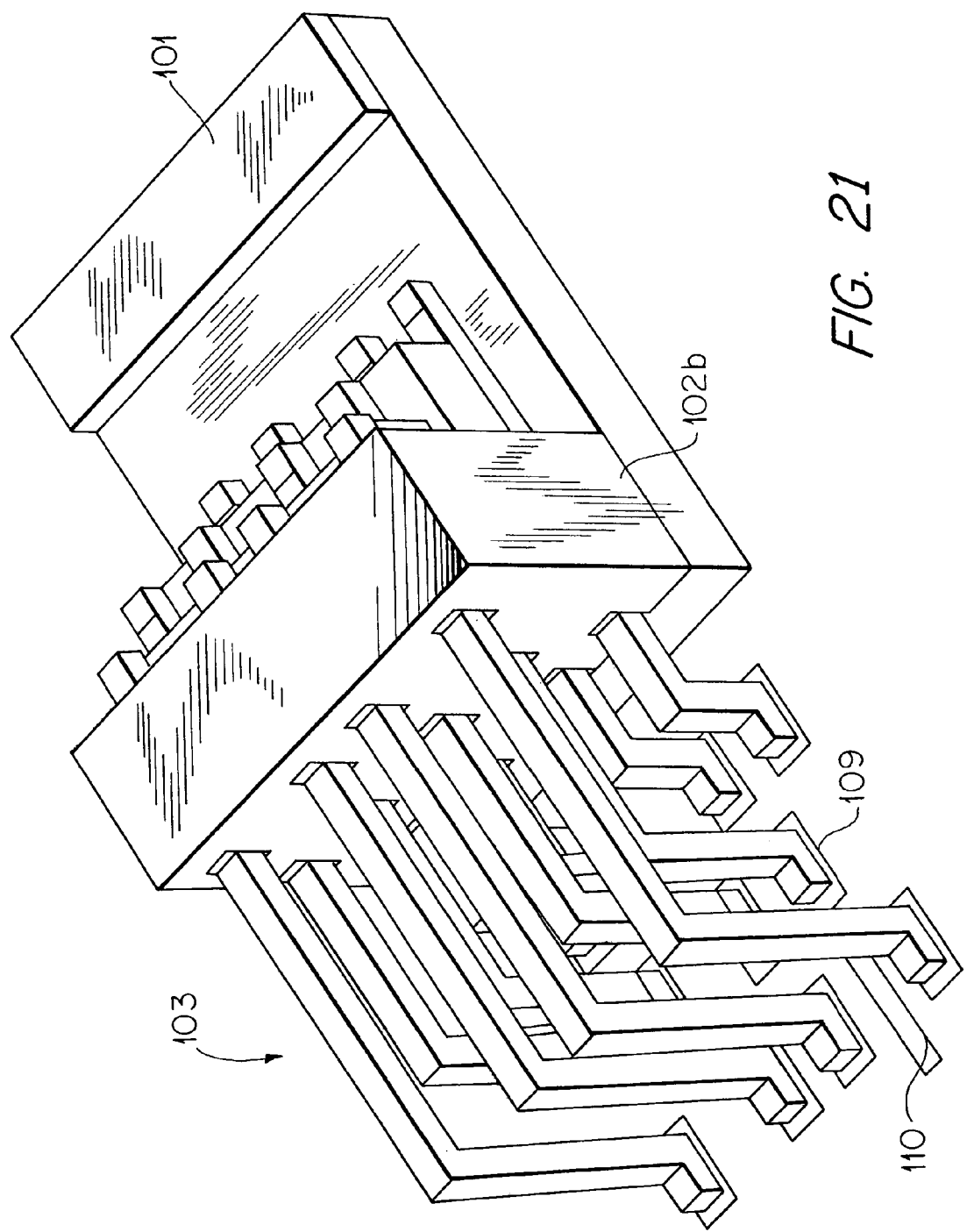
FIG. 21 is a partial perspective view of the embodiment of the semiconductor die carrier illustrated in FIG. 15 showing lead interface details.
Figure 22:
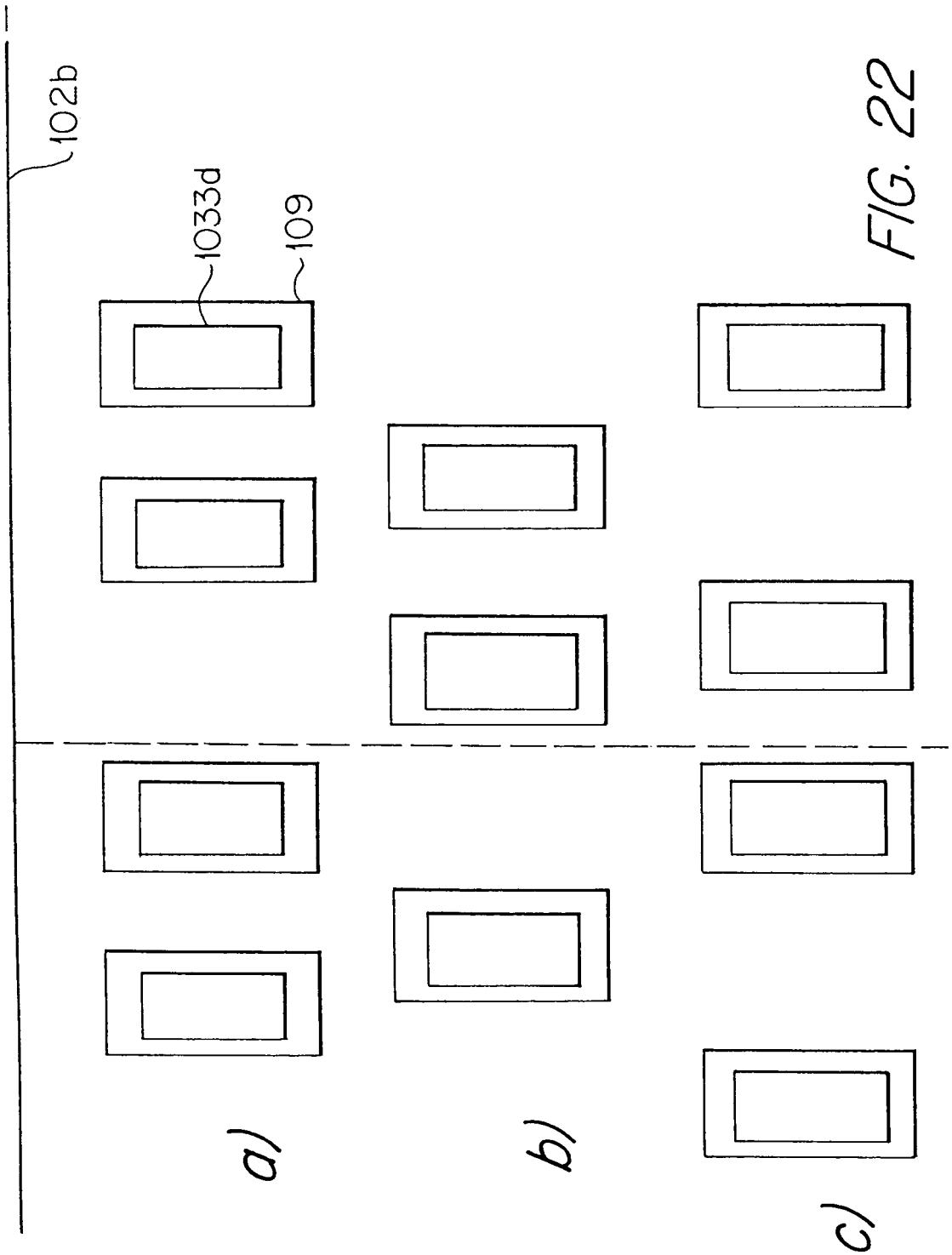
FIG. 22 is a partial top view of the embodiment of the semiconductor die carrier illustrated in FIG. 15 showing footprint details with a dotted line segmenting repeating sets of contact arrangements.
Figure 23:
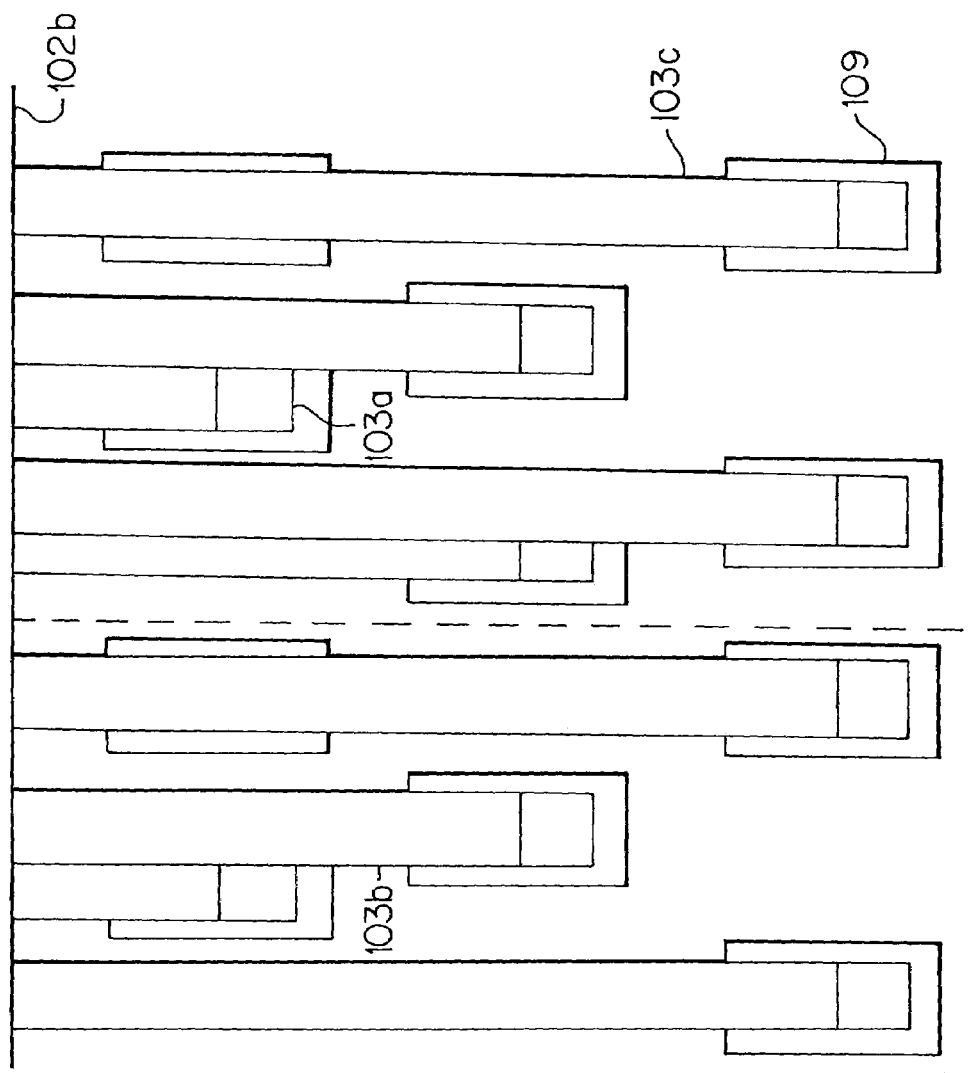
FIG. 23 is a partial top view of the embodiment of the semiconductor die carrier illustrated in FIG. 15 showing lead interface details with a dotted line segmenting repeating sets of contact arrangements.

FIGS. 20 and 21 are partial perspective views of the embodiment of FIG. 15 illustrating details of the manner in which the leads 103 may interface with a PCB or other interface surface. FIG. 22 is a partial top view showing only the foot sections 1033d of the leads 103 arranged on bonding pads 109 of a PCB or other interface surface. The configuration illustrated in FIG. 22 will be referred to herein as a footprint of the semiconductor die carrier. FIG. 23 is a partial top view showing the manner in which the leads 103 extend from the exterior surface of the side walls 102b for mounting on a PCB or other interface surface. The patterns separated by dotted lines in FIGS. 22 and 23 may repeat along the length of each side wall 102b.

The arrangement of the leads 103 with respect to the PCB or other interface surface facilitates the routing of traces 110 on the interface surface upon which, if using SMT technology, for example, or within which, if using PTH technology, for example, the semiconductor die carrier is being mounted. As seen from FIGS. 20–23, for example, the footprint of the semiconductor die carrier of FIG. 15 is arranged into three rows. The first row "a" of the footprint, closest to the side walls 102b of the carrier, is defined by the foot sections of the lower leads 103a. The second row "b" of the footprint, further from the side walls 102b of the carrier, is defined by the foot sections of the middle leads 103b; and the third row "c" of the footprint, furthest from the side walls 102b of the carrier, is defined by the foot sections of the upper leads 103c.

The footprint for the three-row embodiment in accordance with the present invention may be configured such that, for each row of the footprint, the closest distance between adjacent foot sections is 0.3 mm, and the closest center-line to center-line distance between adjacent foot sections is 0.5 mm. This allows for the incorporation of high-density interconnect availability on the PCB or other interface surface upon or within which the leads 103 will be mounted. The aforementioned 0.3 and 0.5 mm distances may be applicable to the other embodiments (for example, one-row, two-row, and four-row embodiments) of the present invention.

Figure 24:
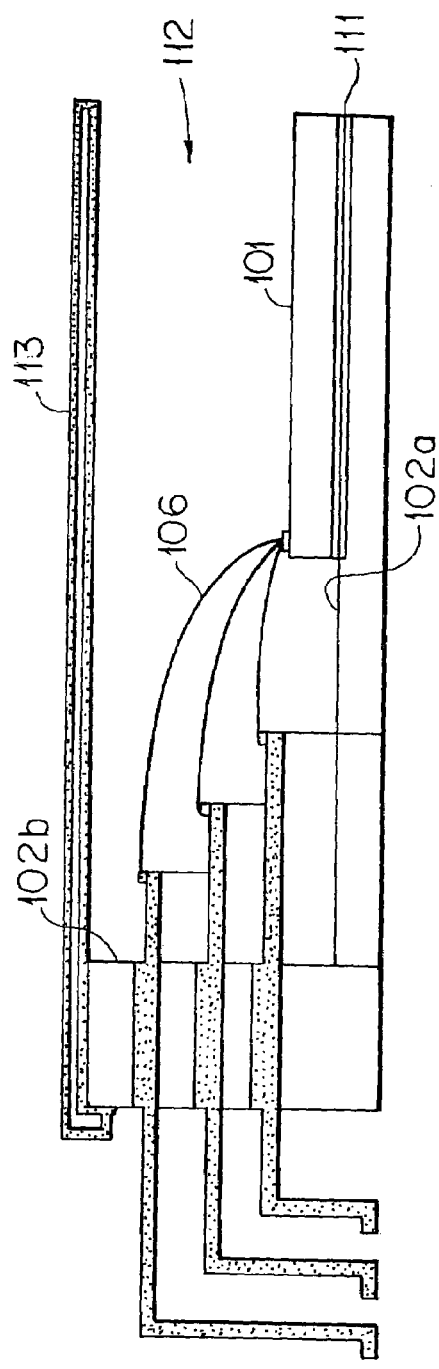
FIG. 24 is a partial side view of the embodiment of the semiconductor die carrier illustrated in FIG. 15 including a cap.

A partial side view of the embodiment of FIG. 15 is shown in FIG. 24. The illustration of FIG. 24 shows features of the semiconductor die carrier including a die bond adhesive 111 for mounting the die 101 on the floor 102a; bonding wires 106 which, in each of the embodiments of the present invention, may be dimensioned to have a wire length of less than 1.0 to 2.5 mm, for example; a cavity filler 112 used to fill the cavity defined by the floor 102a and side walls 102b of the carrier during the encapsulation process; and a sealing cap 113, made of plastic or other thermally-conductive material such as metal or VECTRA (trademark), and capable of functioning as a heat sink, for providing a cover for the semiconductor die carrier.

Figure 25:
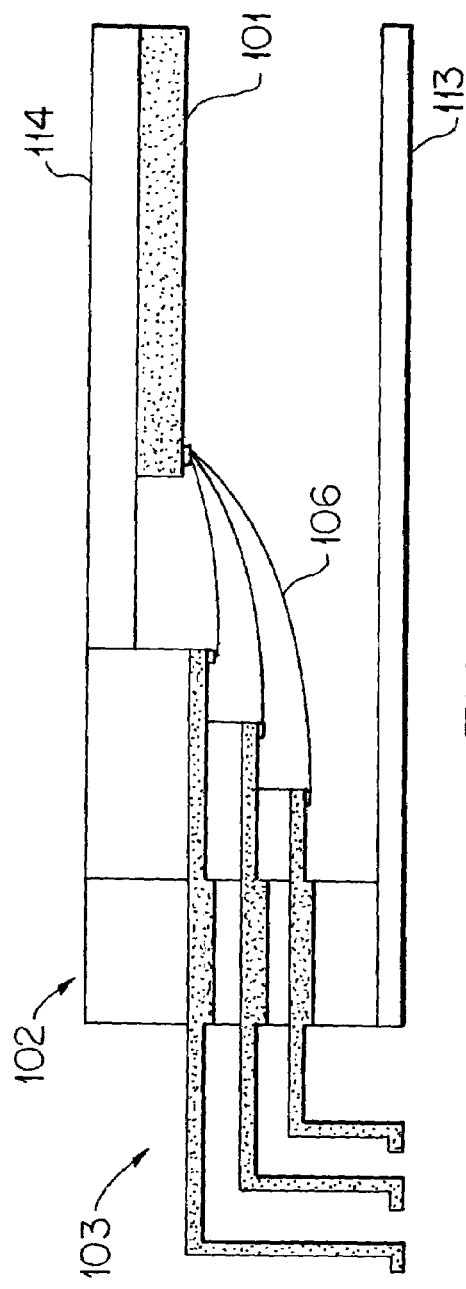
FIG. 25 is a partial side view of a cavity-down configuration in accordance with the embodiment of the semiconductor die carrier illustrated in FIG. 15.

FIGS. 25–28 show various configurations relating to the placement of the semiconductor die 101 within the semiconductor die carrier. Although FIGS. 25–28 depict an embodiment having three-row configuration, it should be noted that the die placement configurations illustrated in these figures are also applicable to the other embodiments of the present invention, including the one-row and two-row embodiments discussed above and the four-row embodiments discussed below.

Where FIG. 24 corresponds to a cavity-up configuration, in which the semiconductor die is mounted within the carrier with the peripheral pads of the die facing up and away from the PCB or other mounting surface, FIG. 25 corresponds to a cavity-down or flip-chip configuration, in which the peripheral pads of the die face down toward the PCB or other interface surface. In the configuration of FIG. 25, the die 101 is mounted on a heat sink cap 114, preferably formed of a thermally conductive material, and then wire bonding, encapsulation, and sealing using a sealing cap 113, preferably formed of VECTRA (trademark), take place. The heat sink cap 114 can be an integrally molded component of the substrate 102, or attached to the substrate 102 after molding of the substrate is completed.

Figure 26:
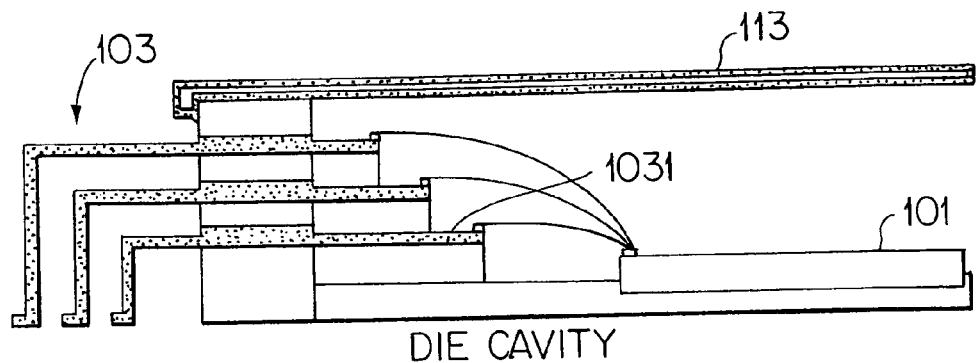
FIG. 26 is a partial side view of a die indentation configuration in accordance with the embodiment of the semiconductor die carrier illustrated in FIG. 15 including a cap.

FIG. 26 shows that the semiconductor die 101 may be embedded or placed into an indentation, similar to the size of the semiconductor die, formed in the floor 102a for receipt of the die. In this configuration, the top surface of the die is located below the bonding extension sections 1031 of the lower leads 103a.

Figure 27:
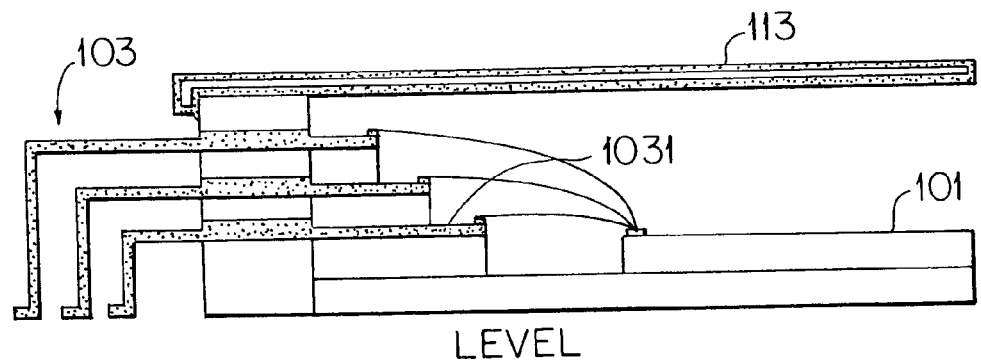
FIG. 27 is a partial side view of a same or similar level configuration in accordance with the embodiment of the semiconductor die carrier illustrated in FIG. 15 including a cap.

FIG. 27 shows the placement of the semiconductor die 101 on top of a flat floor 102a. In this configuration, the top surface of the semiconductor die 101 is the same level or similar in height to the height of the bonding extension sections 1031 of the lower leads 103a.

Figure 28:
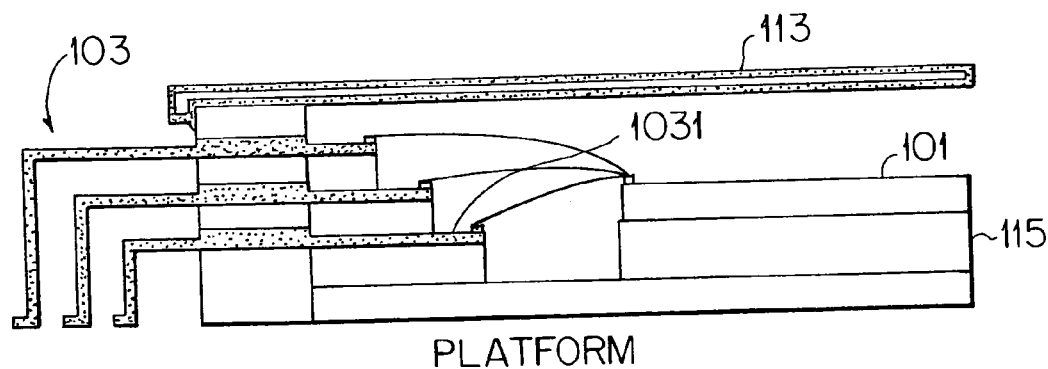
FIG. 28 is a partial side view of a platform configuration in accordance with the embodiment of the semiconductor die carrier illustrated in FIG. 15 including a cap.

FIG. 28 shows the placement of the semiconductor die 101 on a raised platform 115, similar to the size of the die, formed in the interior of the semiconductor die carrier. The raised platform 115 may be an integrally molded component of the substrate 102, or attached to the substrate 102 after molding of the substrate is completed.

It should be noted that, in each of the configurations shown in FIGS. 25–28, the semiconductor die 101 may be mounted using an adhesive material, epoxy, or the like.

Figure 29A:
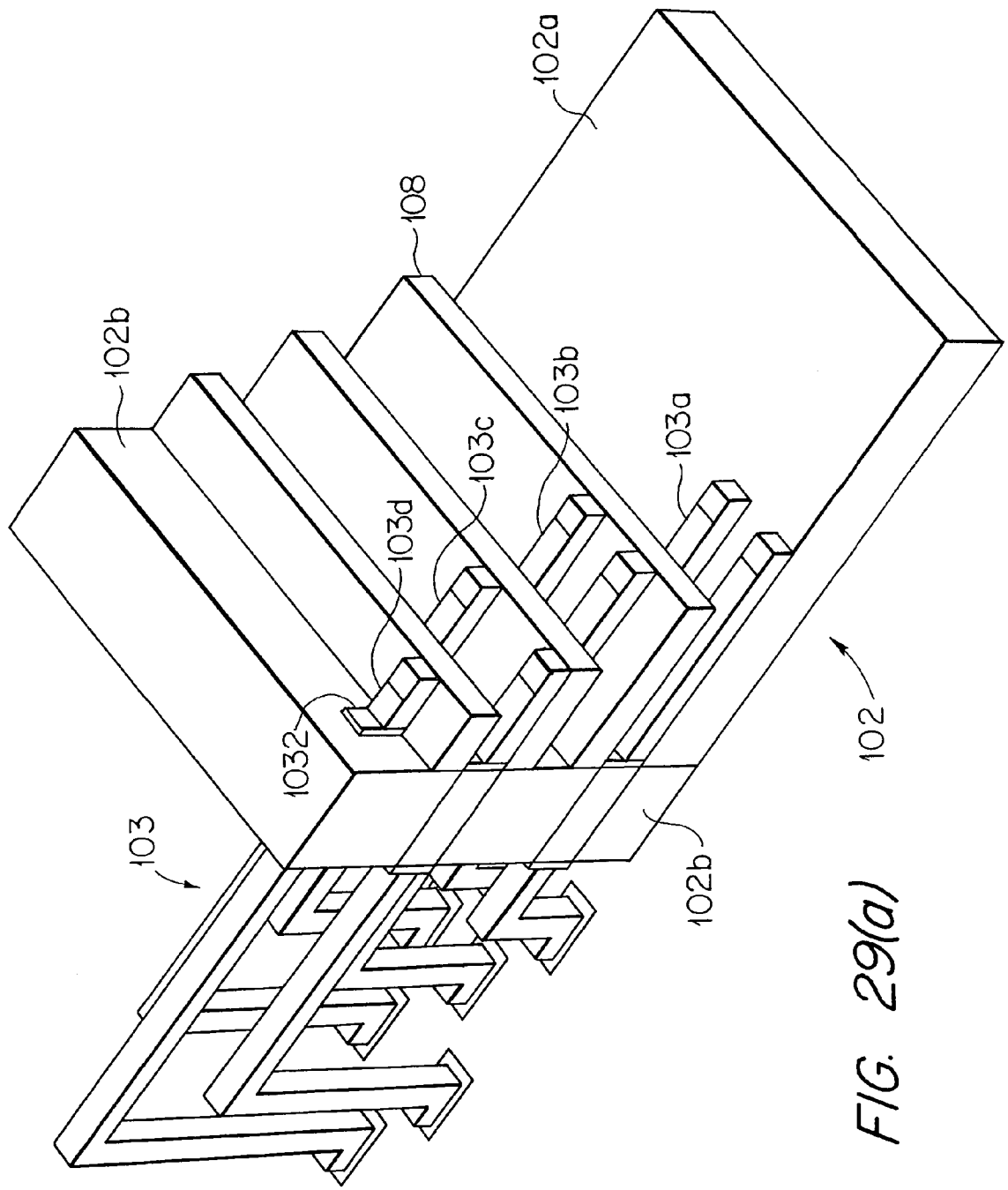
FIG. 29(a) is a partial perspective view of a four-tier embodiment of a prefabricated semiconductor die carrier in accordance with the present invention.
Figure 29B:
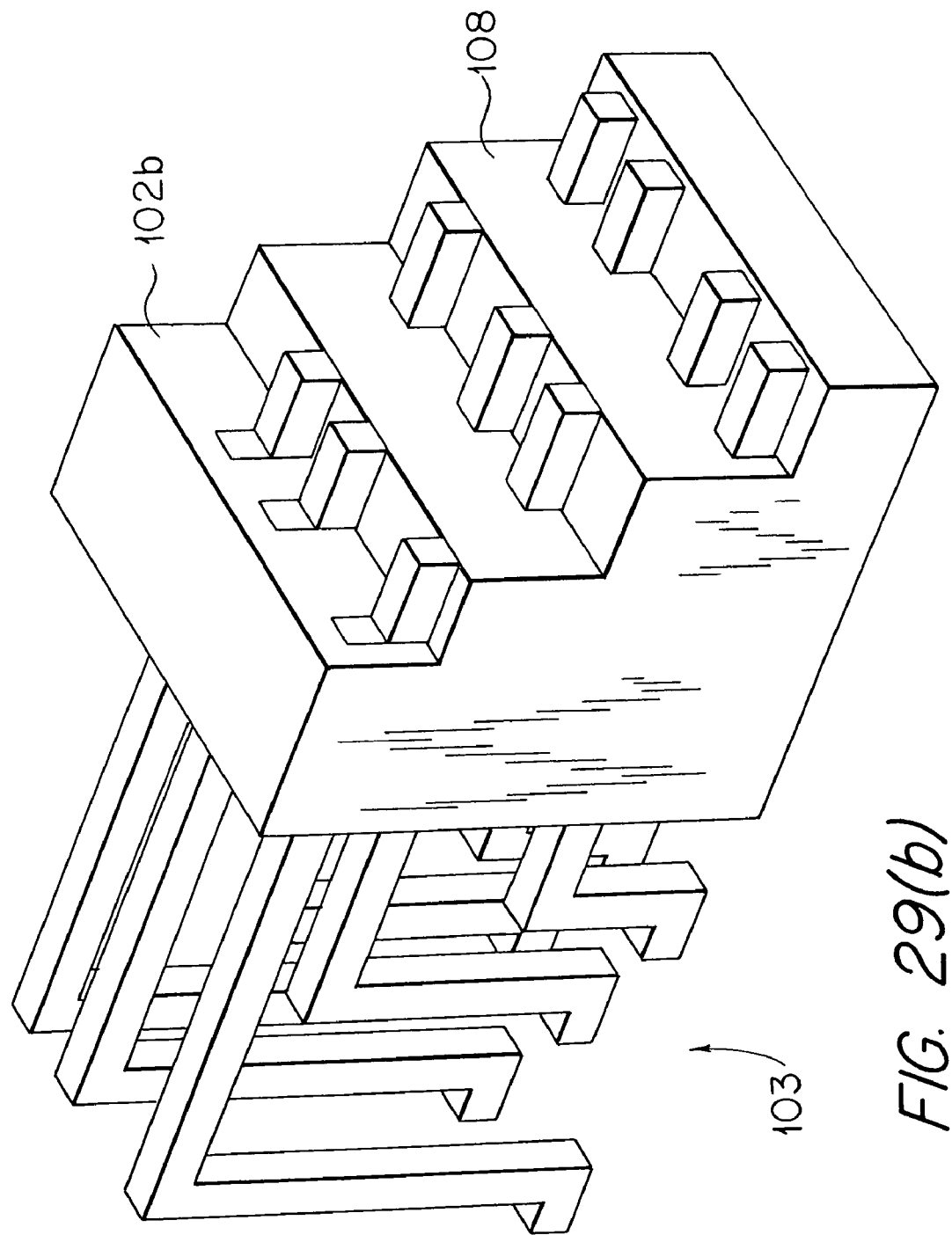
FIG. 29(b) is a partial perspective view of a three-tier embodiment of a prefabricated semiconductor die carrier in accordance with the present invention.

A partial view of another embodiment of a preferred semiconductor die carrier in accordance with the present invention is shown in FIG. 29(a). FIG. 29(b) shows a semiconductor die carrier similar to the one shown in FIG. 29(a), except that the ledges 108 in FIG. 29(b) fill in the gaps between adjacent leads of the same row, and only three rows of leads are shown in FIG. 29(b). In other words, in FIG. 29(b), the ledges 108 are not undercut. This simplifies the carrier mold.

The embodiment of FIG. 29(a) essentially corresponds to the embodiments shown in FIGS. 3 and 15, for example, except that four vertically spaced rows of multiple leads 103a, 103b, 103c, and 103d are used instead of two or three of such rows. Such a configuration further enhances the interconnect capabilities of the semiconductor die carrier.

FIG. 29(a) illustrates that, in all the embodiments of the present invention, the stabilizing section 1032 of each lead 103 may overlap or extend beyond the inner surface of its corresponding side wall 102b, if desired. Alternatively, in all of the embodiments of the present invention, a stop such as that depicted in FIG. 10 could be used to prevent over-insertion of the leads.

The semiconductor die carrier of FIG. 29(a) is manufactured in the same manner that the die carriers shown in FIGS. 3 and 15 are manufactured. More particularly, for the embodiment of FIG. 29(a); the leads 103 are formed within the side walls 102b via insertion or an insert molding procedure; the semiconductor die 101 is adhered to the floor 102a; the bonding pads 104 of the die are connected to the bonding terminals 105 of the leads 103, respectively; and the cavity of the carrier could be filled with high-temperature material such as VECTRA (trademark) and/or a cap could be sealed on top of the carrier. Exemplary dimensions for the embodiment of FIG. 29(a) are a height of 3.4 mm; a width of approximately 28.0 mm; and a lead row length of 16.2 mm. In this configuration, the semiconductor die carrier of FIG. 29(a) can be manufactured to be approximately 57% smaller than conventional 304-pin QFPs.

Figure 31:
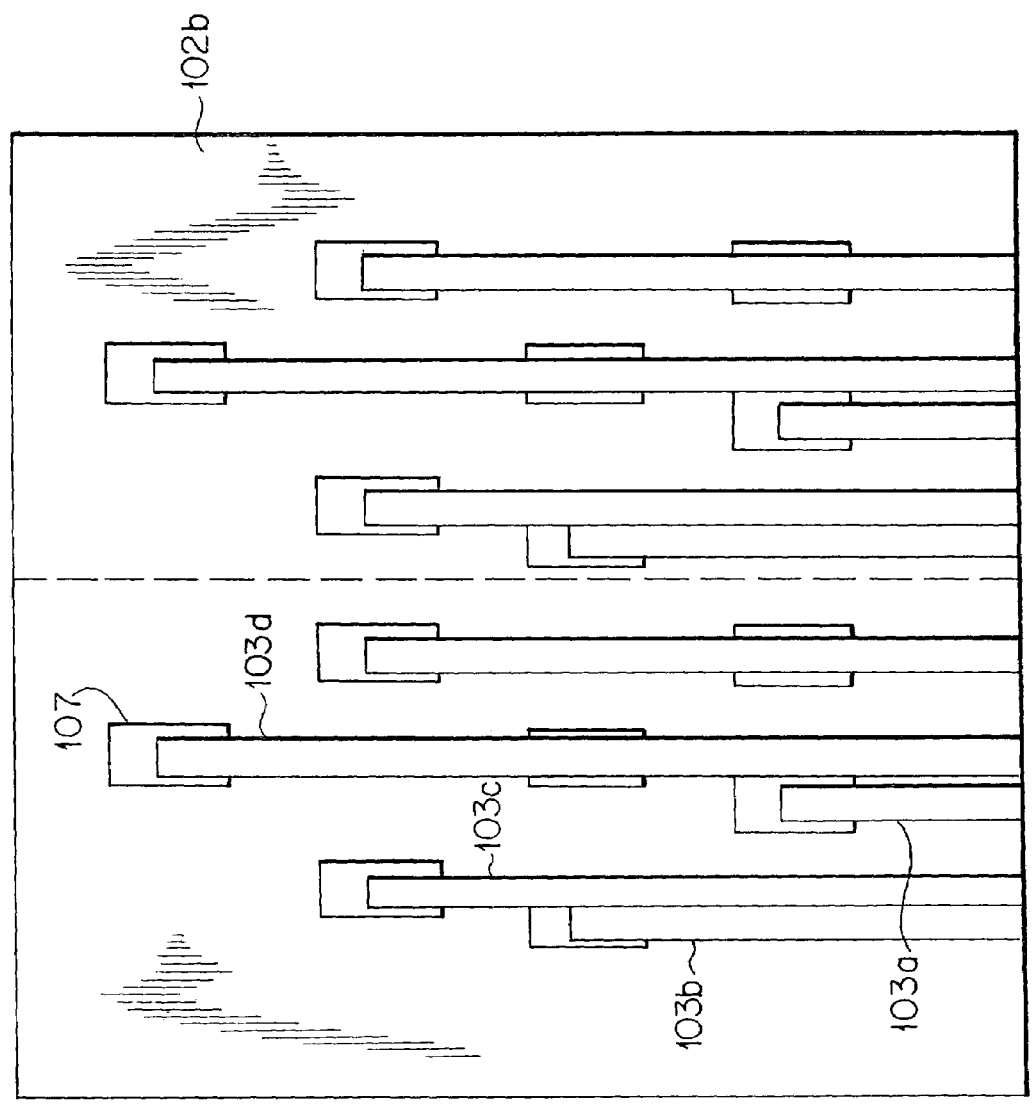
FIG. 31 is a partial side view of the embodiment of the semiconductor die carrier illustrated in FIG. 29(a) after lead insertion with a dotted line segmenting repeating sets of contact arrangements.

FIG. 30 is a side view of the semiconductor die carrier of FIG. 29(a) prior to insertion of the leads 103 into the lead passages 107, and FIG. 31 is a side view of the semiconductor die carrier of FIG. 29(a) after insertion of the leads 103. The patterns separated by dotted lines in FIGS. 30 and 31 may repeat along the length of each side wall 102b.

As with previously-discussed embodiments, the arrangement of the leads 103 within the side walls 102b allows the bonding extension sections of the leads to be positioned to facilitate the connecting of the bonding terminals 105 of the leads to the bonding pads 104 on the semiconductor die 101. Also, as with previously-discussed embodiments, a four-row embodiment in accordance with the present invention can be used for packaging in connection with a semiconductor die 101 having two or more rows of bonding pads 104 arranged along each of its edges. Alternatively, the semiconductor die 101 could have a single row of bonding pads 104 aligned along each of its edges.

Figure 32:
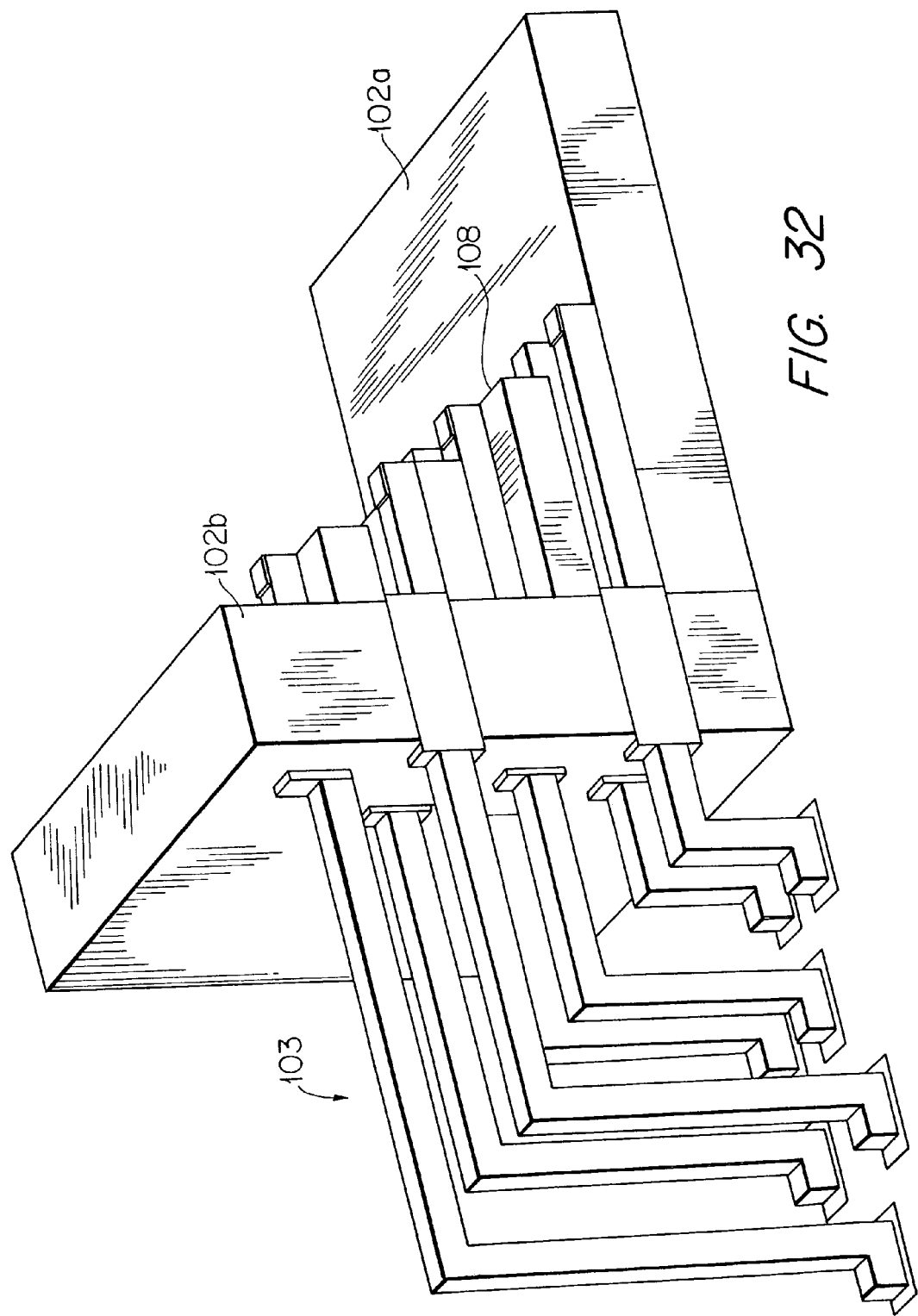
FIG. 32 is a partial perspective view of the embodiment of the semiconductor die carrier illustrated in FIG. 29(a) showing lead interface details.
Figure 33A:
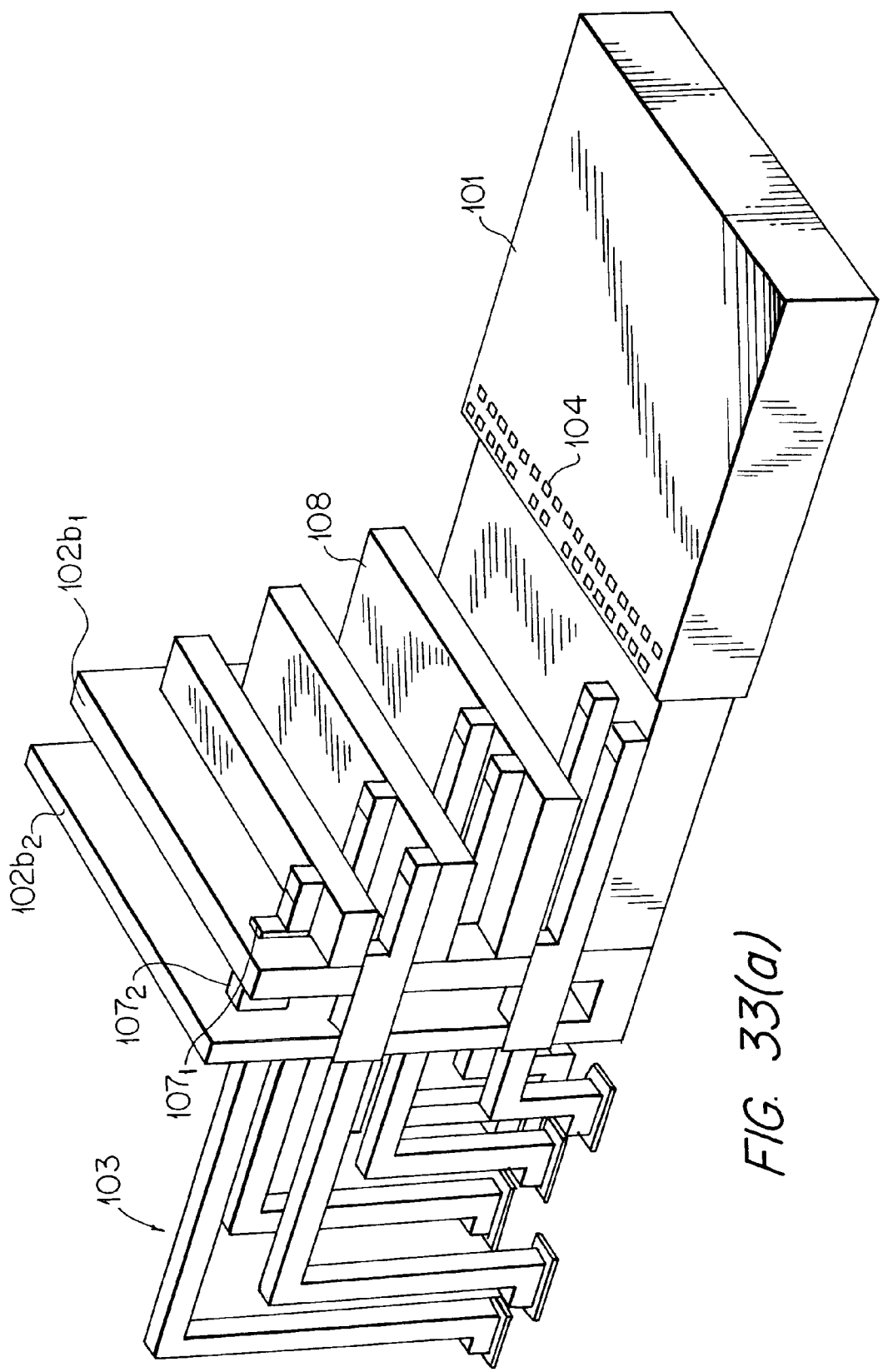
FIG. 33(a) is a partial perspective view of a multiple-wall configuration in accordance with the embodiment of the semiconductor die carrier illustrated in FIG. 29(a).

FIG. 32 is a partial perspective view of the embodiment of FIG. 29(a) illustrating details of the manner in which the leads may interface with a PCB or other interface surface. FIG. 33(a) is a partial perspective view of a multiple-wall configuration in accordance with the embodiment of the semiconductor die carrier illustrated in FIG. 29(a). In the multiple-wall configuration, each of the side walls 102b comprises an inner wall $102b_1$ and an outer wall $102b_2$, with a cavity separating the inner and outer walls. While not shown in FIG. 33(a), each side wall 102b in the multiple-wall configuration may comprise an inner wall, an outer wall, and one or more walls between the inner and outer walls. The multiple-wall configuration eases insertion of the leads 103 into the side wall. After lead insertion, the cavity or cavities between the inner and outer walls may be filled with an epoxy or other adhesive, thereby retaining and stabilizing the leads, sealing the carrier, and preventing contamination.

With regard to the multiple-wall configuration of FIG. 33(a), for each lead 103, the inner lead passage $107_1$ and outer lead passage $107_2$ could have the same cross-sectional dimensions. Alternatively, for each lead 103, the inner and outer lead passages $107_1$ and $107_2$, respectively, could have different cross-sectional dimensions. By using, for each lead 103, an inner passage $107_1$ that is narrower than the corresponding outer lead passage $107_2$, for example, that lead will tend to be retained more securely within the semiconductor die carrier.

FIG. 33(b) is a perspective view of a lead 103 configured for use with a multiple-wall configuration such as that shown in FIG. 33(a). As seen from FIG. 33(b), the stabilizing section 1032 of each lead may include an unnotched portion 1032a, a notched portion 1032b, and an unnotched portion 1032c. When the semiconductor die carrier of the present invention is fully assembled, the unnotched portions 1032a and 1032c may be disposed within the inner and outer walls of the multiple-wall configuration, respectively, and the notched portion may be positioned in a cavity between such walls. The notch in the stabilizing section provides additional surface area for contact with the epoxy or other adhesive filling the cavity between the inner and outer walls.

FIG. 33(c) is a perspective view of another lead 103 configured for use with a multiple-wall configuration such as that shown in FIG. 33(a). As seen from FIG. 33(c), the stabilizing section 1032 may include a raised portion 1032d which provides additional surface area for contact with the epoxy or other adhesive filing the cavity between the inner and outer walls and, at the same time, which can act as a stop against an inner wall to prevent, for example, the over-insertion of the lead 103.

Figure 33D:
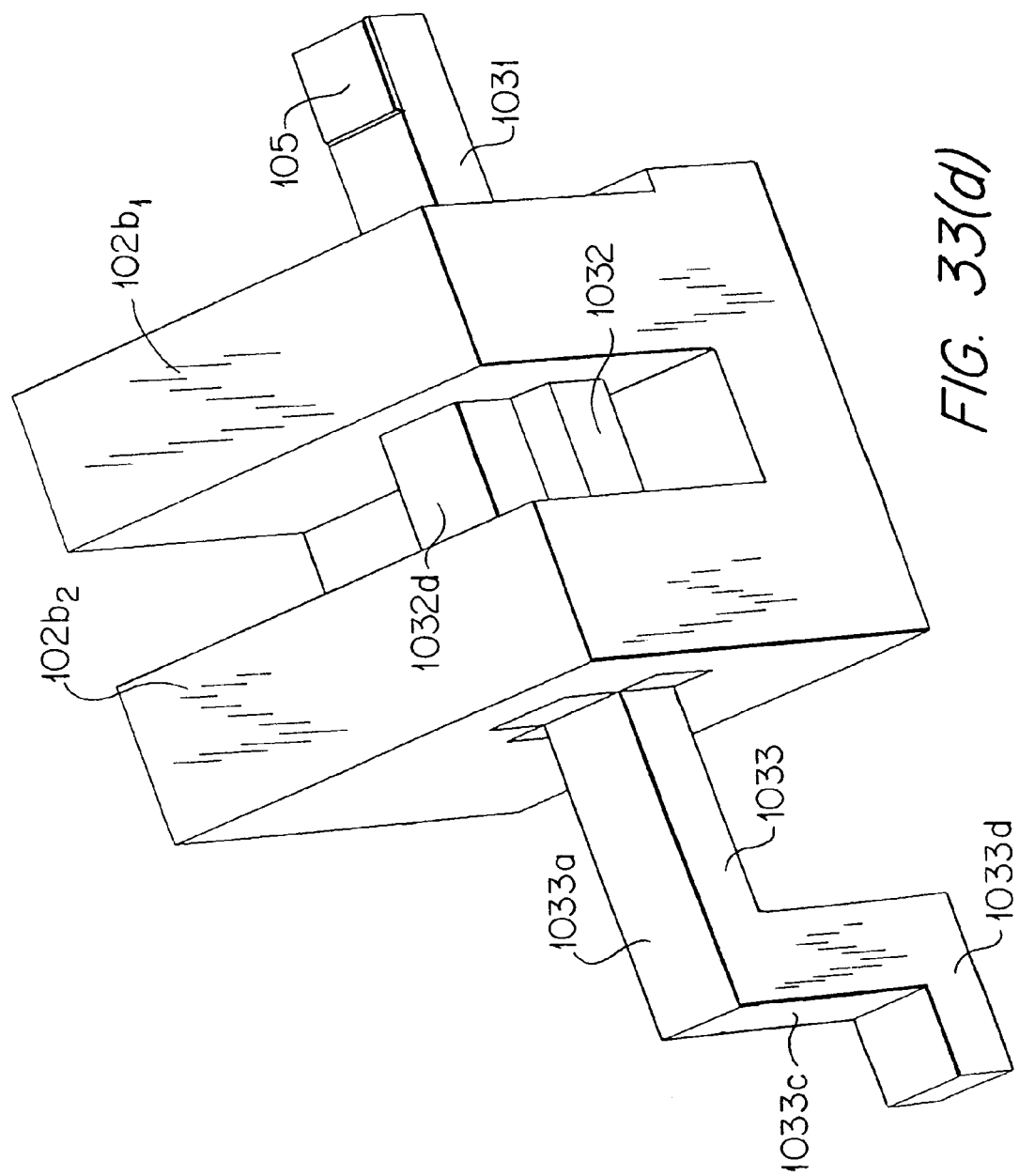
FIG. 33(d) is a partial perspective view of the lead of FIG. 33(c) formed within a multiple-wall configuration of a semiconductor die carrier in accordance with the present invention.

FIG. 33(d) is a partial perspective view illustrating the raised portion 1032d functioning as a stop when used in connection with an outer wall $102b_2$ allowing the raised portion to pass therethrough and an inner wall $102b_1$ which does not allow the raised portion to pass therethrough.

Figure 35:
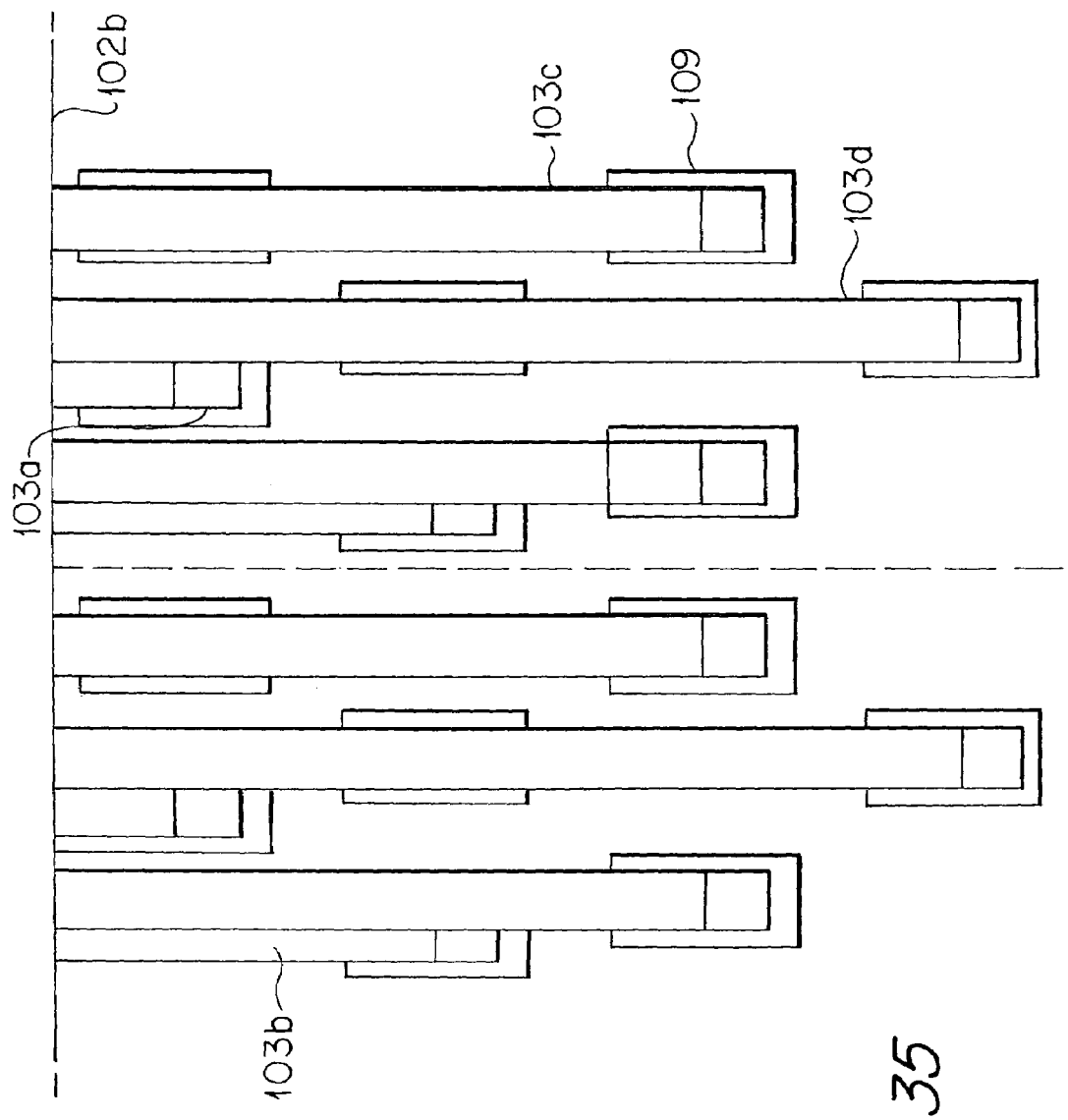
FIG. 35 is a partial top view of the embodiment of the semiconductor die carrier illustrated in FIG. 29(a) showing lead interface details with a dotted line segmenting repeating sets of contact arrangements.

FIG. 34 is a partial top view of an exemplary footprint which is suitable for use with the embodiment of FIG. 29(a). FIG. 35 is a partial top view showing the manner in which the leads 103 extend from the exterior surface of the side walls 102b for mounting on bonding pads 109 of a PCB or other interface surface. The patterns separated by dotted lines in FIGS. 34 and 35 may repeat along the length of each side wall 102b.

As with previously-discussed embodiments, the arrangement of the leads 103 with respect to the PCB or other interface surface facilitates the routing of traces on the PCB or other interface surface upon which, if using SMT technology, for example, or within which, if using PTH technology, for example, the semiconductor die carrier is being mounted. As seen from FIGS. 32–35, for example, the footprint of the semiconductor die carrier of FIG. 29(a) is arranged into four rows. The first row "a" of the footprint, closest to the side walls 102b of the carrier, is defined by the foot sections of the lower leads 103a; the second row "b" of the footprint, further from the side walls 102b of the carrier, is defined by the foot sections of the lower middle leads 103b; the third row "c" of the footprint, still further from the side walls 102b of the carrier, is defined by the foot sections of the upper middle leads 103c; and the fourth row "d" of the footprint, furthest from the side walls 102b, is defined by the foot sections of the upper leads 103d.

Figure 36:
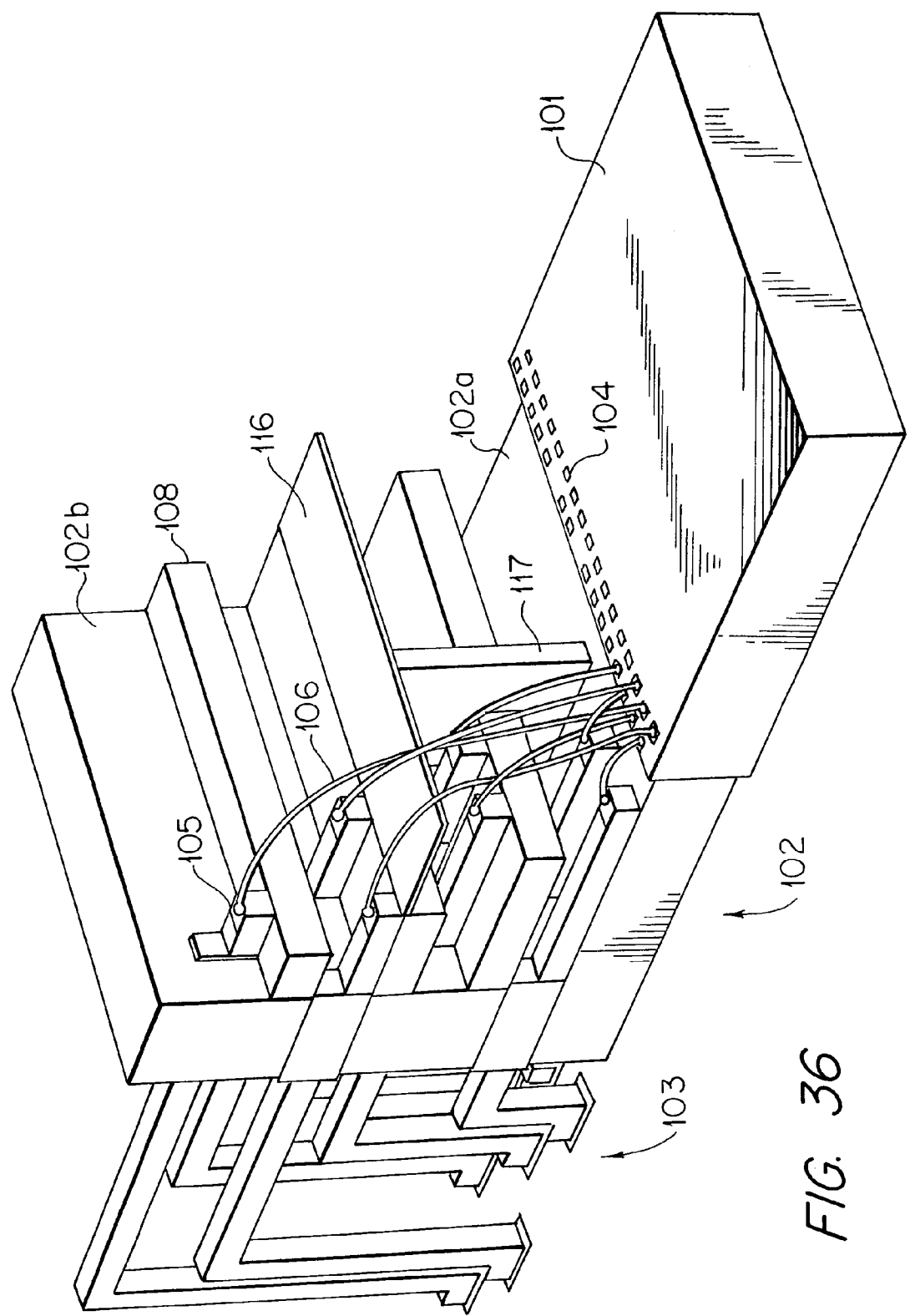
FIG. 36 is a partial perspective view of an insulating separator configuration in accordance with the embodiment of the semiconductor die carrier illustrated in FIG. 29(a).

FIG. 36 is a partial view of the embodiment of the semiconductor die carrier of FIG. 29(a) including additional components designated by reference numerals 116 and 117.

In FIG. 36, reference numeral 116 designates an insulating separator formed of insulative material such as a thin sheet of polyester film or MYLAR (a trademark of E.I. DuPont de Nemours and Company), and refer nce numeral 117 designates a support column formed of, for example, a liquid crystal polymer such as VECTRA (trademark). The insulating separator 116 and/or the support column 117 can be integrally molded components of the substrate 102 or, alternatively, can be attached to the substrate 102 after molding of the substrate is completed. It should be noted that while FIG. 36 only shows one or two leads from each Of the four vertically spaced rows, in the configuration of FIG. 36, the leads 103 extend along essentially the entire length of each of the side walls 102b of the semiconductor die carrier as in previously discussed embodiments. The insulating separator 116 also extends along essentially the entire length of each side wall 102b. Also, while not shown in FIG. 36, several support columns 117 may be regularly or irregularly spaced along each of the side walls 102b of the semiconductor die carrier to provide balanced support of the insulating separator 116 along its length.

In the configuration of FIG. 36, the support columns 117 arranged at regular or irregular intervals along each side wall 102b of the semiconductor die carrier provide support for the insulating separator 116 for that side wall. The insulating separator 116, in turn, provides support for the bonding wires 106, and prevents shorting of the bonding wires by providing insulation between the multiple rows of leads. Such a configuration facilitates the attachment of bonding wires between corresponding pairs of the bonding pads 104 on th die 101 and the bonding terminals 105 and, additionally, facilitates the use of increased numbers of bonding pads 104 per linear inch on the semiconductor die. In this regard, the insulating separator 116 makes it easier to more reliably connect bonding wires to a semiconductor die having two or more rows of bonding pads arranged along each of its edges. However, it should be noted that the configuration of FIG. 36 could also be used with a semiconductor die 101 having, for example, a single row of bonding pads 104 arranged along each of its edges.

Figure 37:
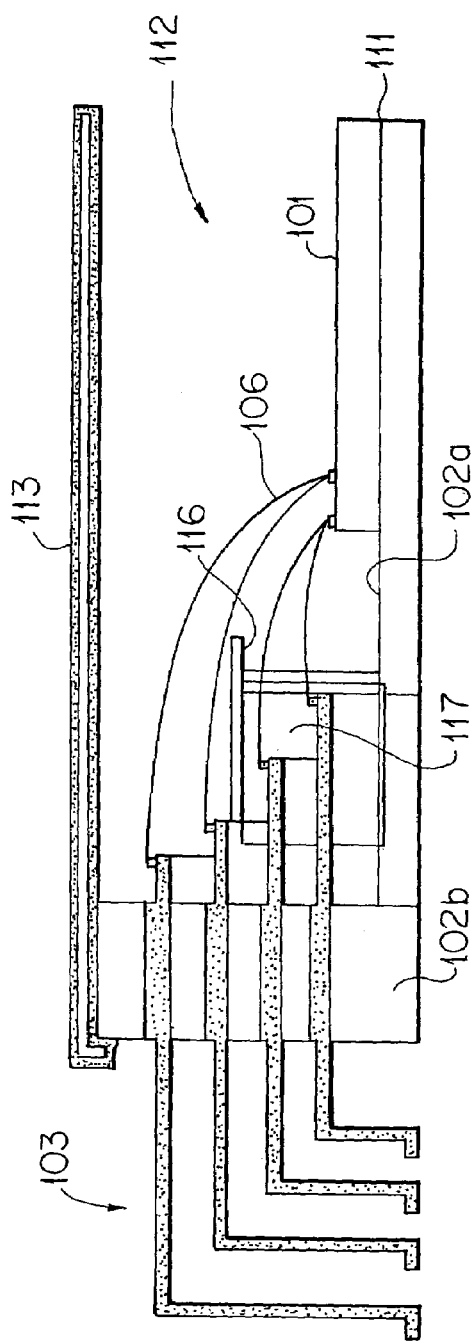
FIG. 37 is a partial side view of an insulating separator configuration in accordance with the embodiment of the semiconductor die carrier illustrated in FIG. 29(a) including a cap.

A partial side view of the configuration of FIG. 36 is shown in FIG. 37. FIG. 37 illustrates features of the semiconductor die carrier of the present invention including a die bond adhesive 111 for mounting the die 101 on the floor 102a; a cavity filler 112 used to fill the cavity defined by the floor 102a and side walls 102b of the carrier during the encapsulation process; and a sealing cap 113 made of plastic or other thermally-conductive material such as metal or VECTRA (trademark), and capable of functioning as a heat sink, for providing a cover for the semiconductor die carrier.

The previously-discussed embodiments and configurations in accordance with the present invention contemplate a prefabricated semiconductor die carrier having one row of multiple leads or two, three, or four vertically spaced rows of multiple leads. While not shown in the accompanying drawings, in accordance with the present invention, prefabricated semiconductor die carriers having five or more vertically spaced rows of multiple leads are also contemplated. Such prefabricated semiconductor die carriers are considered to be within the spirit and scope of the present invention.

Figure 38:
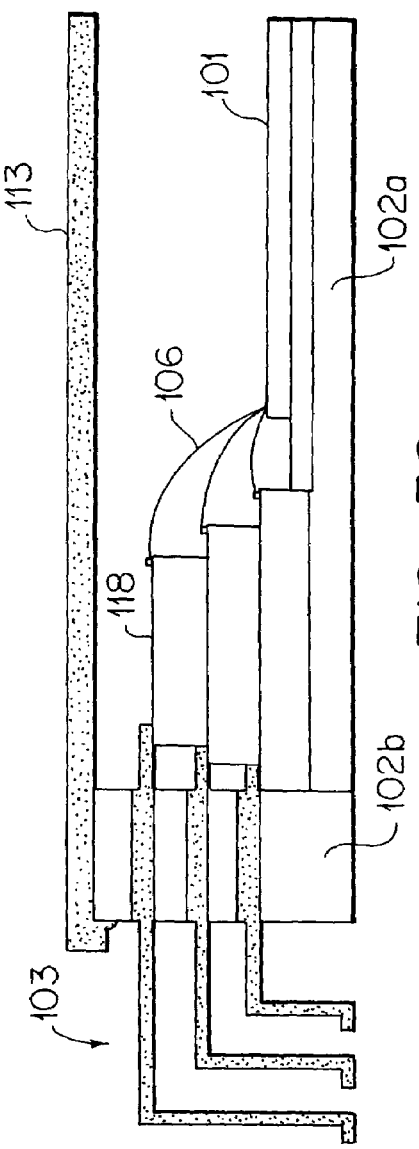
FIG. 38 is a partial side view of a configuration in accordance with the present invention having a stepped ceramic component to facilitate bonding of smaller dies having large I/O characteristics.

FIG. 38 is a partial side view illustrating an aspect of the present invention that is applicable to all of the previously-discussed embodiments. FIG. 38 shows that a multi-layer ceramic component 118 with steps formed along its sides, one step for each row of the leads 103, may be used to achieve electrical interconnection between the leads and the bonding wires 106. The multi-layer ceramic component 118 has a plurality of levels of electrically conductive material and pads along the steps therein to allow for the transmission of signals between the leads 103 and the bonding wires 106 connected to the die 101. Connection between the leads 103 and the ceramic component 118 may be achieved by soldering, for example. The configuration of FIG. 38 has been found to be particularly useful with smaller dies having larger I/O requirements. The use of ceramic components is also applicable to multi-die modules, discussed below, and to configurations incorporating bonding technologies such as C4 and TAB, for example. In particular, the use of a stepped ceramic component such as that depicted in FIG. 18 facilities the incorporation of C4 and TAB bonds within the various embodiments of the present invention.

FIG. 39(a) is a partial side view illustrating another aspect of the present invention that is applicable to all of the previously-discussed embodiments. In FIG. 39(a), the foot portion 1033d for each of leads 103a, 103b, and 103c, is SMT-compatible. However, such foot portions are not coplanar. As can be seen from FIG. 39(a), the foot portion of the middle lead 103b is lower than the foot portion of the lower lead 103a, and the foot portion of the upper lead 103c is lower than the foot portion of the middle lead 103b. Such non-coplanarity renders the semiconductor die carrier of the present invention suitable for use with a multi-layer substrate or PCB 119 having SMT-compatible surfaces or bonding pads 109a, 109b, and 109c formed at various layers thereof (for example, formed on an upper layer 119a, a middle layer 119b, and a lower layer 119c thereof). A copending U.S. patent application to S. Crane et al., entitled "APPARATUS HAVING INNER LAYERS SUPPORTING SURFACE-MOUNT COMPONENTS," filed on even date herewith, and expressly incorporated herein by reference, discloses multi-layer substrate and PCBs suitable for use in connection with the present invention and, in particular, the configuration of the present invention illustrated in FIG. 39(a). Such substrates are equipped with plated or unplated wells 120b and 120c each providing a passage to the inner layer bonding pads. The wells may be filled with solder 121b and 121c to maintain electrical contact between corresponding pairs of bonding pads and leads and to provide mechanical stability.

FIG. 39(b) depicts structure similar to that shown in FIG. 39(a), except in FIG. 39(b) the lead 103c is SMT-mounted to an outer layer of the multi-layer substrate rather than to an inner layer. In FIG. 39(b), the leads from different rows are aligned in a straight line with respect to one another rather than being staggered, such that the lead configuration along the sides of the carrier and on the multi-layer substrate does not require any gaps for routing traces. This allows for a three-row lead configuration that is very high in density.

Figure 40:
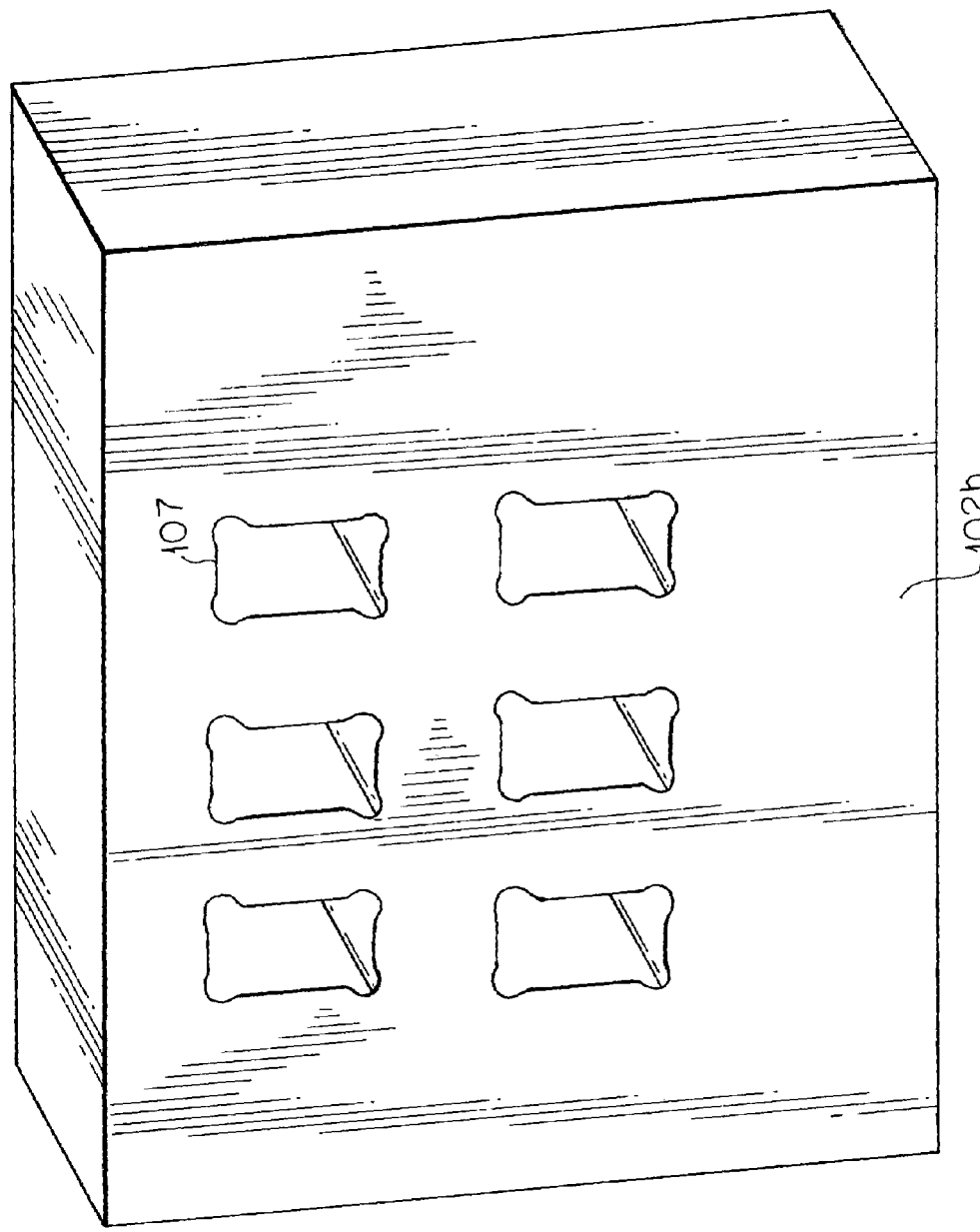
FIG. 40 is a partial perspective view of a prefabricated semiconductor die carrier in accordance with the present invention having lead passages with rounded corners.

FIG. 40 is a partial perspective view illustrating yet another aspect of the present invention that is applicable to all of the previously-discussed embodiments. As seen from FIG. 40, each of the lead passages 107 in one or more (e.g., all) of the side walls 102b may be molded to have a primarily rectangular configuration with rounded corners (i.e., a "dog bone" configuration). The rounded corners serve to relieve some of the stresses which can result on the plastic of the side walls when the leads 103 (not shown in FIG. 40) are inserted.

Figure 41:
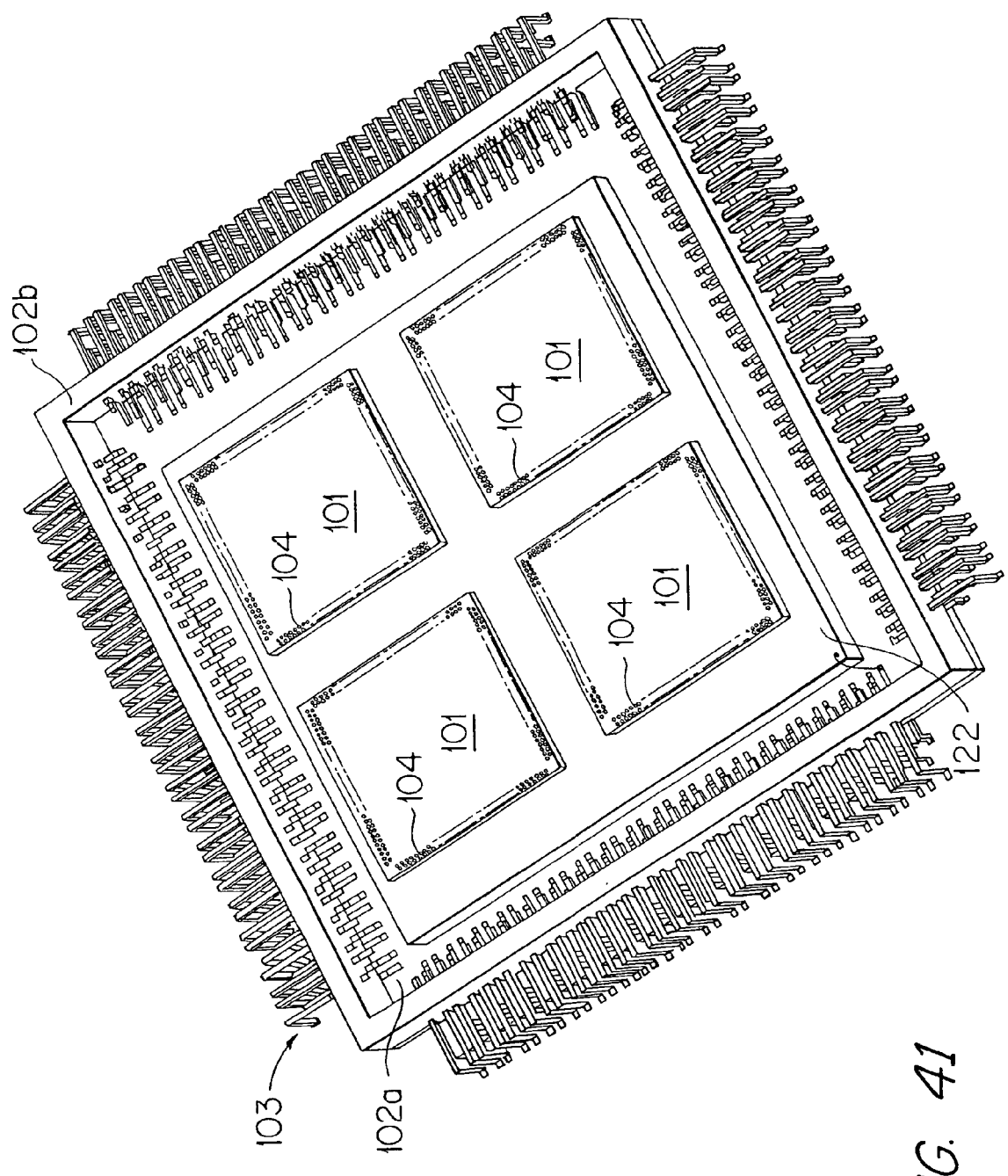
FIG. 41 is a perspective view of a multi-die configuration of a prefabricated semiconductor die carrier in accordance with the present invention.

FIG. 41 is a perspective view of another aspect of the present invention that is applicable to all of the previously-discussed embodiments. As can be seen from FIG. 41, a plurality (e.g., four) of semiconductor dies 101 may be incorporated within a prefabricated semiconductor die carrier in accordance with the present invention, thus allowing an even more efficient usage of materials and board space. In FIG. 41, a multi-layer ceramic component 122, having a plurality of levels of electrically conductive material therein, is glued or otherwise adhered to the floor 102a, and the plurality of semiconductor dies 101 are glued or otherwise adhered to the multi-layer ceramic component. The dies may or may not be electrically connected to the multi-layer ceramic component using C4, wire bond, TAB, or other bonding technologies. In the case where C4, TAB, or like bonding is used, conductive lands on the bottom surface of the dies are used to provide electrical interconnection between the dies and the ceramic component 122. In the case where wire bonding is used, bonding wires (not shown) connected at one end to the bonding pads 104 and at the other end to the ceramic component 122 are used to provide electrical interconnection between the dies and the ceramic component.

The leads 103 are either soldered to the ceramic component 122, or electrically connected to the ceramic component using bonding wires (not shown). For the bonding pads 104 along the outwardly-facing edges of each semiconductor die 101, rather than transmitting the signals between the leads 103 and the bonding pads 104 via the multi-layer ceramic component 122, such signals may be transmitted directly between the bonding pads and leads via bonding wires (not shown) directly connected to the leads 103 at one end and directly connected to the bonding pads 104 at the other end.

While FIG. 41 shows the incorporation of four semiconductor dies within a single prefabricated semiconductor die carrier in accordance with the present invention, either more or less dies per semiconductor die carrier are contemplated. As stated previously, the incorporation of a plurality of semiconductor dies within a single die carrier allows more effective usage of materials and board space.

Figure 42:
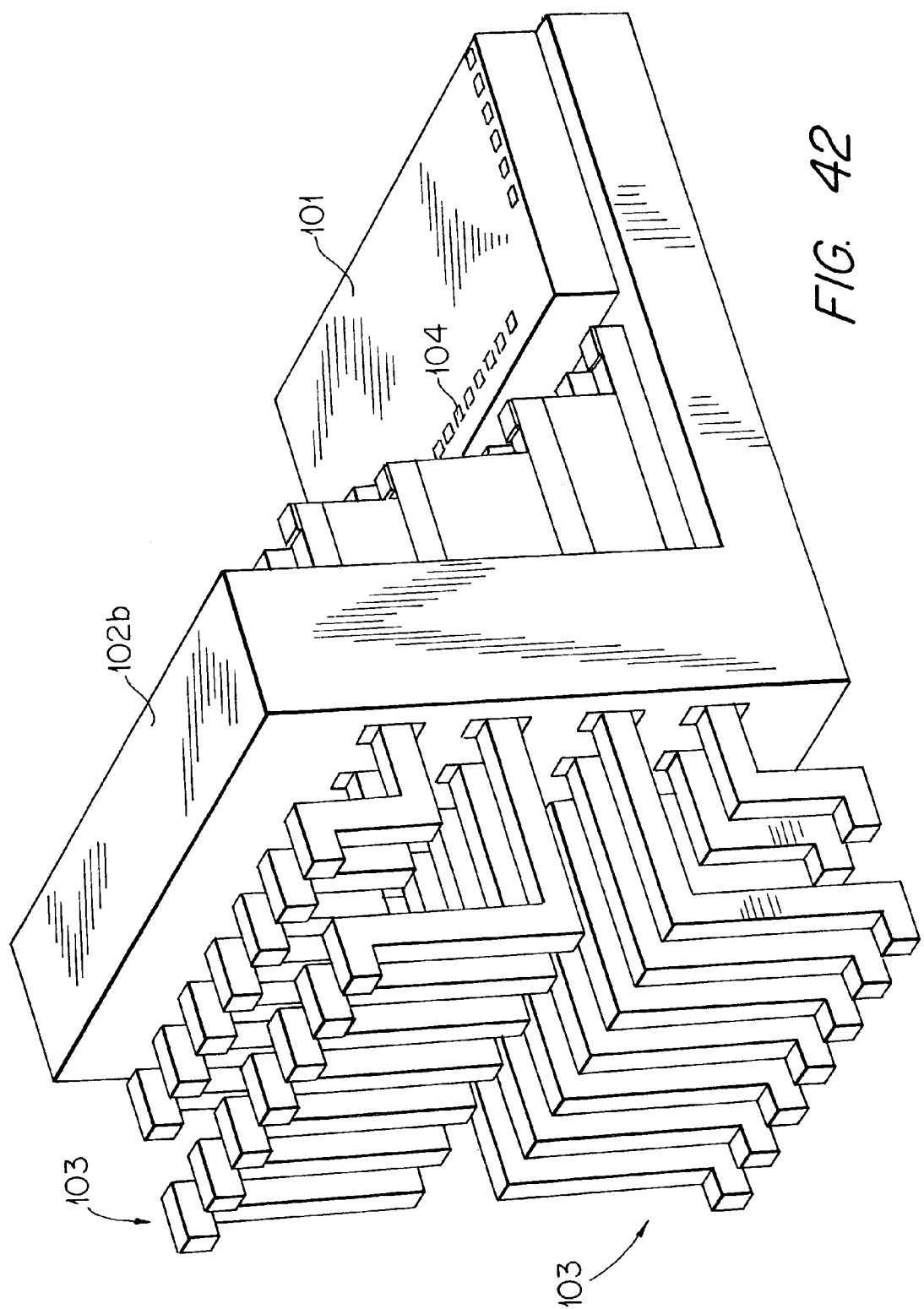
FIG. 42 is a partial perspective view of a semiconductor die carrier in accordance with the present invention having upwardly-oriented and downwardly-oriented leads.

FIG. 42 is a partial perspective view of yet another aspect of the present invention that is applicable to all of the previously-discussed embodiments. As seen from FIG. 42, some of the leads 103 may be oriented in an upward direction, while others of the leads may be oriented in a downward direction. The number of rows of upwardly-oriented and downwardly-oriented leads may be the same, as depicted in FIG. 42, or the number of upwardly-oriented leads may be greater than or less than the number of downwardly-oriented leads. The configuration of FIG. 42 allows the mounting of the leads to one or more substrates located above the semiconductor die carrier and also to one or more PCBs located below the semiconductor die carrier and, therefore, is particularly useful for the purpose of creating stacks of PCBs or other substrates.

Figure 43:
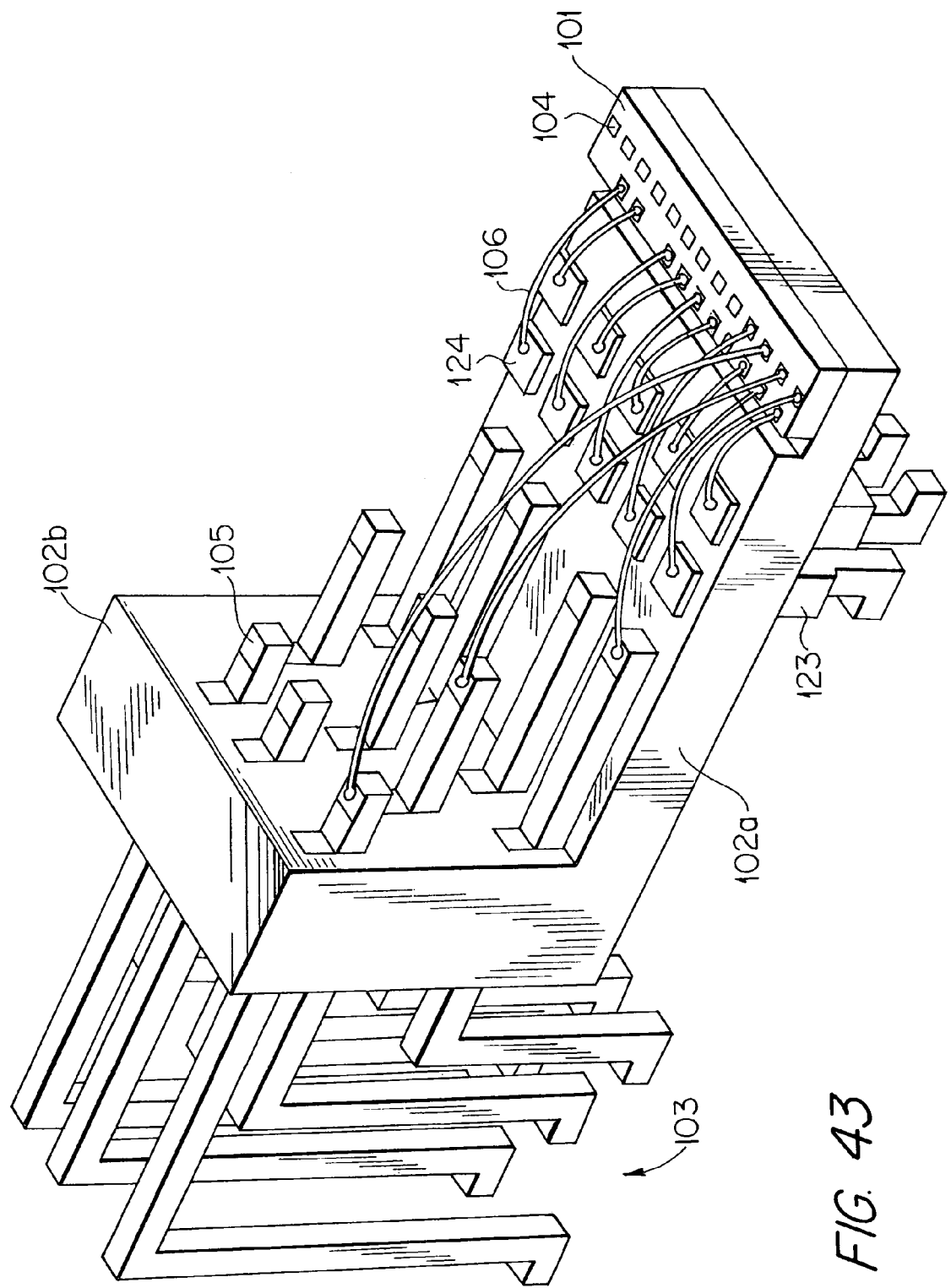
FIG. 43 is a partial perspective view of a semiconductor die carrier in accordance with the present invention having sideways-extending and downwardly-extending leads.

FIG. 43 is a partial perspective view of still another aspect of the present invention that is applicable to all of the previously-discussed embodiments. In FIG. 43, in addition to having leads 103 extending sideways in a horizontal direction from its side walls 102b, the prefabricated semiconductor carrier may also have leads 123 extending downward in a vertical direction from its floor 102a. This configuration allows for more leads on a single semiconductor die carrier and provides increased design flexibility and versatility. The top-portions of the leads 123 may have plated (gold-plated, for example) tips 124 to facilitate bonding with the bonding wires 106.

In accordance with the configuration of FIG. 43, the downwardly-extending leads 123 may be positioned around the periphery of the semiconductor die area. Additionally, or alternatively, the downwardly-extending leads 123 may extend from the portions of the floor 102a directly beneath the semiconductor die area. This could be accomplished, for example, by interposing a multi-layer ceramic component (not shown) between each semiconductor die 101 and the floor 102a. Each semiconductor die 101 could be electrically connected to the interposed multi-layer ceramic component by wire bonding, tape automated bonding (TAB), or controlled collapse die connection (C4) interconnects, or the like, and the interposed multi-layer ceramic component could be electrically connected to the leads 123 using ball grid array (BGA) technology. The use of downwardly-extending leads 123 could also be accomplished without using an interposed multi-layer ceramic component. In this regard, each semiconductor die 101 could be directly electrically connected to the tip portions 124 of the downwardly-extending leads 123 using C4 interconnect technology, for example.

Figure 44:
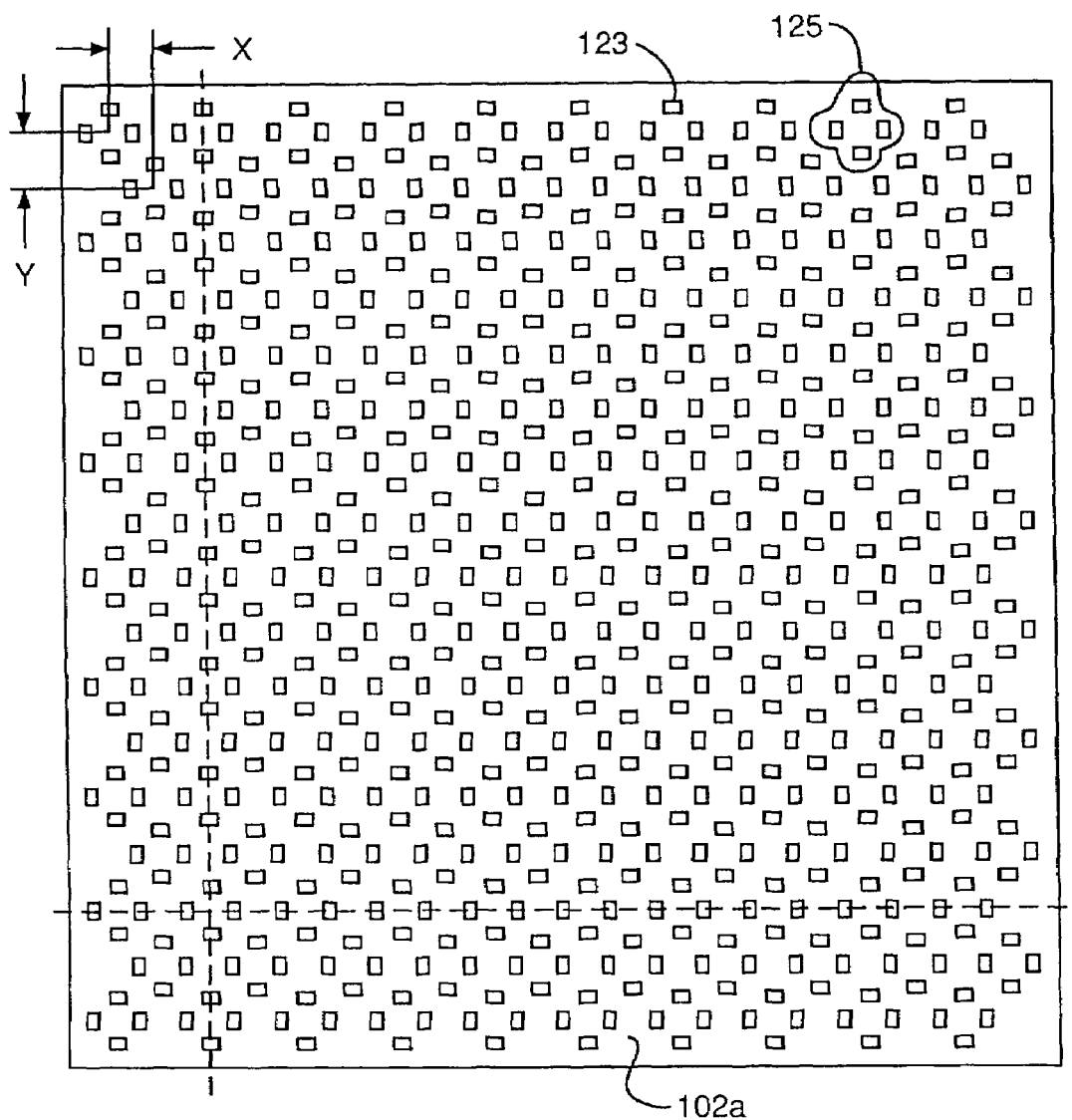
FIG. 44 is a partial bottom view of a prefabricated semiconductor die carrier in accordance with the present invention having a nested configuration of downwardly-extending leads.

FIG. 44 is a partial bottom view showing a nested arrangement for the downwardly-extending leads 123, with the leads being arranged into a plurality of groups 125. In the nested arrangement of FIG. 44, the groups 125 are arranged in rows and columns on the floor 102a (the dotted lines in FIG. 44 designate a row and a column, respectively); the electrical interconnect components of adjacent rows of the arrangement are staggered as are the groups from adjacent columns of the arrangement; and the groups are interleaved among one another in a nested configuration such that a portion of each group of contacts overlaps into an adjacent row of the groups of contacts or an adjacent column of the groups of contacts. For the arrangement of FIG. 44, a center-line to center-line distance X between columns of groups may be 0.9 mm; a center-line to center-line distance Y between rows of groups of contacts may be 1.25 mm; and the overall density of the arrangement may be 1,028 contacts per square inch.

Figure 45:
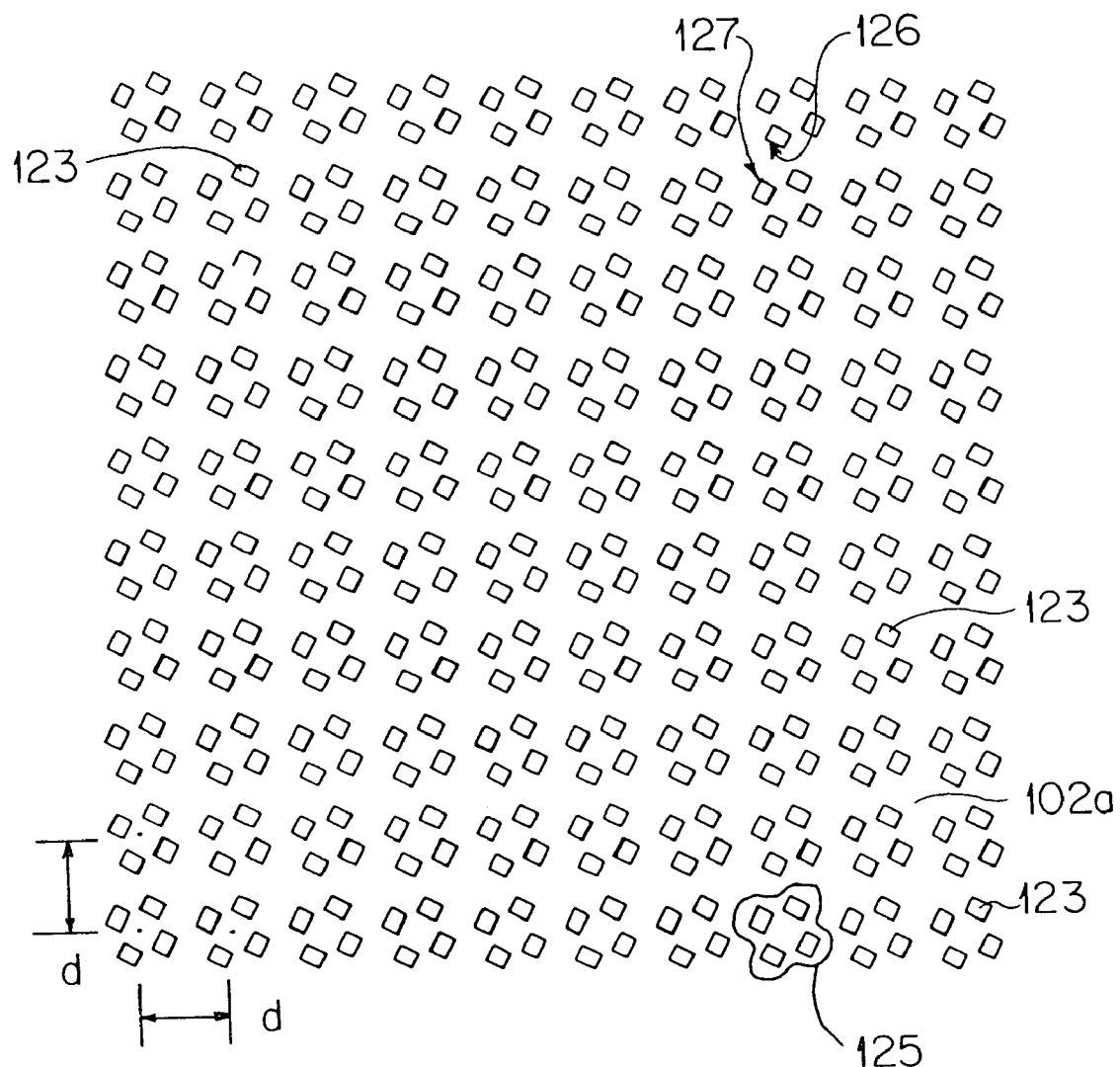
FIG. 45 is a partial bottom view of a prefabricated semiconductor die carrier in accordance with the present invention having a modified arrangement of downwardly-extending leads.

The nested configuration in FIG. 44 can be modified to provide even greater densities. An example of one contemplated modification is depicted in FIG. 45. In the arrangement of FIG. 45, the groups of contacts 125 are arranged in rows and columns on the floor surface 102a; and at least lead 123 of each group 125 includes a front surface 126 facing outwardly and away from that group along a line initially intersected by a side surface 127 of a lead from another group of contacts. Also, in the arrangement of FIG. 45, adjacent groups of contacts are offset such that a line drawn from the center of a group through the center of a contact for that group does not intersect the center of any of the groups directly adjacent that group. Moreover, in the arrangement of FIG. 45, the distance d between like surfaces of the leads 123 may be 1.5 mm; and the overall density for the arrangement may be 1,156 contacts per square inch.

Figure 47A:
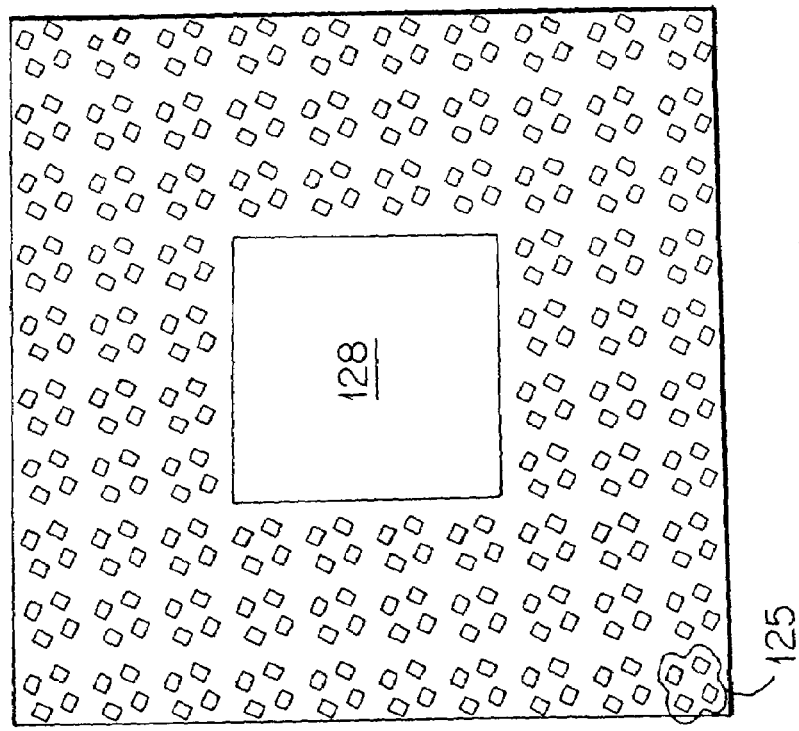
FIG. 47(a) is a partial bottom view of a prefabricated semiconductor die carrier in accordance with the present invention having a modified arrangement of downwardly-extending leads.
Figure 46:
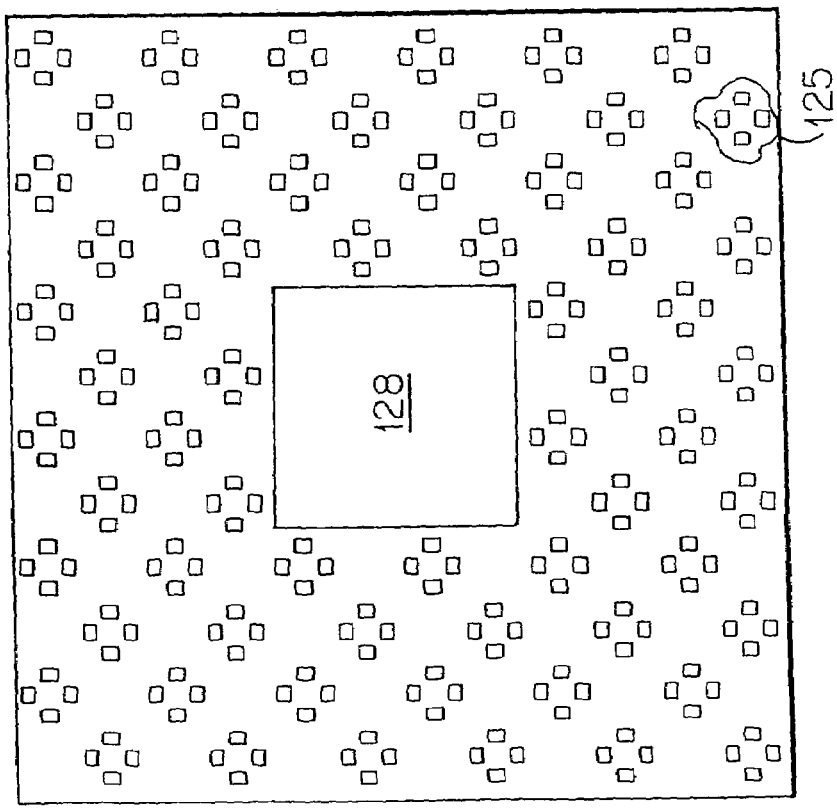
FIG. 46 is a partial bottom view of a prefabricated semiconductor die carrier in accordance with the present invention having a nested arrangement of downwardly-extending leads.
Figure 47B:
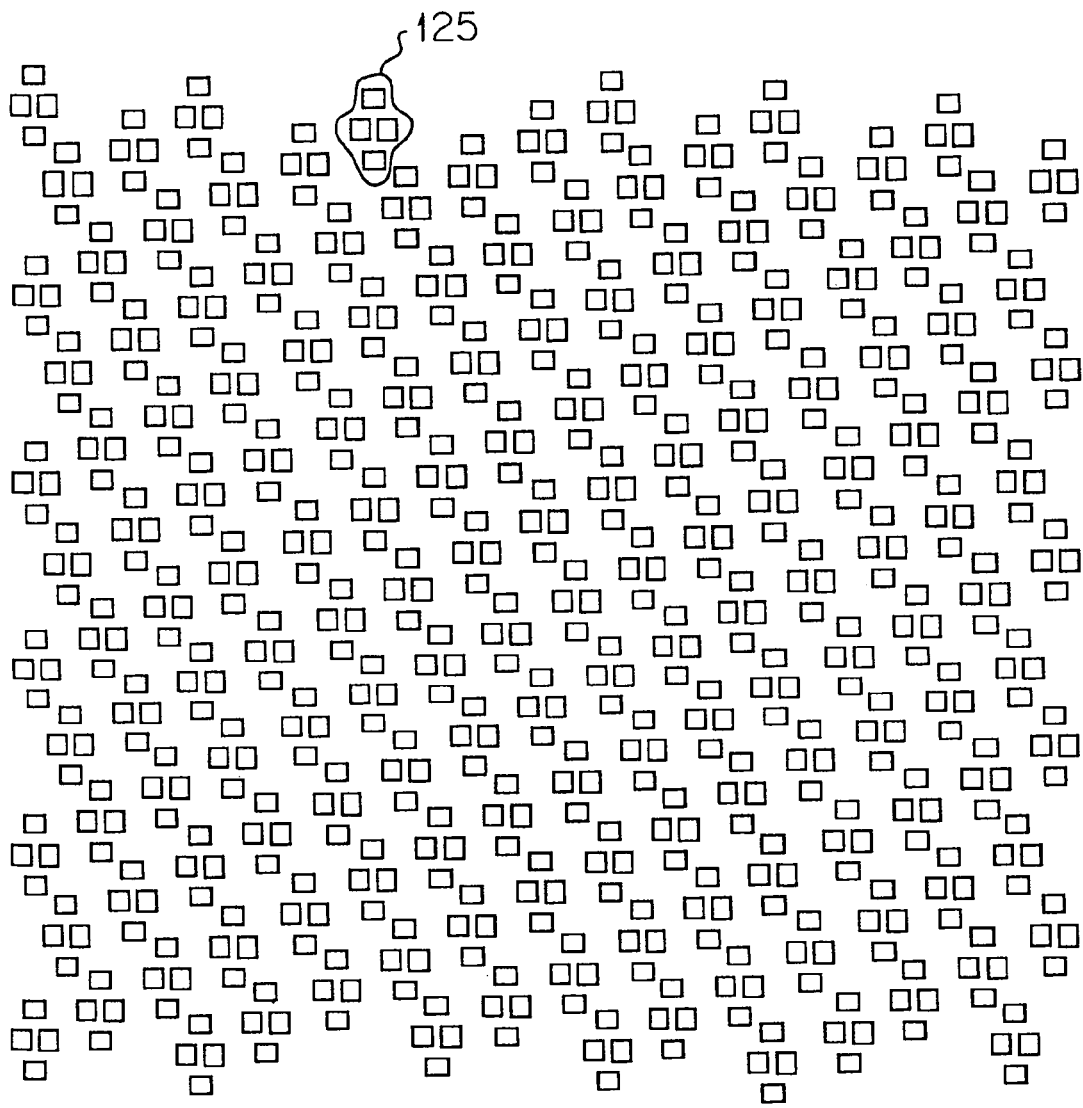
FIG. 47(b) is a partial bottom view of a prefabricated semiconductor die carrier in accordance with the present invention including an arrangement of downwardly-extending leads arranged in groups having H-shaped spaces incorporated therein.

The arrangements of FIGS. 44 and 45 may be modified to include a space 128 at a center portion thereof to allow the use of wire bonding, TAB, and the like. FIGS. 46 and 47(a), respectively, are examples of the manner in which the arrangements of FIGS. 44 and 45 can be modified to include a space 128.

It should be noted that while the arrangements of FIGS. 44–47(a) use cross-shaped groups of contacts 125, other shapes are contemplated. An array of groups of contacts 125 each having an H-shaped space between its contacts may be used, for example, as seen from FIG. 47(b). The array of FIG. 47(b) may provide a density of 636 contacts per square inch, for example.

Reference is made at this time to corresponding U.S. patent application Ser. No. 07/983,083 to Stanford W. Crane, Jr., filed on Dec. 1, 1992, entitled "HIGH-DENSITY ELECTRICAL INTERCONNECT SYSTEM"; corresponding U.S. patent application to Stanford W. Crane, Jr., filed on even date herewith, entitled "HIGH-DENSITY ELECTRICAL INTERCONNECT SYSTEM"; and corresponding U.S. patent application to Stanford W. Crane, Jr., et al., filed on even date herewith, entitled "SEMICONDUCTOR CHIP CARRIER AFFORDING A HIGH-DENSITY EXTERNAL INTERFACE." These applications disclose arrangements and other aspects relating to the groups of downwardly-extending contacts used by the present invention, and such applications are expressly incorporated herein by reference.

Figure 48:
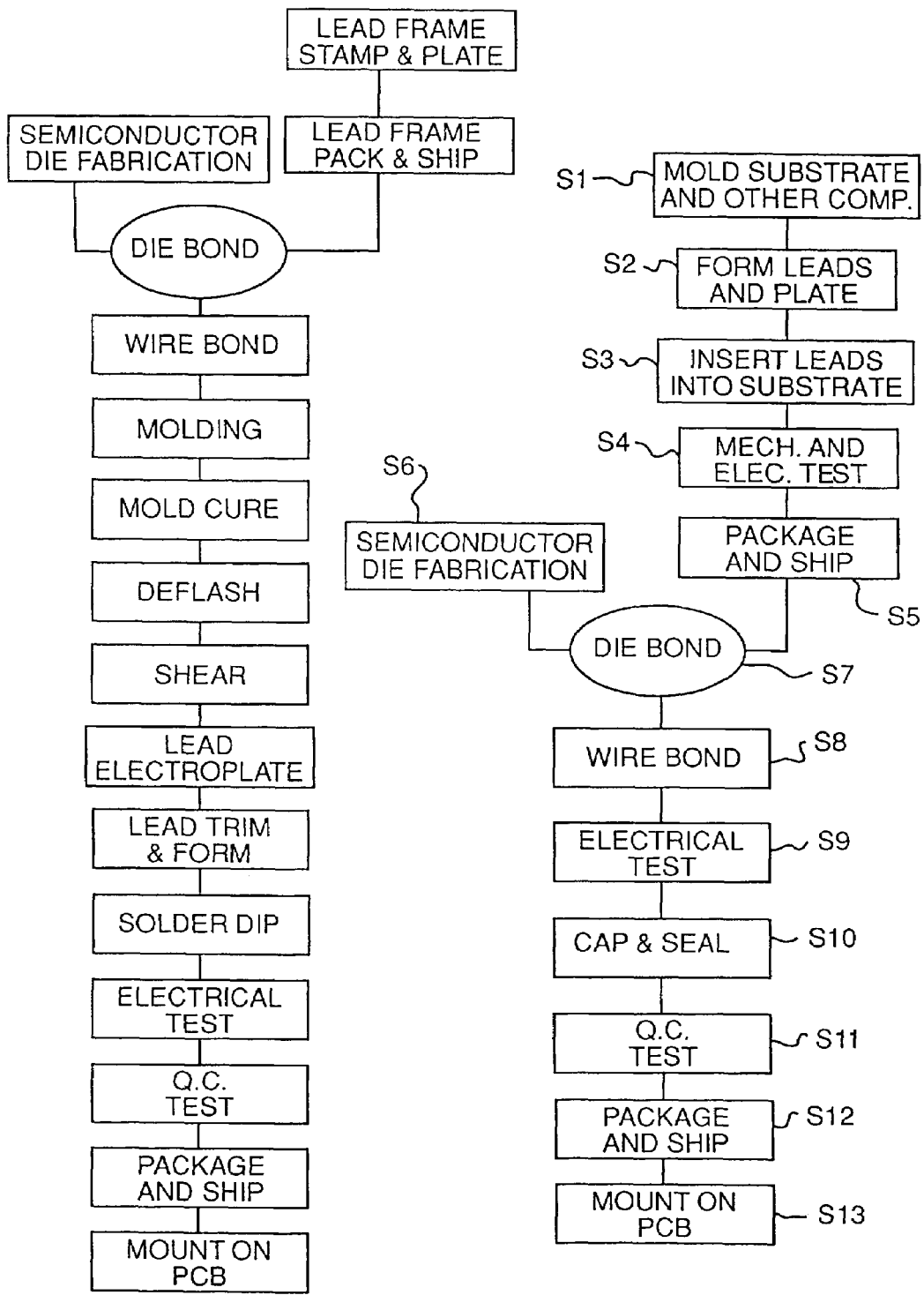
FIG. 48 depicts a pair of flowcharts comparing a conventional manufacturing method with a method in accordance with the present invention performed in order to manufacture, transport, and mount a prefabricated semiconductor die carrier.

FIG. 48 includes two flowcharts. The flowchart at the left illustrates steps performed in the manufacturing of a conventional molded plastic semiconductor package. The flowchart at the right illustrates steps performed in a manufacturing process for producing a prefabricated semiconductor carrier in accordance with the present invention. As can be seen from FIG. 48, the present invention entails fewer steps following the die bond procedure as compared to conventional manufacturing processes.

In accordance with the present invention as depicted in the rightward flowchart of FIG. 48, in a step S1, the substrate 102, including the floor 102a and side walls 102b and, if desired, lead passages 107 and ledges 108, are integrally formed using a molding process. As an alternative to forming the lead passages 107 and ledges 108 during the molding process, the lead passages and/or ledges could be added after molding by, for example, removing material of the substrate to form the passages and/or by applying insulative material (using an adhesive or epoxy, for example) to form the ledges. Components such as raised platform 115, insulating separator 116, and/or support columns 117 could also be formed either integrally during the molding process, or such elements could be added after molding. Moreover, as seen from FIG. 7, it is envisioned that rather than being formed integrally in a single molding process, the floor 102a and side walls 102b could be molded separately, and then fastened together using an epoxy or other adhesive. The use of VECTRA (trademark) as the material for the substrate allows the parts of the semiconductor die carrier to be molded and assembled with a high degree of accuracy. As an alternative to forming the substrate 102 and then inserting the leads into the substrate, the substrate could be formed around the leads in an insert molding process.

In a step S2, the leads 103 are formed. The lead formation step S2 entails punching or stamping out individual leads from strips or drawn wire using, for example, a die. Applicants have found that by individually manufacturing each lead 103, rather than using a lead frame to manufacture such leads, manufacturing costs are reduced and, at the same time, yield is increased.

The aforementioned lead-manufacturing methods allow for selective plating and automated insertion. The leads for stamping can either be loose, on a bandolier carrier 129 (see, for example, FIG. 49), or on a strip since the asymmetrical shape lends itself to consistent orientation in automated assembly equipment. The different length external lead sections assist with orientation and vibratory bowl feeding during automated assembly. The present invention is compatible with both stitching and gang-insertion assembly equipment. The insulative components have been designed to facilitate automatic and robotic insertion onto PCBs or in termination of wire to connector.

Figure 49:
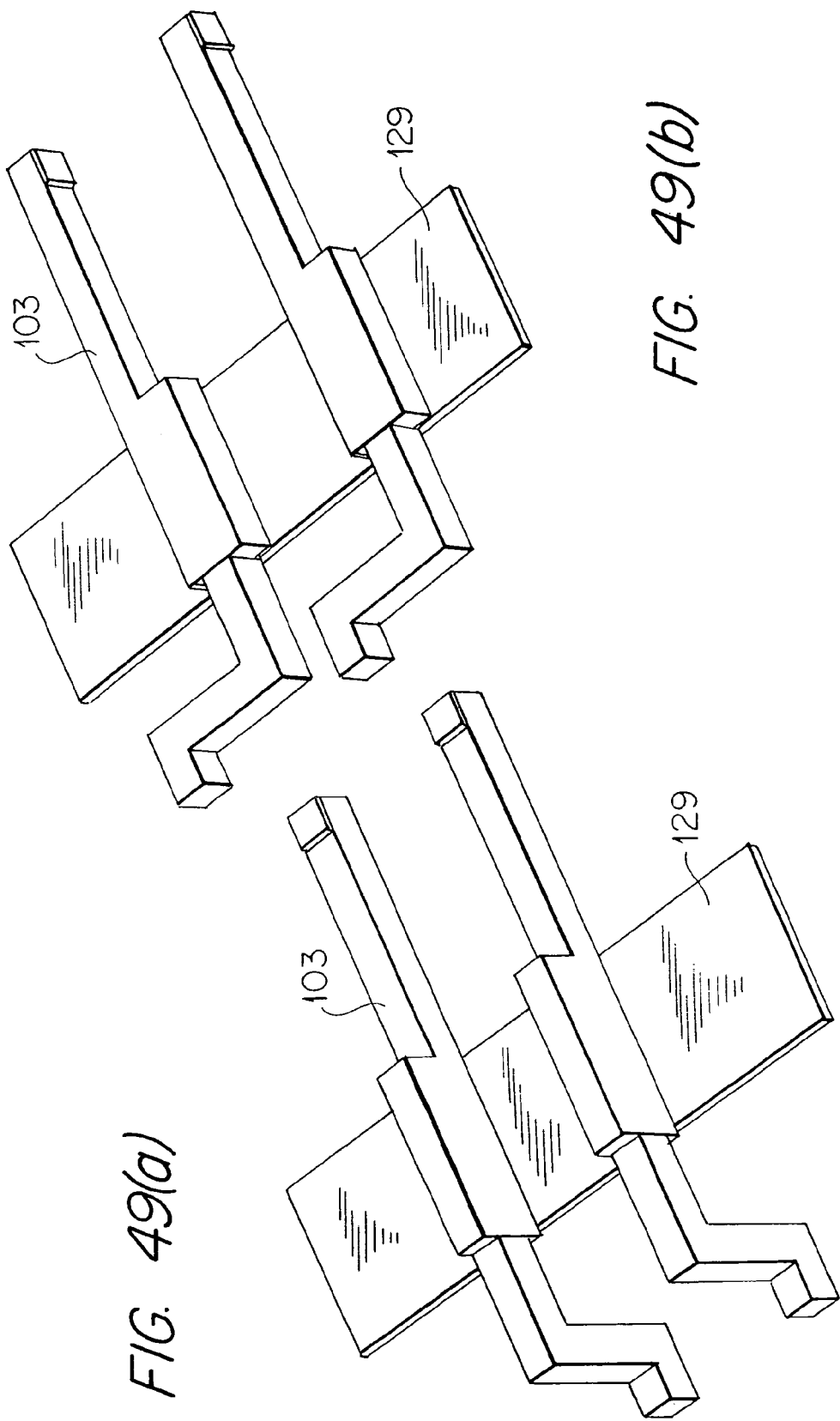
FIG. 49(a) is a perspective view of leads in an upright position on a bandolier during a manufacturing process in accordance with the present invention.
FIG. 49(b) is a perspective view of leads positioned sideways on a bandolier during a manufacturing process in accordance with the present invention.

FIGS. 49(a) and 49(b), collectively referred to herein as "FIG. 49," show the placement of the leads 103 on a bandolier or other fixture 129 during formation of the semiconductor die carrier. The leads may be stamped in an L-shaped version as depicted, or stamped in a straight version and then bent to achieve the L-shaped configuration. In other words, the use of a bandolier, in accordance with the present invention, is applicable to the formation of both straight and L-shaped versions of the leads 103.

Step S3 of FIG. 48 involves inserting the leads 103 into the side walls 102b of the substrate 102. In the situation where the floor 102a and the side walls 102b are formed separately and then fastened together at a later time, the leads may be inserted into the side walls before they are fastened to one another or to the floor. Each of the leads 103 is inserted into a corresponding one of the lead passages 107 in the side walls 102b. The dimensions of the leads 103 and lead passages 107 are such that each lead fits tightly within it corresponding lead passage 107. However, if desired, each lead 103 can be further fastened within its corresponding lead passage 107 and/or onto a corresponding ledge 108 using an epoxy or other adhesive material.

It should be kept in mind that rather than forming the substrate and then inserting the leads into the side walls of the substrate, placement of the leads 103 with the side walls 102b of the substrate may be accomplished using an insert molding process. Insert molding is applicable to all embodiments of the present invention.

In step S4, mechanical testing is performed to ensure that the leads 103 are securely fastened within the substrate 102; to ensure that coplanarity of the leads 103 falls within an acceptable range; to ensure that each lead is aligned properly within its respective lead passage; and the like. Also, electrical testing is performed to ensure that signals can be transmitted properly through the leads of the carrier to the exterior of the carrier, and vice versa; and to ensure that none of the leads are shorted or would be likely to short during subsequent stages of the manufacture and usage of the semiconductor die carrier.

In accordance with step S5, the substrate 102 having leads 103 disposed therein is packaged and then shipped to the place where a semiconductor die, manufactured in step S6, will be bonded to the substrate. Preferably, transportation packaging such as that illustrated in FIGS. 50–55 is used to accomplish shipping. The packaging illustrated in FIGS. 50–55 can be used to transport the semiconductor die carrier to the location at which die bonding will occur, and from that location to the customer following the die bonding.

Figure 50:
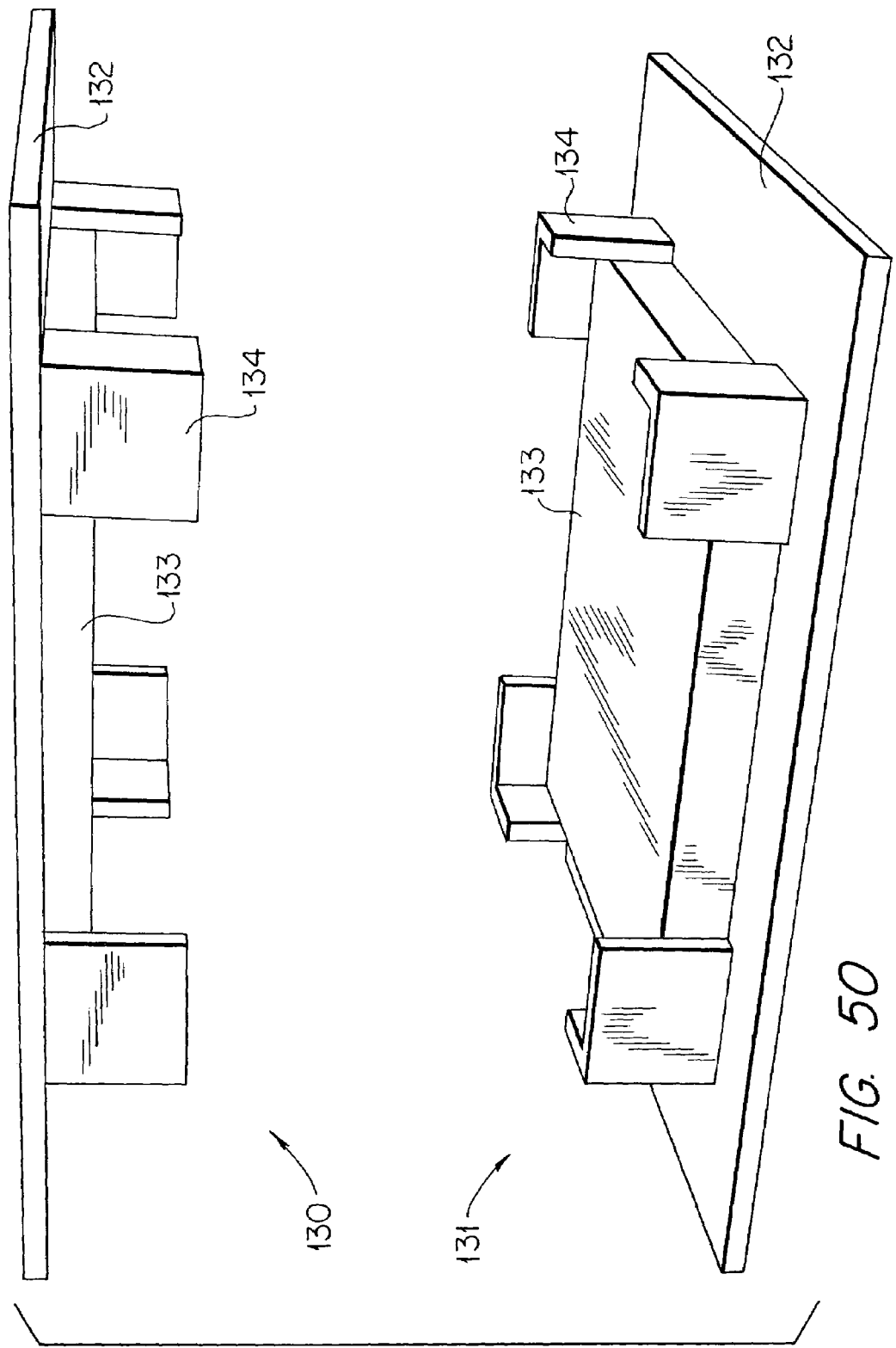
FIG. 50 is a perspective view of a first type of transportation packaging in accordance with the present invention.

A first type of transportation packaging is shown in FIG. 50. The type of packaging shown in FIG. 50 will be referred to herein as a carrier tray. The carrier tray includes an upper section 130 and a lower section 131. Each of these sections comprises a base 132 upon which are formed one or more (e.g., twenty) support platforms 133 each having a set of corresponding support segments 134 associated therewith.

Figure 51:
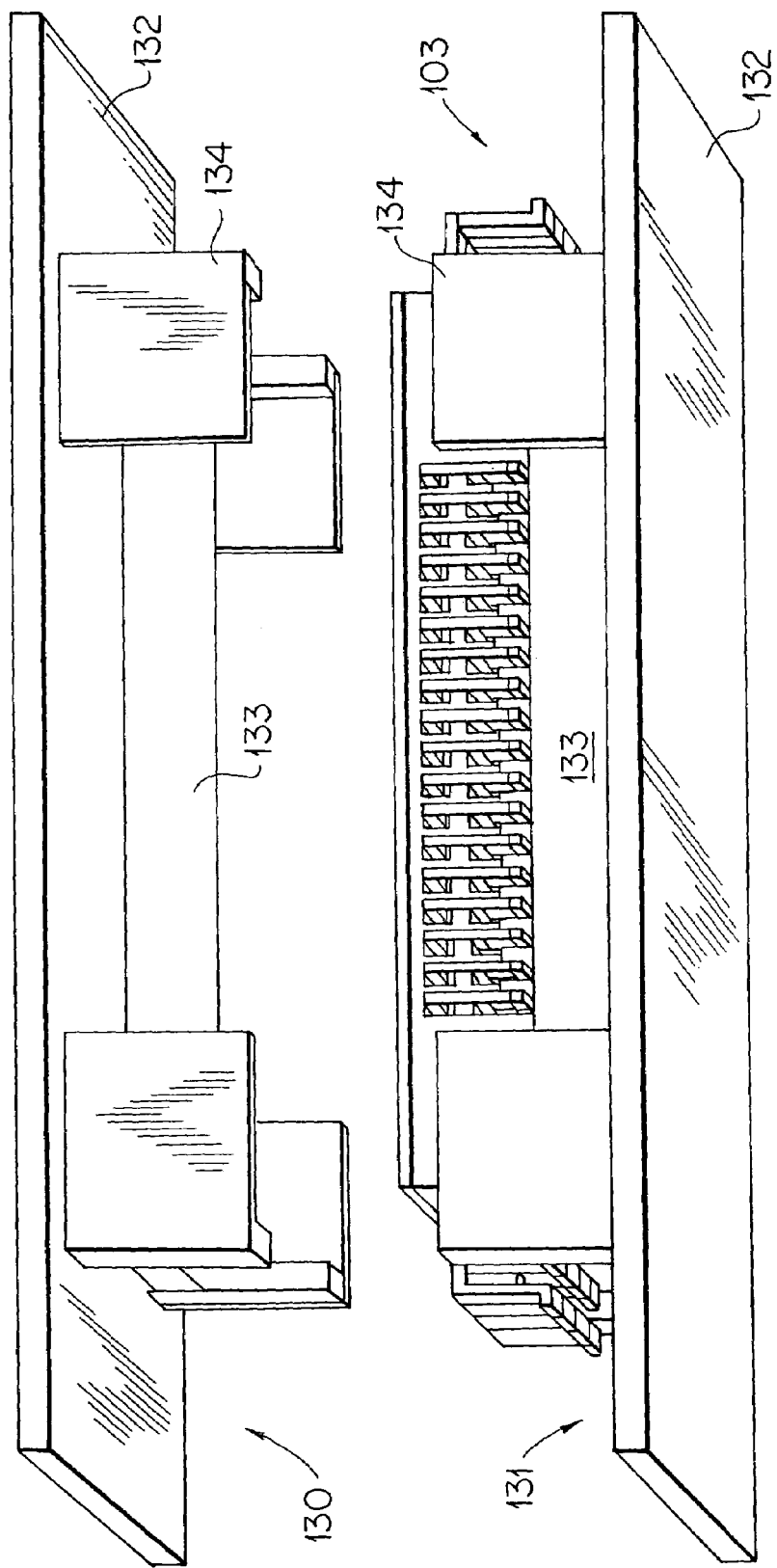
FIG. 51 is a perspective view of the first type of packaging shown in FIG. 50 with a semiconductor die carrier residing therein.
Figure 52:
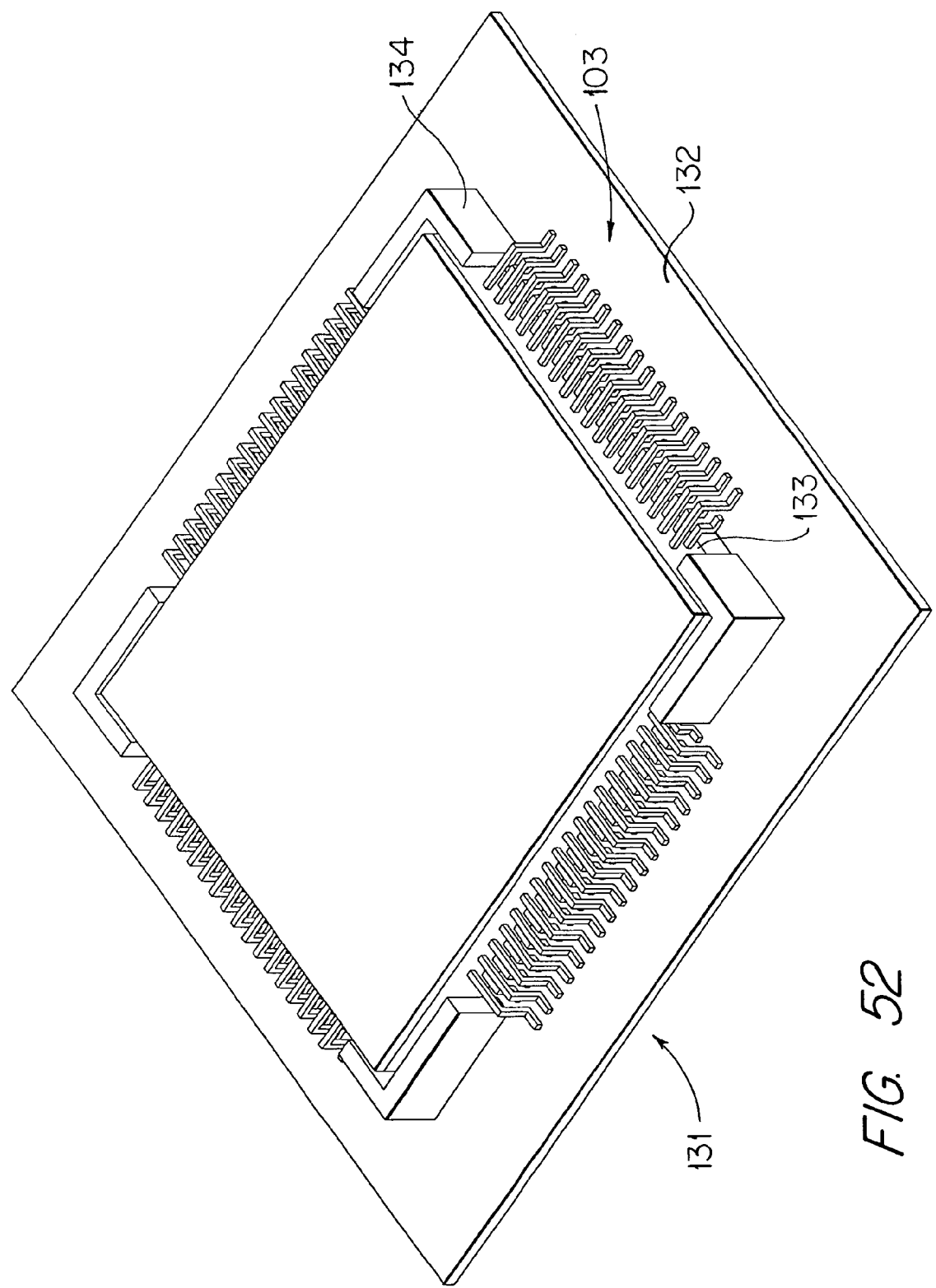
FIG. 52 is a partial perspective view of the first type of packaging shown in FIG. 50 with a semiconductor die carrier residing therein.
Figure 53:
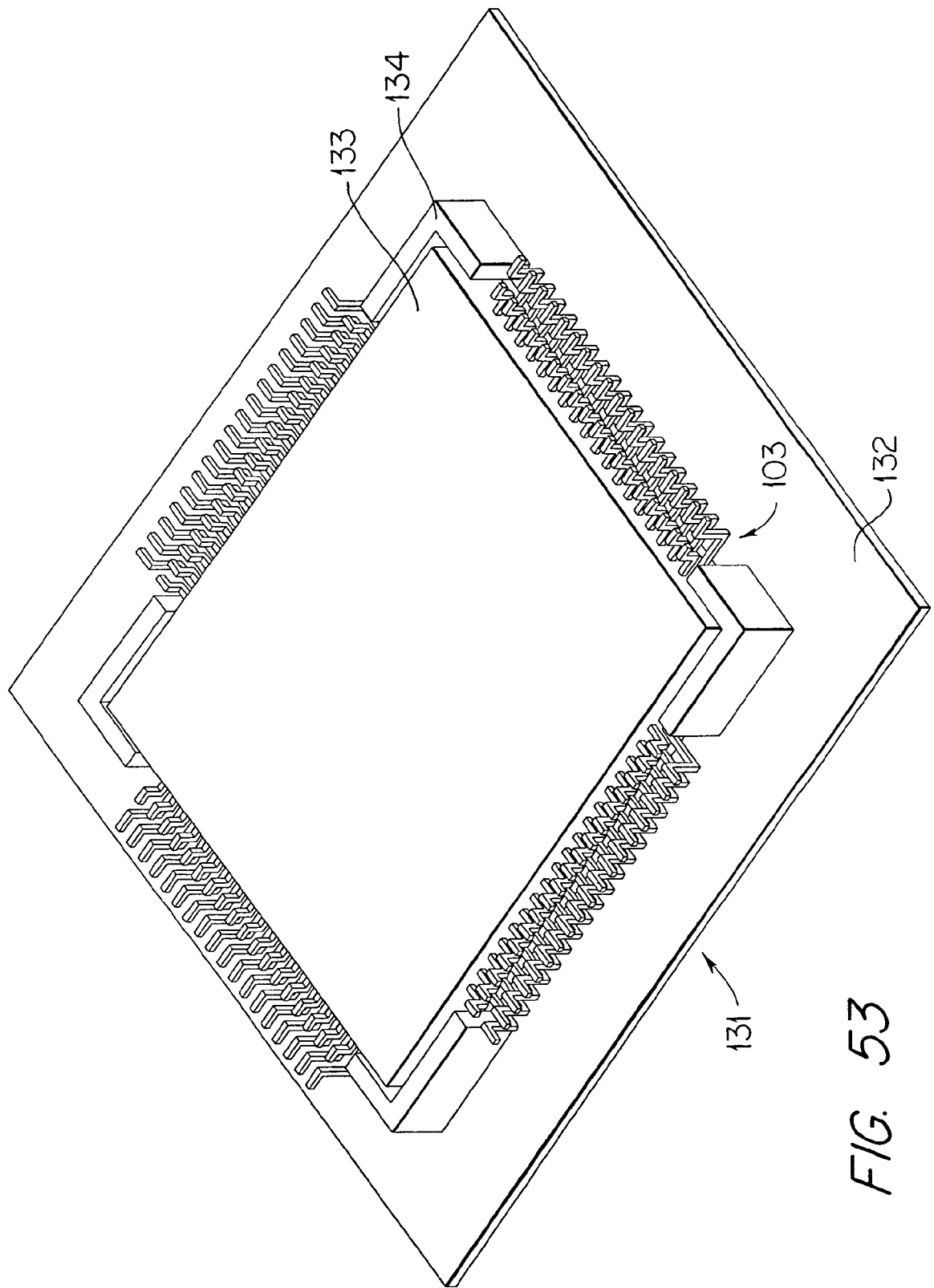
FIG. 53 is a partial perspective view of the first type of packaging shown in FIG. 50 with another semiconductor die carrier residing therein.

FIGS. 51–53 are views showing a semiconductor die carrier positioned within a carrier tray such as that depicted in FIG. 50. The semiconductor die carrier of FIGS. 51 and 52 has leads 103 which point downward, while the leads from the semiconductor die carrier in FIG. 53 point upward.

As seen from FIGS. 51–53, the support platform 133 performs the function of ensuring that the leads 103 of the semiconductor die carrier do not touch the base 132. Such prevention reduces the occurrences of breakage and other potential complications.

The support segments of the upper section 130 are positioned slightly closer to one another than are the support segments of the lower section 131, or vice-versa, so that the upper and lower sections may be mated or plugged together prior to shipping for protection of the semiconductor die carrier. As seen from FIGS. 51–53, the lower section 131 of the die carrier tray may hold the semiconductor die carrier with a main surface of the die carrier facing upward, so that when the upper section 130 is removed at a destination location, such as the die assembly location, the die carrier can be removed (via suction, for example) to allow die assembly, automatic mating or plugging, and the like. It should be noted that the carrier tray is stable to an extent that die assembly or other processes could be performed on the semiconductor die carrier while it is residing in the carrier tray. This would eliminate the steps of removing and returning the semiconductor die carrier to the carrier tray during the manufacturing process.

Figure 54A:
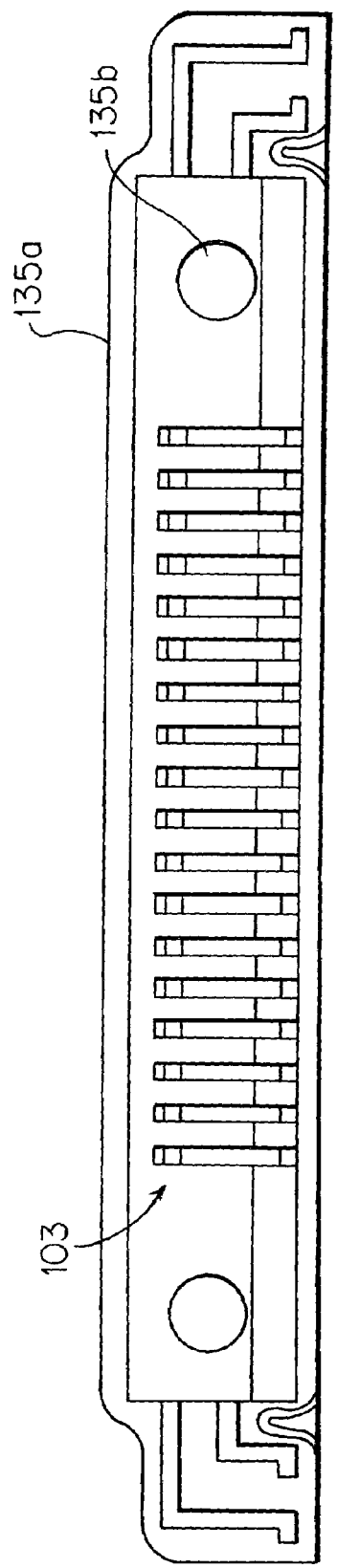
FIG. 54(a) is a side view of a second type of transportation packaging in accordance with the present invention.

A second type of transportation packaging is shown in FIG. 54(a). The type of packaging shown in FIG. 54(a) is a plastic tube or sleeve 135a having an open end and a closed end. In using this type of packaging, a plurality of semiconductor die carriers are inserted through the open end in the plastic tube 135a in sequential fashion. The first semiconductor die carrier to be inserted rests against the closed end of the plastic tube 135a or a stop located adjacent the closed end, the second semiconductor die carrier to be inserted rests against the first, and so on. Each semiconductor die carrier may have a bar separator 135b molded or otherwise formed thereon. The bar separator keeps the leads from adjacent semiconductor die carriers from tangling or contacting each other when the carriers are packaged in the tube. When it is desired to remove the semiconductor die carriers to accomplish die assembly or the like, the die carriers are removed from the plastic tube in an order that is reversed with respect to the order of insertion into the plastic tube.

Figure 54B:
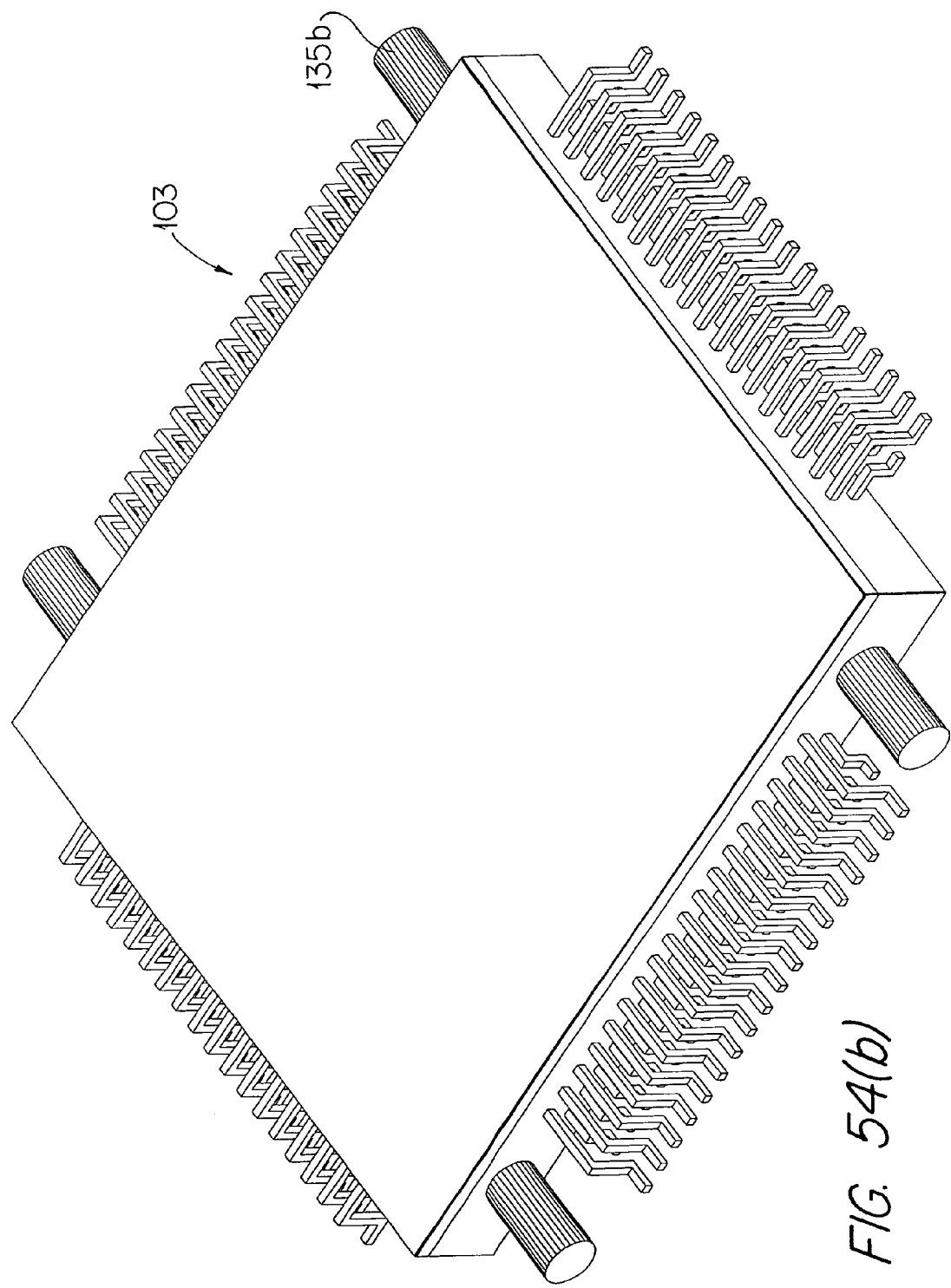
FIG. 54(b) is a perspective view of a semiconductor die carrier particularly well-suited for use with the type of transportation packaging illustrated in FIG. 54(a).

FIG. 54(b) shows a completed semiconductor die carrier having four bar separators 135b formed thereon. As an alternative to providing each semiconductor die carrier with four bar separators, each carrier may be provided with two bar separators (for example, two bar separators located on the same side wall of the carrier or two bar separators located on opposing side walls of the die carrier at opposing corners, such as the uppermost and lowermost bar separators illustrated in FIG. 54(b)) or some other number of bar separators.

Figure 55:
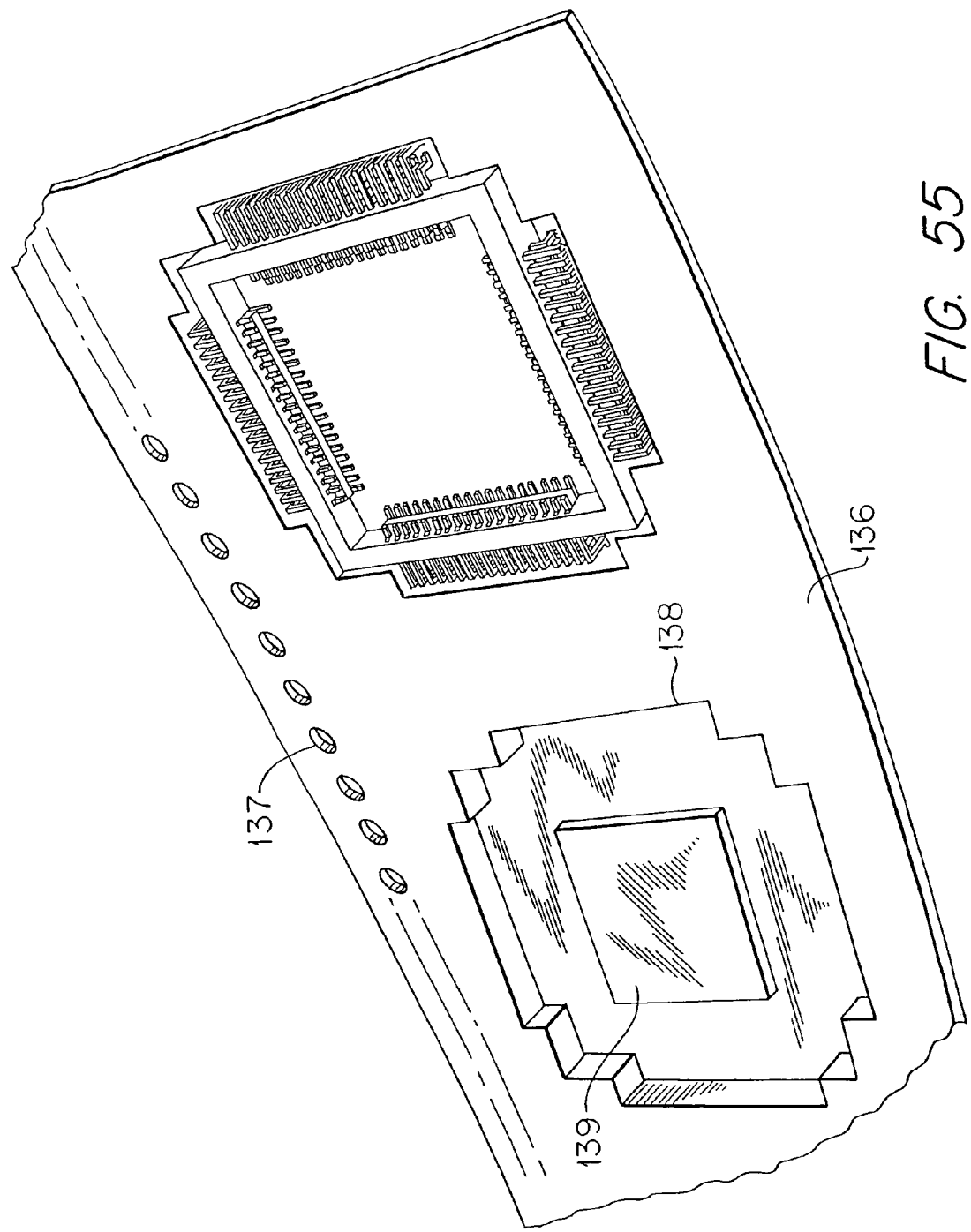
FIG. 55 is a perspective view of a third type of transportation packaging in accordance with the present invention.

A third type of transportation packaging is shown in FIG. 55. The type of packaging shown in FIG. 55 will be referred to herein as tape-and-reel packaging for a pick-and-place machine. In accordance with this type of packaging, a conductive plastic tape 136 has a plurality of sprockets 137 and a plurality of cavities 138 formed therein. Each cavity may include a support platform 139 to isolate the leads of each semiconductor die carrier from the bottom of the cavity. In use, a semiconductor die carrier is placed in each cavity 138 and then a tape structure (e.g., masking or cellophane tape) is adhered to the conductive tape 136 to hold the semiconductor die carriers within the cavities during shipping. The conductive tape 126 is then wound around a reel or other magazine for holding tape and then transported. At the transportation destination, a pick-and-place machine automatically feeds the reel using sprockets 137, peels off the tape structure, and removes the die carriers for die assembly, mounting, or the like, using a suction procedure. As with the first and second types of packaging discussed above, the third type of packaging is reusable so that the same package can be used to transport the semiconductor die carrier to the location at which die bonding will occur, and from that location to the customer following die bonding.

Step S7 of FIG. 48 involves attaching the semiconductor die 101 to floor 102a or another support surface (for example, a raised platform 115) within the semiconductor die carrier. The attachment may be carried out using an adhesive, an epoxy or the like.

Step S8 entails a bonding procedure wherein a bonding wire 106 is connected between components of a pair including a bonding pad 104 on the die 101 and a bonding terminal 105 on one of the leads 103. The bonding wires allow electrical connection between the die 101 and the various leads 103.

In step S9, further electrical tests may be performed to provide additional assurance that an acceptable product is being manufactured. In step S10, encapsulation is performed by filling the cavity defined by the floor 102a and the side walls 102b of the substrate 102 with epoxy, a liquid crystal polymer such as VECTRA (trademark), or other high-temperature material. Then the semiconductor die carrier may capped with a plastic component or thermally-conductive cap that may serve as a heat sink, and thereafter sealed, although use of a cap is optional. It should be noted that when a cap is used, the aforementioned encapsulation step becomes optional. The heat sink and/or high-temperature material which may be used for encapsulation and sealing facilitate the heat dissipation capabilities of the semiconductor die carrier. In step S11, further mechanical and electrical quality control testing may be performed to increase the likelihood that the semiconductor die carrier will function as expected.

In accordance with step S12, the completed semiconductor die carrier is packaged and shipped to the customer. Preferably, the semiconductor die carrier is packaged and shipped to the customer using the same transportation package it was received in. As indicated previously, the transportation packaging illustrated in FIGS. 50–55 is particularly well-suited for performing this type of double-transport function.

Step S13 relates to the mounting of the finished semiconductor die carrier on or within an interface surface such as a PCB surface. In step S13, either PTH technology or SMT methodology may be used to accomplish PCB interfacing or, alternatively, the carrier may be plugged into a pluggable socket mounted on a PCB or other interface device.

Figure 56:
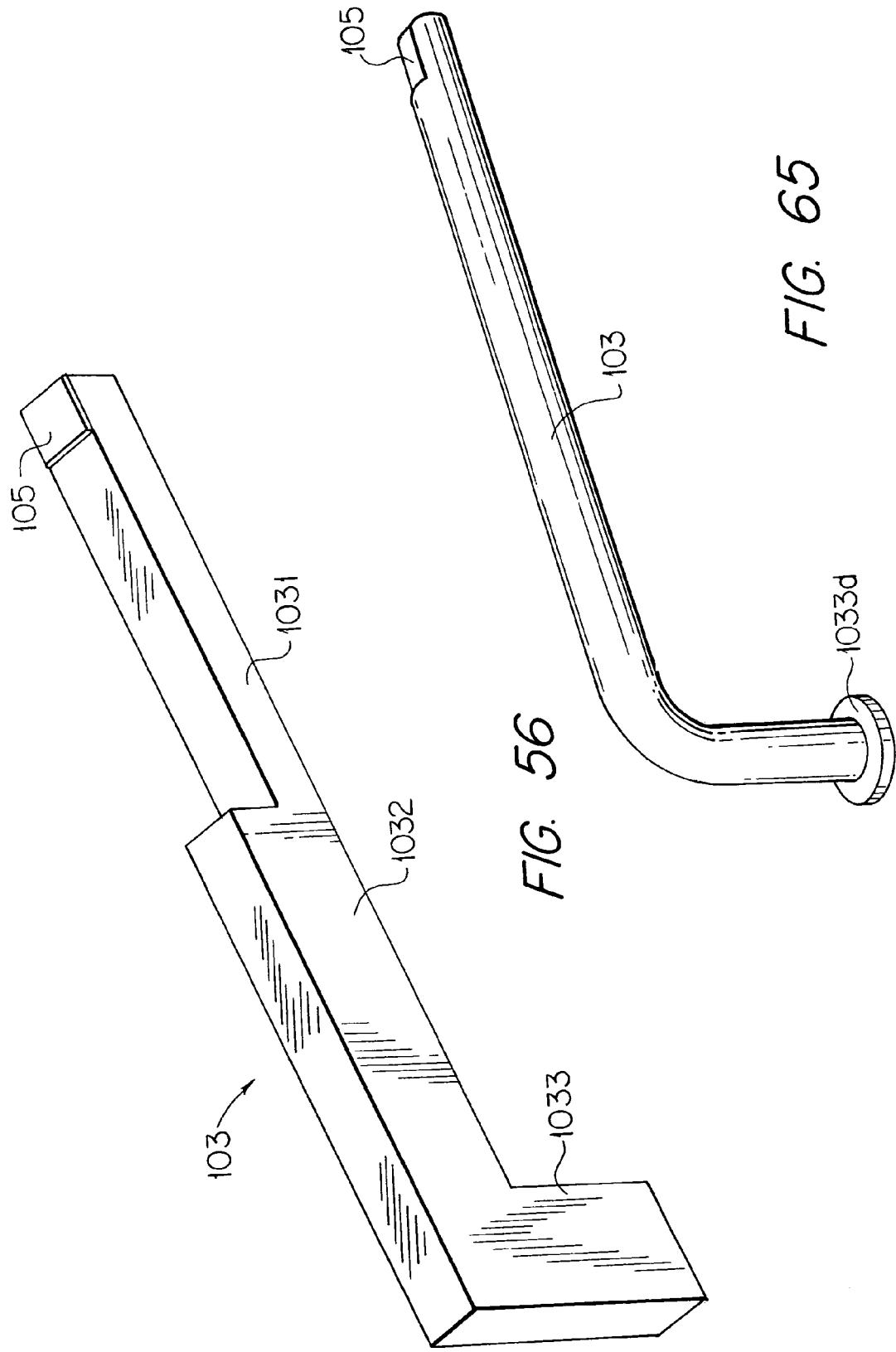
FIG. 56 is a perspective view of a pluggable lead configured in accordance with the present invention.

FIG. 56 shows a lead 103 particularly well-suited for plugging into a pluggable socket. By using an external lead section 1033 having an expanded width, additional mechanical strength is provided. Such mechanical strength facilitates plugging of the semiconductor die carrier into a pluggable socket.

Figure 57:
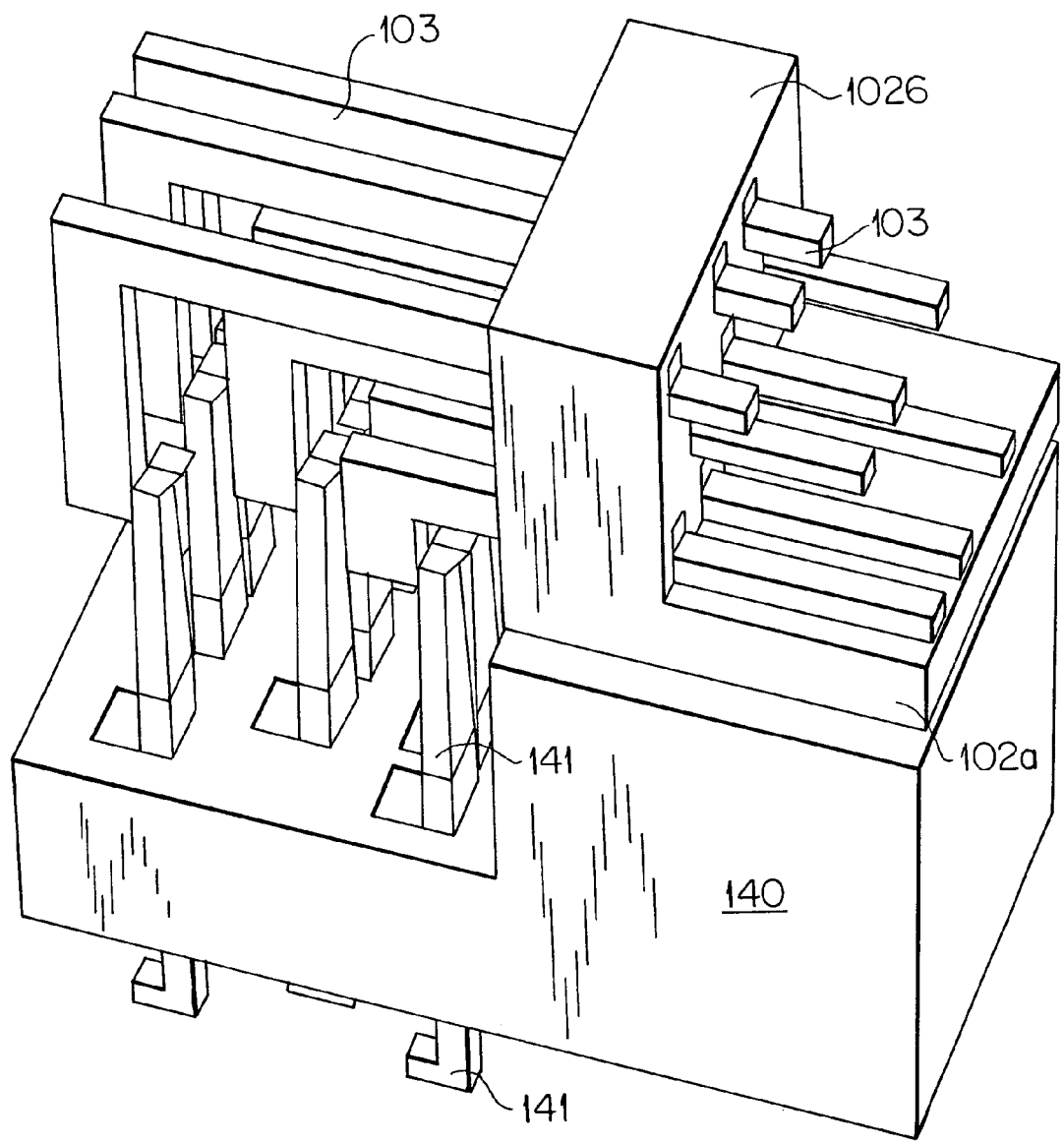
FIG. 57 is a partial perspective view of the semiconductor die carrier in accordance with the present invention plugged within a pluggable socket.

FIG. 57 shows a semiconductor die carrier in accordance with the present invention plugged into a pluggable socket. A pluggable socket in accordance with the present invention includes an insulative substrate 140 and a plurality of electrically conductive beams 141.

Each of the conductive beams 141 contacts a corresponding lead 103 from the semiconductor die carrier at one end, and at the other end, is attached to a PCB or other interface surface. The beams 141 may be attached to the interface surface by using the SMT method, as shown in FIG. 57, or by using PTH technology. The footprint pattern of the conductive beams 141 on the interface surface may be identical to any of the lead footprints discussed above and, as shown in FIG. 57, for example, preferably matches the footprint corresponding to the leads of the semiconductor die carrier with which the socket is mating. Such matching between the footprint of the leads 103 and the footprint of the beams 141 simplifies routing and trace design by allowing the same conductive PCB pattern to accommodate both pluggable and SMT-compatible die carriers.

The portions of the beams 141 extending above the substrate 140 (also shown in FIGS. 58 and 59) each apply a force to a corresponding one of the leads 103 in a direction away from the interior of the semiconductor die carrier (i.e., to the left in the illustration of FIG. 57). This force is sufficient to hold the semiconductor die carrier in close proximity to the socket and, at the same time, allows selectable plugging and unplugging of the semiconductor die carrier. The portions of the beams 141 extending above the substrate 140 are flexible and springy such that, prior to mating with leads from a semiconductor die carrier, the leads bend in the direction away from the interior of the semiconductor die carrier (to the left in the illustration of FIG. 57), and after mating, are upright as depicted in FIG. 57.

Figure 58:
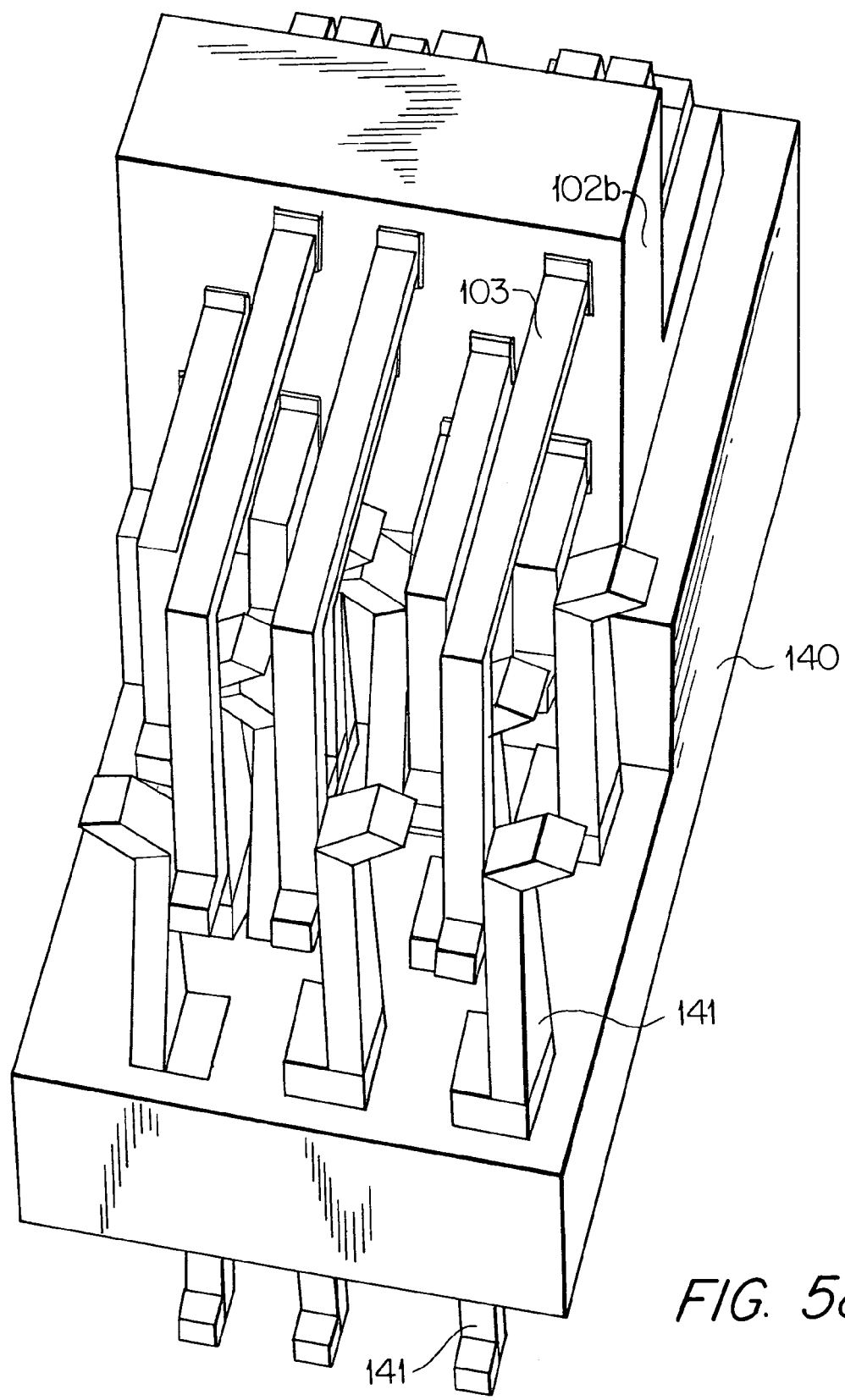
FIG. 58 is a partial perspective view of a semiconductor die carrier in accordance with the present invention plugged within another pluggable socket.
Figure 59:
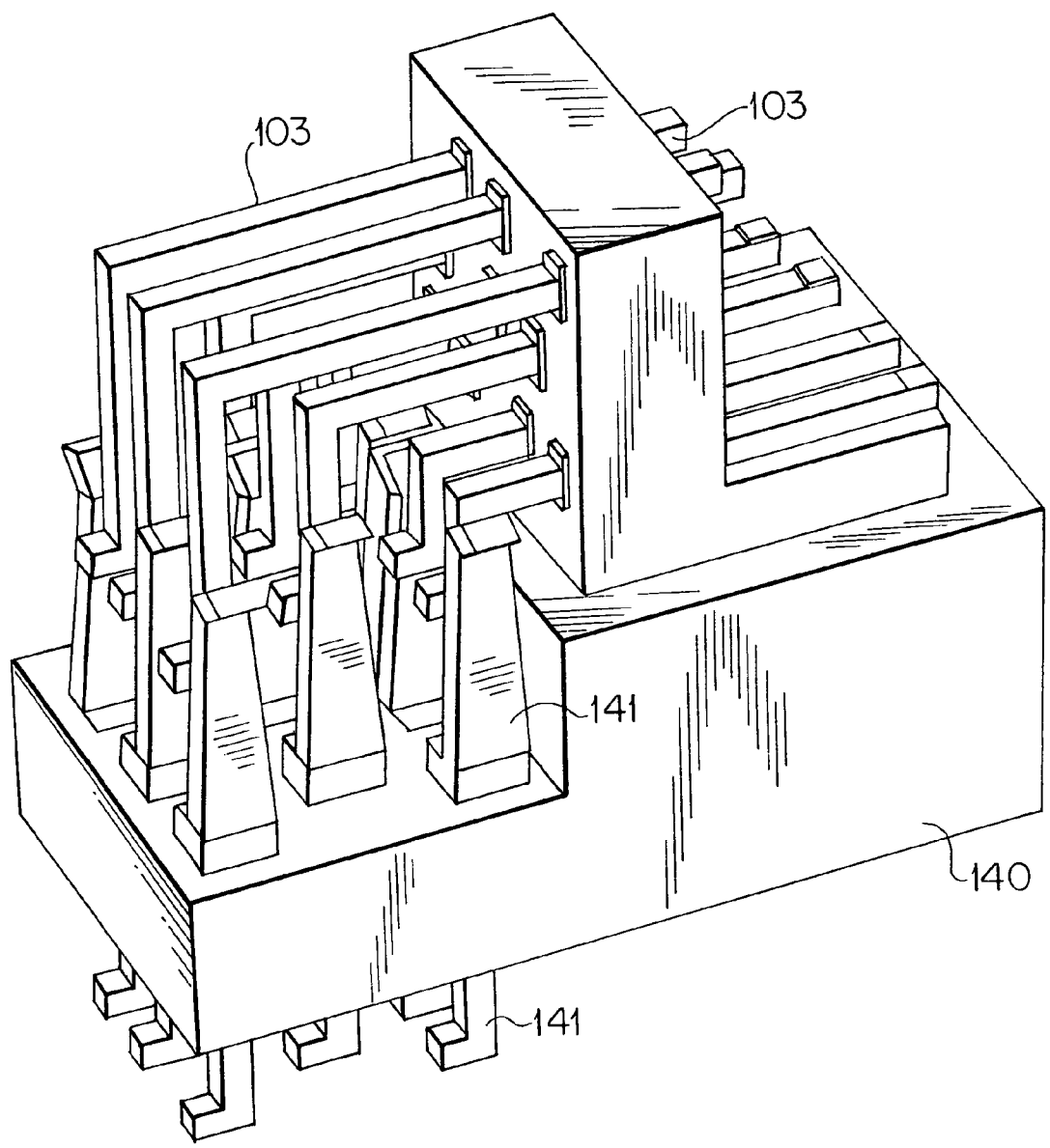
FIG. 59 is a partial perspective view of a semiconductor die carrier in accordance with the present invention plugged into the pluggable socket illustrated in FIG. 58.

FIGS. 58 and 59 are similar to FIG. 57 in that they represent partial perspective views of a semiconductor die carrier in accordance with the present invention mounted within a socket that is attached to a PCB or other interface device using the SMT methodology. However, the force applied by the beams 141 against the leads 103 in FIGS. 58 and 59 is in a direction that is perpendicular with respect to the lengths of the leads. This force, like the force associated with the socket of FIG. 57, is sufficient to hold the semiconductor die carrier in close proximity to the socket and, at the same time, allows plugging and unplugging of the semiconductor die carrier. For the socket of FIGS. 58 and 59, the portions of the beams 141 extending above the substrate 140 are flexible and springy such that, prior to mating with leads from a semiconductor die carrier, the leads bend in a direction perpendicular with respect to the lengths of the leads, and after mating, are upright as depicted in FIGS. 58 and 59.

The configurations of the footprints of the semiconductor die carrier (or of the pluggable socket, if one is used) facilitate the routing of traces on the PCB or other interface surface onto or within which the semiconductor die carrier is being mounted. Further mechanical and electrical testing can be performed after the mounting process is completed.

As compared to conventional methods, there are significantly fewer production steps involved in producing a semiconductor die carrier in accordance with the present invention. The semiconductor die carrier of the present invention begins as a pre-formed platform into which the die is inserted. Encapsulation is then accomplished by capping and sealing the platform after it has been tested. This results in the elimination of the entire molding, bending, and clean-up processes and the related bonding of the carrier. Because the leads of the present invention are pre-formed and inserted into the plastic platform, they are undisturbed by additional procedures conventionally performed after the die is introduced into the semiconductor package. In the conventional process, the most sensitive aspects of the manufacturing process, encapsulating the die and electroplating and forming the leads, are performed after the die and the semiconductor package have been mated. This results in comparatively costly scrap, which may be due to lack of coplanarity among the leads, breakage, wire bond failure due to high-pressure molding, or other problems. All of these problems result in sacrificing the die as well as the package. The semiconductor die carrier of the present invention, however, could be delivered to the die attach area completely tested for plating, mechanical integrity, and dimensional characteristics, and the die need only be inserted into packages meeting acceptable quality standards. The elimination of the intermediate processes also reduces labor costs.

The semiconductor die carrier of the present invention can be configured with a precise number of leads easier than current designs due to the programmable nature of its assembly. A designer can specify varied numbers of leads or changes in package size, without the need to design and manufacture new lead frame configurations. With the present invention, both the number of leads on a side of a package, and the number of rows of leads, can be varied simply by producing a new mold for the prefabricated platform and reprogramming the lead insertion equipment to vary the number of leads or lead configuration.

FIGS. 60–65 illustrate additional aspects relating to the semiconductor die carrier of the present invention.

Figure 60:
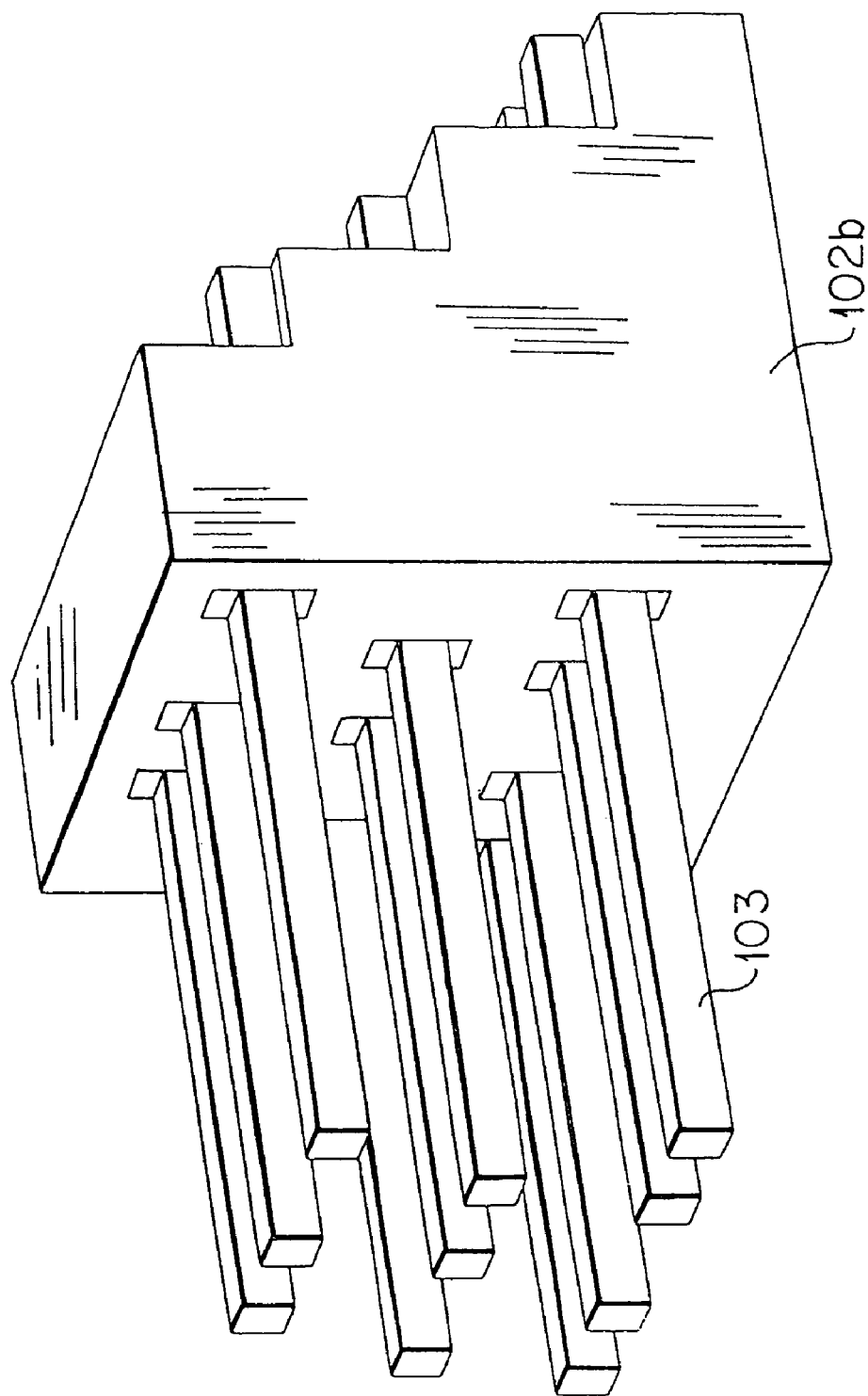
FIG. 60 is a partial perspective view of a semiconductor die carrier in accordance with the present invention having leads extending straight out of one or more sides of the carrier.

FIG. 60, for example, shows that the leads 103 may extend straight out from one or more of the side walls of the semiconductor die carrier without bending or turning in a vertical or downward direction. Such straight leads are compatible for plugging within a socket or, alternatively, can function as Butt Joint Leads for SMT-mounting to a substrate such as a PCB. For use with the structure of FIG. 60, for example, the PCB or other such substrate to which the leads of semiconductor die carrier are SMT-mounted would be perpendicular with respect to the floor of the carrier.

Figure 61:
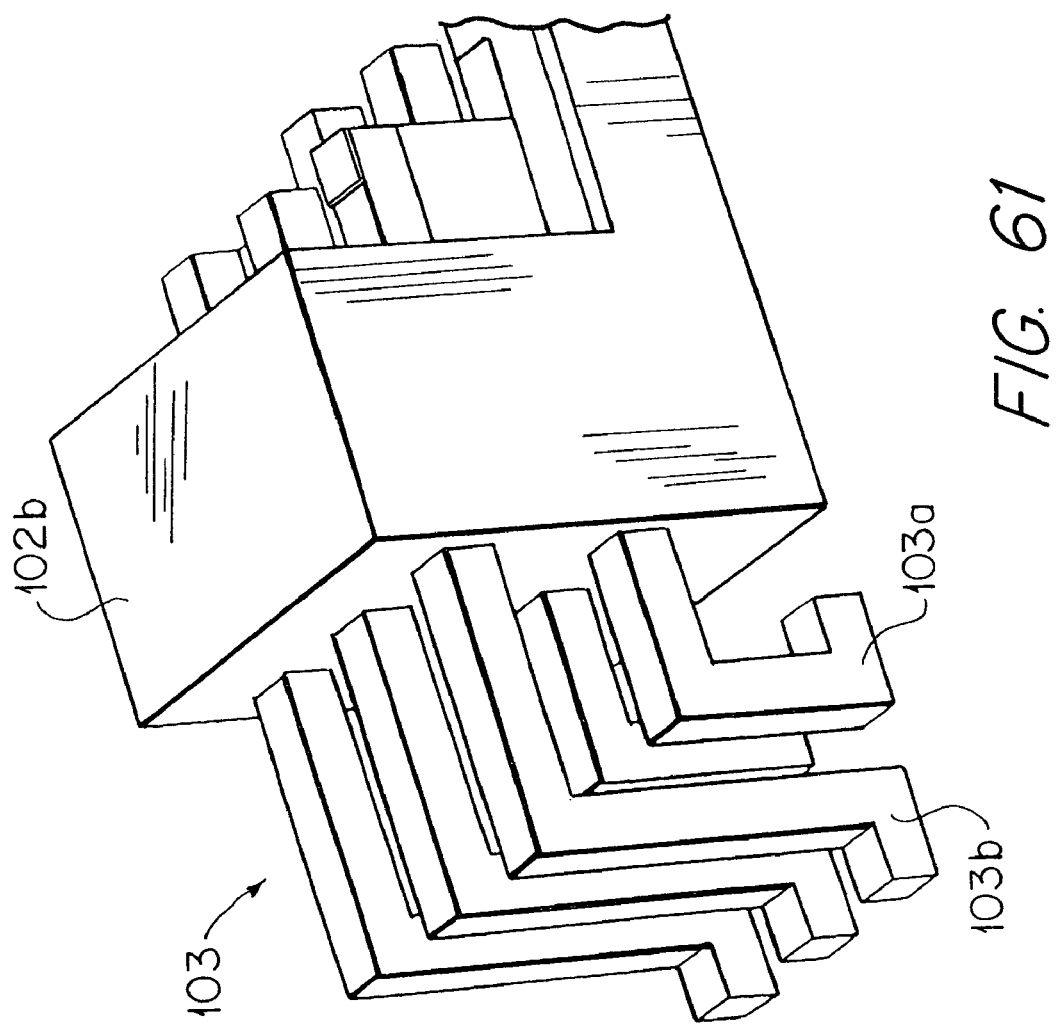
FIG. 61 is a partial perspective view of a semiconductor die carrier in accordance with the present invention including leads having an alternate foot configuration.

FIG. 61 is a partial perspective view of a semiconductor die carrier in accordance with the present invention having an alternate foot configuration. In FIG. 61, the feet of the leads 103 are orient d such that the feet in the lower row 103a point toward the semiconductor die carrier and the feet in the upper row 103b point away from the carrier. This type of configuration reduces the total surface area taken up on the substrate (for example, a PCB) to which the semiconductor die carrier is mounted. The concept of foot portions alternately facing toward and away from the semiconductor die carrier is applicable to all of the embodiments of the present invention utilizing two or more rows of leads.

Figure 62:
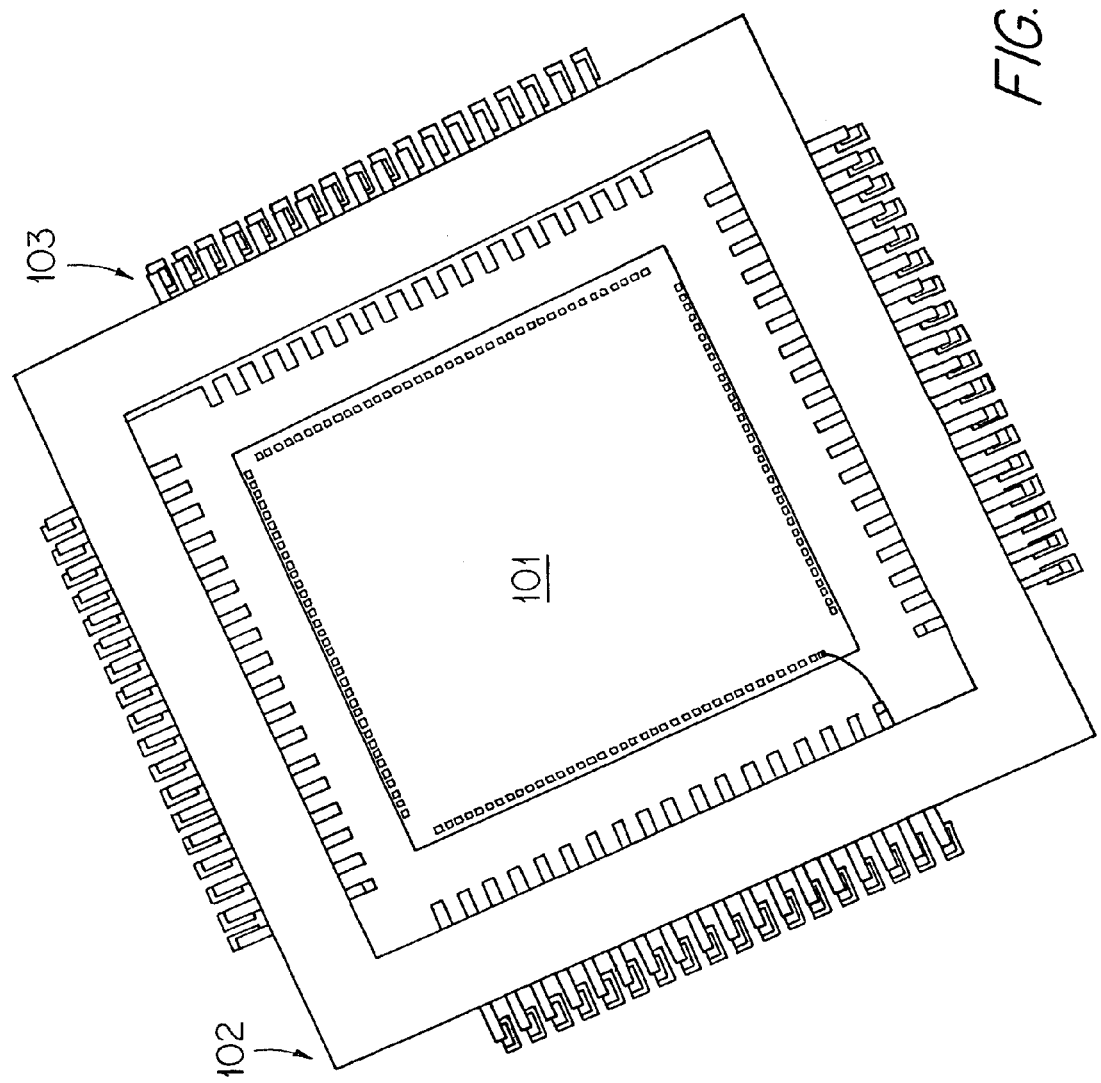
FIG. 62 is a top view of a single-tier embodiment of a semiconductor die carrier in accordance with the present invention.

FIG. 62 is a top view of a single-tier embodiment of a semiconductor die carrier in accordance with the present invention. As with the multi-tier embodiments of the present invention, the single-tier embodiment of FIG. 62 is formed using individually manufactured leads instead of leads from a lead frame.

Figure 63:
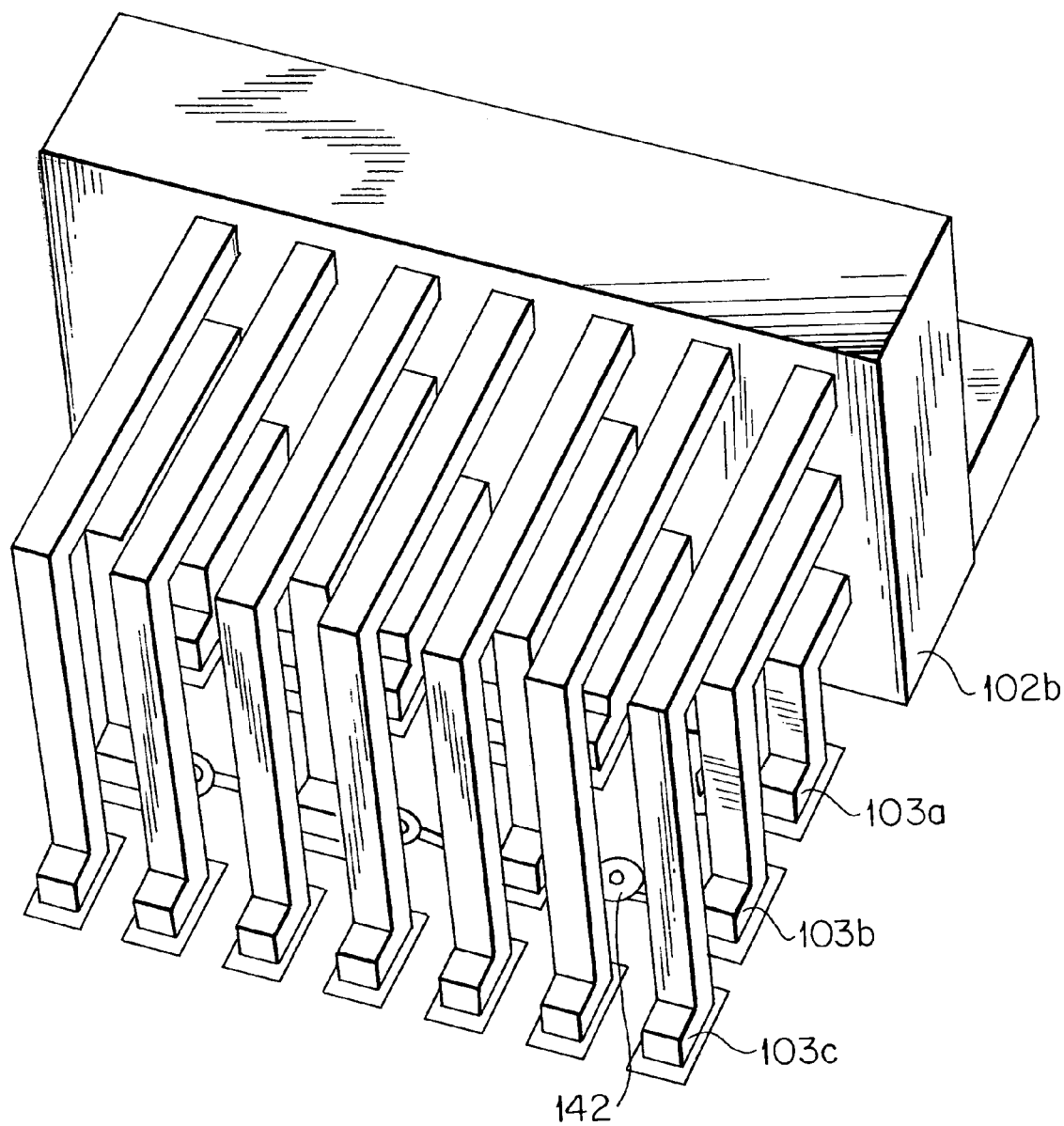
FIG. 63 is a partial perspective view of a semiconductor die carrier in accordance with the present invention wherein the leads of at least one row alternate with vias extending into a substrate such as a PCB.

FIG. 63 is a partial perspective view of a semiconductor die carrier in accordance withe the present invention with the leads of at least one row (e.g., leads 103b of the middle row) alternating with vias 142 extending into the substrate to which the semiconductor die carrier is mounted. In other words, every lead 103b in the middle row of the configuration has a via located on either side of it. Each via may be routed to one or more of the adjacent leads from its row and/or from other ones of the rows of leads. Rather than being staggered, the leads (and also the vias) in FIG. 63 are aligned in a straight line with respect to one another. The arrangement of FIG. 63 increases the number of leads that can be located along the sid of the semiconductor die carrier.

Figure 64:
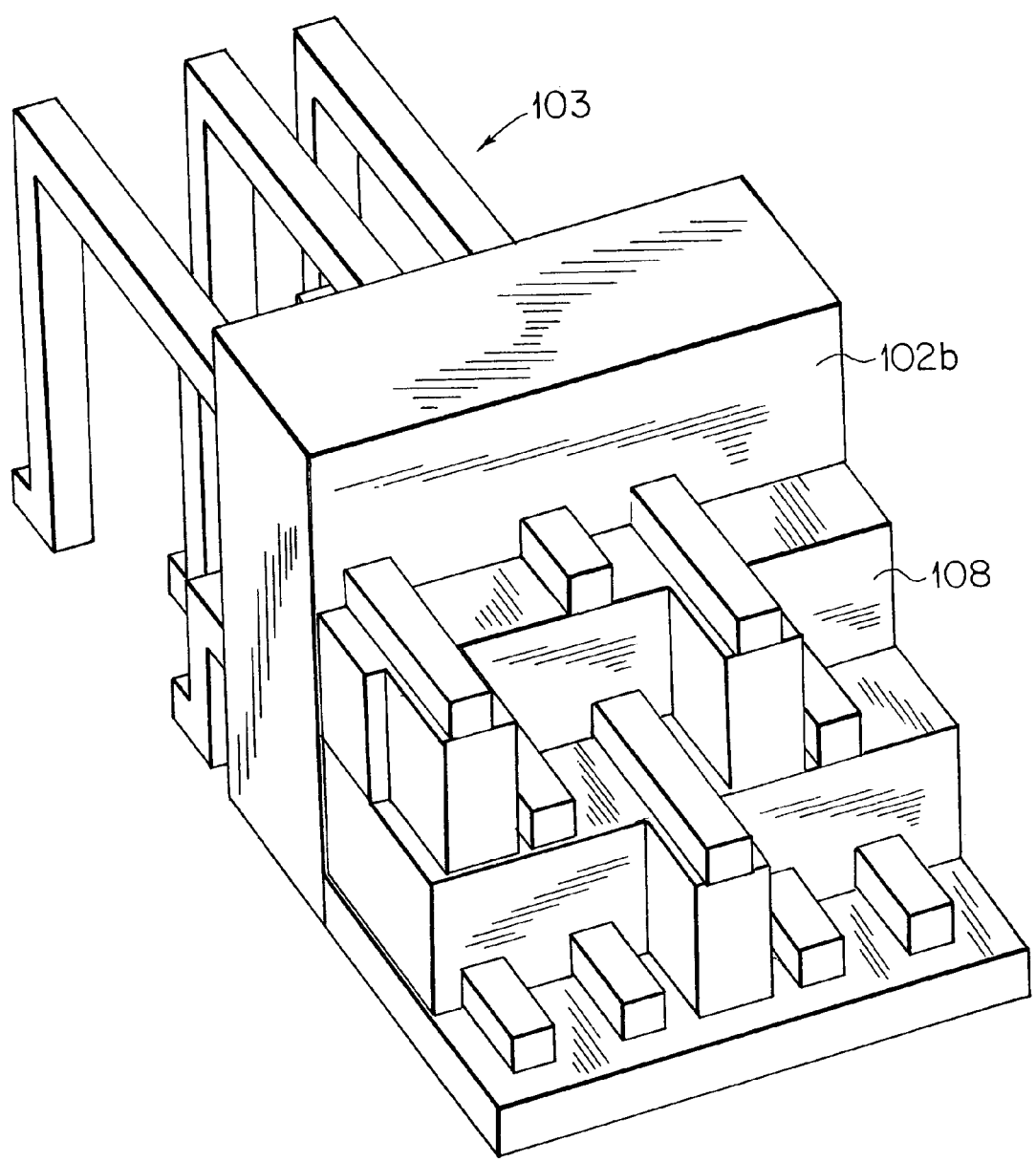
FIG. 64 is a partial perspective view of a semiconductor die carrier in accordance with the present invention showing an arrangement of bonding extensions inside the carrier.

FIG. 64 is a partial perspective view of a semiconductor die carrier in accordance with the present invention showing an arrangement of bonding extensions within the carrier. In particular, in accordance with the structure of FIG. 64, the bonding extensions of one or more of the leads from an upper or middle row may extend into the semiconductor die carrier to the same extent as bonding extension sections from lower ones of the rows of leads. In this case, the bonding extensions adjacent to one another but on different rows have the same length, bringing their respective bonding areas to the same plane. This arrangement facilitates wire bonding by reducing the length of the wire bond for second and higher tiers of leads.

FIG. 65 illustrates that the leads 103 for use in connection with the semiconductor die carrier of the present invention may have a rounded cross-section. The rounded lead 103 of FIG. 65 may include a flattened portion 105 which may be plated with gold or other conductive material and which may function as a bonding pad to allow attachment of the lead to a bonding wire. The other end of the rounded lead 103 has a nailhead-type Butt Joint configuration resulting in a foot 1033d which takes up less area.

Figure 66:
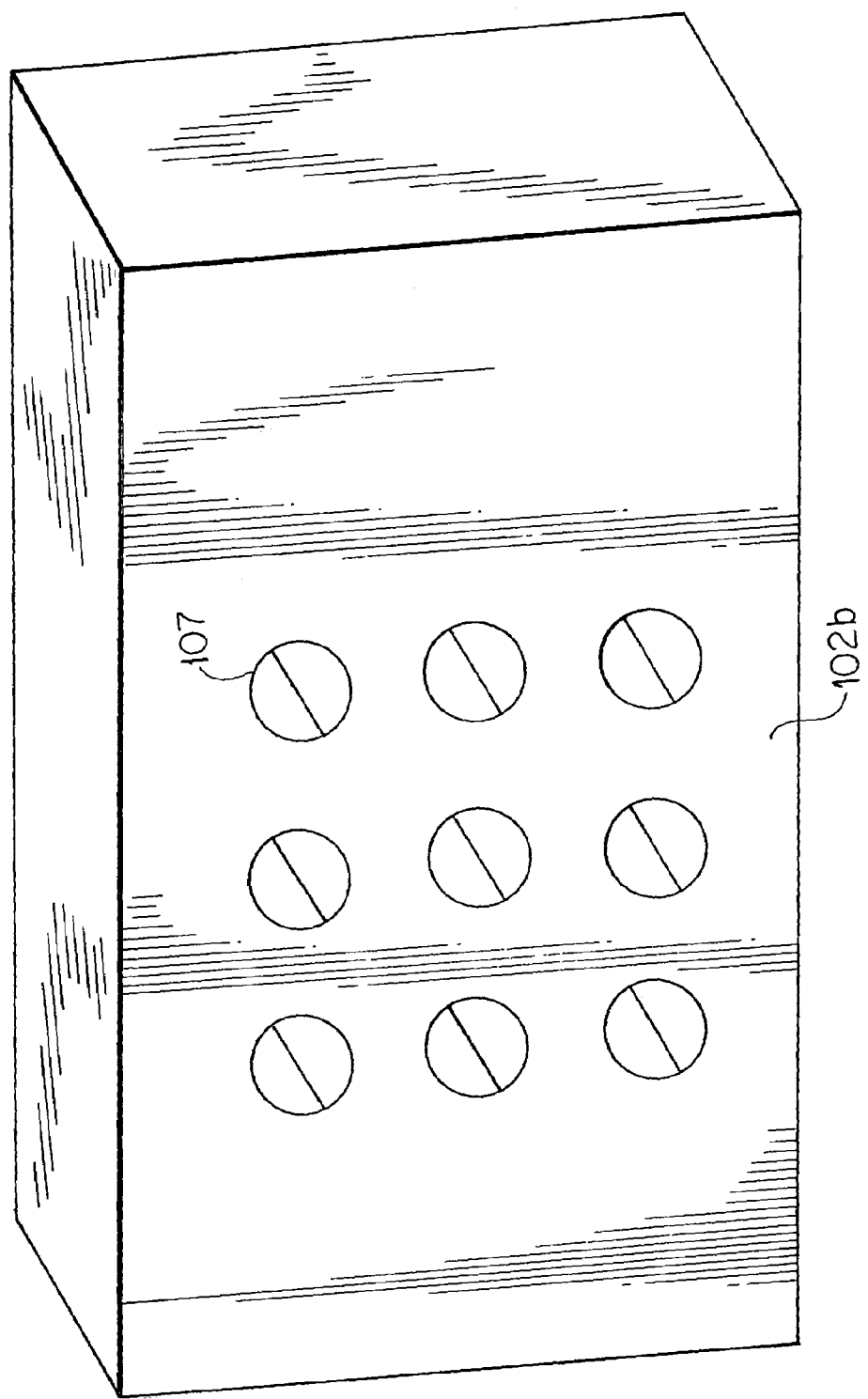
FIG. 66 is a partial perspective view of a semiconductor die carrier in accordance with the present invention having round lead passages.

FIG. 66 illustrates that the lead passages 107 in accordance with the present invention may be round. The round lead passages of FIG. 66 are not only applicable for use with round leads, but also are applicable for receiving square, rectangular, or other shapes of leads to establish a pressure fit relationship between the leads and lead passages.

Figure 67:
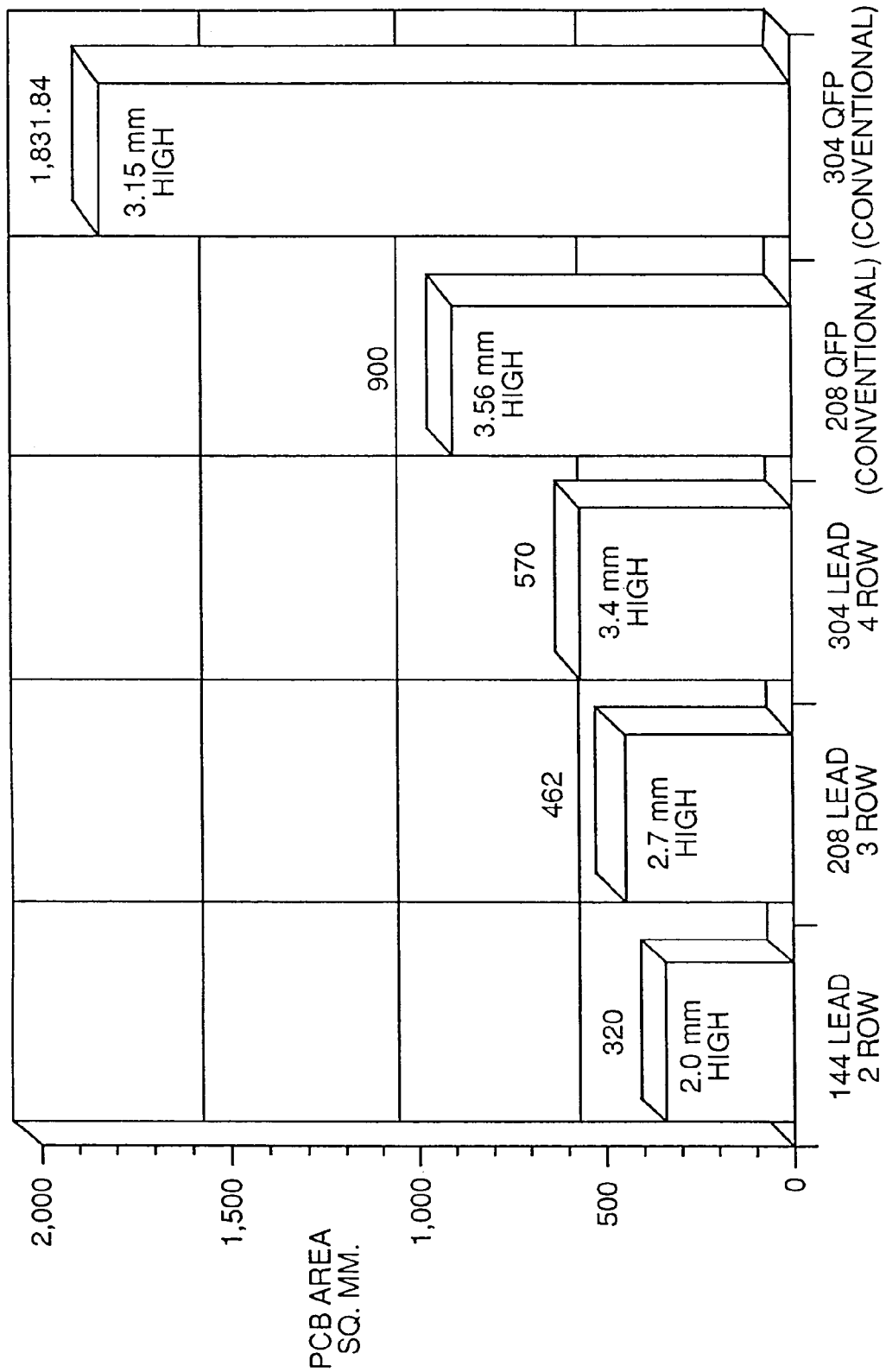
FIG. 67 is a chart comparing various embodiments in accordance with the present invention with conventional QFP technology.

As discussed above, the present invention provides many advantages over conventional packaging technology. Such advantages include the provision of a semiconductor die carrier occupying reduced amounts of area and capable of meeting the needs of existing and contemplated semiconductor and computer technology. FIG. 67 is a chart showing the surface area taken up by embodiments of the present invention versus current QFP technologies. The advantages provided by the present invention over conventional packaging technology illustrate that the present invention, unlike conventional packaging technology, is capable of keeping pace with the rapid advances that are currently taking place in the semiconductor and computer technologies.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor die carrier comprising:
   a carrier housing including a plurality of electrically insulative side walls;
   a plurality of substantially L-shaped electrically conductive leads extending through at least one of the side walls and arranged in multiple vertically-spaced rows, the leads secured in said at least one side wall by friction, wherein each of the leads includes a mounting surface external of the carrier housing for forming a surface mount electrical connection to a circuit board;
   a semiconductor die positioned within said carrier housing such that the electrically conductive leads are disposed at one or more locations around the periphery of the die, said semiconductor die comprising a plurality of bonding pads; and
   electrically-conductive bond wiring extending between the bonding pads and the leads for providing electrical connection between the semiconductor die and corresponding ones of the electrically conductive leads.

2. The semiconductor die carrier according to claim 1, wherein the leads comprise a first group of leads and a second group of leads, the mounting surfaces of the first group of leads are positioned for contacting a first level of the circuit board and the mounting surfaces of the second group of leads are positioned for contacting a second level of the circuit board.

3. The semiconductor die carrier according to claim 1, further comprising a second semiconductor die positioned within said carrier housing.

4. The semiconductor die carrier according to claim 1, wherein said carrier housing further comprises a thermally conductive cap.

5. The semiconductor die carrier according to claim 1, wherein the leads extend from multiple side walls of the carrier housing.

6. The semiconductor die carrier according to claim 1, wherein the carrier housing encapsulates the semiconductor die.

7. The semiconductor die carrier according to claim 1, wherein the bond wiring comprises tape-automated bonding.

8. The semiconductor die carrier according to claim 1, wherein the bond wiring comprises wire bonding.

9. The semiconductor die carrier according to claim 1, wherein the carrier housing further comprises a floor.

10. The semiconductor die carrier according to claim 4, wherein the semiconductor die is mounted to the cap.

11. The semiconductor die carrier according to claim 9, wherein the semiconductor die is mounted to the floor.

12. The semiconductor die carrier according to claim 11, wherein the floor comprises an indentation for receiving the semiconductor die.

* * * * *

UNITED STATES PATENT AND TRADEMARK OFFICE
CERTIFICATE OF CORRECTION

| | | |
|---|---|---|
| PATENT NO. | : 6,977,432 B2 | Page 1 of 1 |
| APPLICATION NO. | : 10/755414 | |
| DATED | : December 20, 2005 | |
| INVENTOR(S) | : Stanford W. Crane, Jr. et al. | |

It is certified that error appears in the above-identified patent and that said Letters Patent is hereby corrected as shown below:

Column 2, line 48, "include s aling," should read --include sealing,--;

Column 3, line 39, "QFPS," should read --QFPs,--;

Column 6, line 56, "line s gmenting" should read --line segmenting--;

Column 14, line 60, "th carrier." should read --the carrier.--;

Column 18, line 63, "refer nce" should read --reference--;

Column 19, line 3, "Of" should read --of--;

Column 19, line 23, "th" should read --the--;

Column 28, line 18, "orient d" should read --oriented--;

Column 28, line 45, "sid" should read --side--.

Column 18, line 22, "filing" should read --filling--;

Column 26, line 8, "may capped" should read --may be capped--.

Signed and Sealed this

Twenty-second Day of August, 2006

JON W. DUDAS
*Director of the United States Patent and Trademark Office*